US011330351B2

(12) United States Patent
Su et al.

(10) Patent No.: US 11,330,351 B2
(45) Date of Patent: May 10, 2022

(54) PORTABLE ELECTRONIC DEVICE

(71) Applicant: Apple Inc., Cupertino, CA (US)

(72) Inventors: Stephanie Y. Su, Burlingame, CA (US); Brittany Judoprasetijo, Saratoga, CA (US); Andrew Deng, San Jose, CA (US); Dale Setlak, Merritt Island, FL (US); Carli E. Oster, San Francisco, CA (US); Melody L. Kuna, San Jose, CA (US); Andrew W. Joyce, San Jose, CA (US); Ran Xu, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/020,564

(22) Filed: Sep. 14, 2020

(65) Prior Publication Data

US 2021/0312153 A1    Oct. 7, 2021

Related U.S. Application Data

(60) Provisional application No. 63/004,191, filed on Apr. 2, 2020.

(51) Int. Cl.
| | |
|---|---|
| *G06K 9/00* | (2022.01) |
| *H04R 1/02* | (2006.01) |
| *H01Q 1/24* | (2006.01) |
| *H01Q 1/38* | (2006.01) |
| *H01Q 1/44* | (2006.01) |
| *G06F 3/041* | (2006.01) |
| *H05K 5/02* | (2006.01) |
| *H04R 1/28* | (2006.01) |
| *H01Q 9/04* | (2006.01) |

(52) U.S. Cl.
CPC ............... *H04R 1/02* (2013.01); *G06F 3/041* (2013.01); *G06K 9/0002* (2013.01); *G06K 9/0004* (2013.01); *G06K 9/00053* (2013.01); *H01Q 1/243* (2013.01); *H01Q 1/38* (2013.01); *H01Q 1/44* (2013.01); *H01Q 9/0407* (2013.01); *H04R 1/2803* (2013.01); *H05K 5/0217* (2013.01); *H05K 2201/10151* (2013.01)

(58) Field of Classification Search
CPC .................................. G06F 3/04; G06F 9/0002
See application file for complete search history.

(56) References Cited

U.S. PATENT DOCUMENTS

| | | |
|---|---|---|
| 6,834,181 B2 | 12/2004 | Kaikuranta et al. |
| 6,853,336 B2 | 2/2005 | Asano et al. |
| 7,142,827 B2 | 11/2006 | Dufosse et al. |
| 8,207,897 B2 | 6/2012 | Alvey et al. |
| 9,959,444 B2 | 5/2018 | Young et al. |

(Continued)

*Primary Examiner* — Joseph R Haley
(74) *Attorney, Agent, or Firm* — Dorsey & Whitney LLP

(57) ABSTRACT

A portable electronic device can include a housing defining an aperture and a display positioned in the aperture. The display and the housing can define an internal volume and a speaker assembly can be positioned in the internal volume. The speaker assembly can include a speaker enclosure sealed to the housing within the internal volume, the speaker enclosure and the housing defining a speaker volume, and a speaker module in fluid communication with the speaker volume, the speaker module including a diaphragm positioned at an aperture defined by the speaker volume, the diaphragm defining multiple ridges.

19 Claims, 39 Drawing Sheets

(56) References Cited

U.S. PATENT DOCUMENTS

| | | |
|---|---|---|
| 10,606,218 B1 | 3/2020 | Ely et al. |
| 2007/0049326 A1 | 3/2007 | Kim |
| 2013/0307818 A1* | 11/2013 | Pope .................. G06K 9/00053 345/174 |
| 2014/0103943 A1 | 4/2014 | Dunlap et al. |
| 2017/0069954 A1* | 3/2017 | Lui ....................... H01Q 1/242 |
| 2017/0372123 A1 | 12/2017 | Kim et al. |
| 2019/0311172 A1* | 10/2019 | Kang ................... G06K 9/0002 |
| 2020/0057473 A1* | 2/2020 | Wong .................... G06F 3/0416 |

* cited by examiner

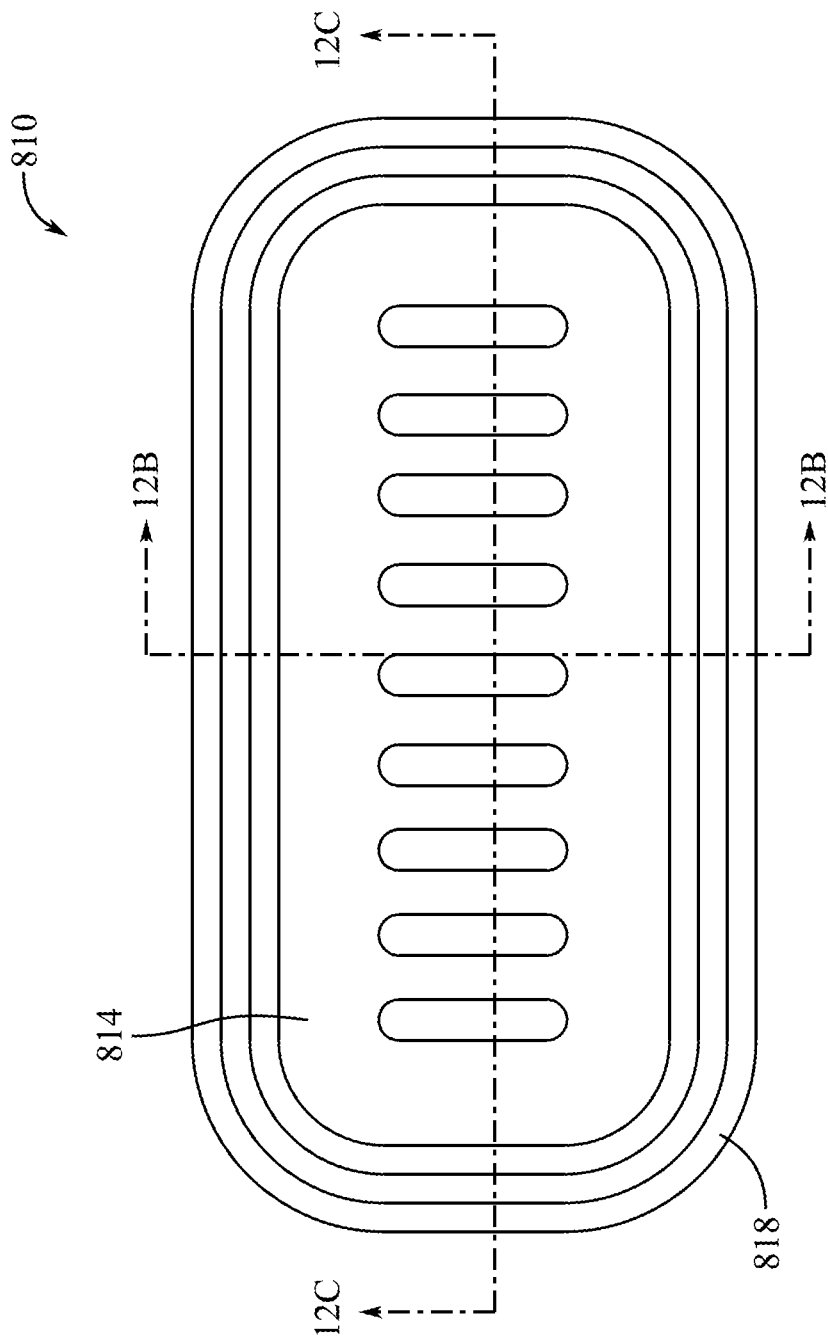

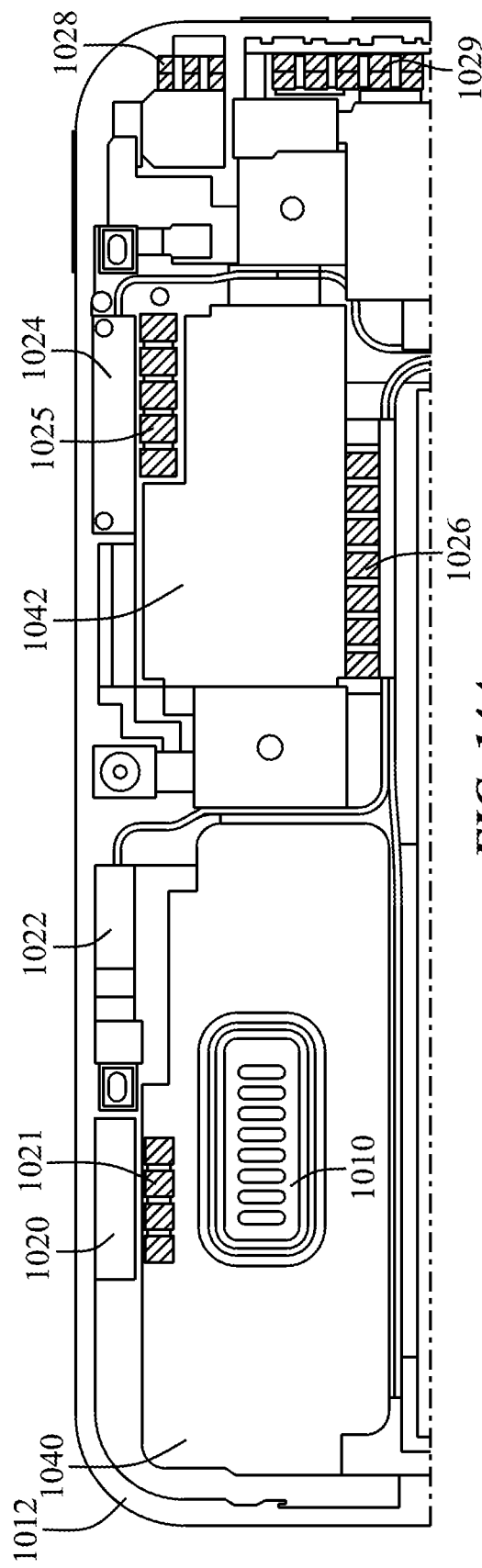
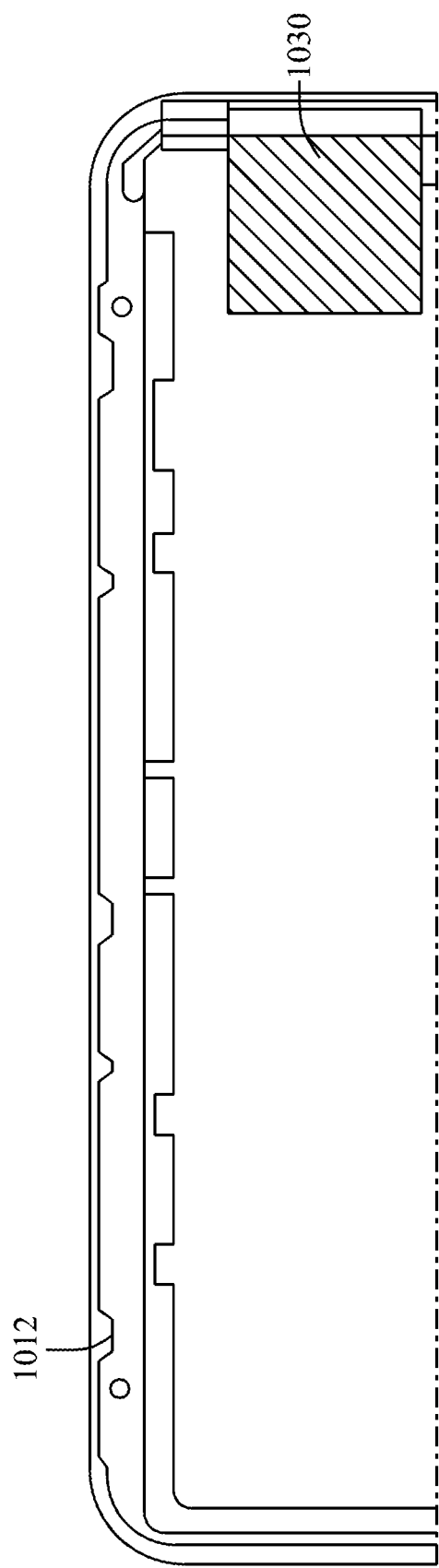
FIG. 14A
FIG. 14B

PORTABLE ELECTRONIC DEVICE

CROSS-REFERENCE TO RELATED APPLICATION(S)

This claims priority to U.S. Provisional Patent Application No. 63/004,191, filed 2 Apr. 2020, and entitled "PORTABLE ELECTRONIC DEVICE," the entire disclosure of which is hereby incorporated by reference.

FIELD

The described embodiments relate generally to electronic devices. More particularly, the present examples relate to portable electronic device components, systems, and architectures.

BACKGROUND

Electronic devices are widespread in society and can take a variety of forms, from wristwatches to computers. Electronic devices, including portable electronic devices such as handheld phones, tablet computers, and watches, generally include a type of housing or enclosure to house the internal components.

The components of an electronic device, for example, the processors, memory, cooling apparatuses, input components, and other components can partially determine the available functionalities and levels of performance of the electronic device. Further, the arrangement of these components and their related system with respect to one another in the device can also determine the level of performance of the electronic device.

Continued advances in electronic devices and their components have enabled considerable increases in performance as well as new uses and functionalities. Existing components and structures for electronic devices can, however, limit the levels of performance of such devices. For example, the conventional arrangement of components in an existing electronic device architecture, as well as the conventional design of the components themselves can limit the performance of an electronic device due to an inability to effectively distribute or remove heat generated by the components of the electronic device. Further, the design of components as well as their arrangement can also impact other properties of the device, such as the overall size of the device, the amount of noise generated by the device, specific functionalities of the device, the cost of manufacturing the device. Consequently, further tailoring and arrangement of components for electronic devices to provide additional or enhanced functionality, without introducing or increasing undesirable device properties, can be desirable.

SUMMARY

According to some aspects of the present disclosure, an electronic device can include a housing defining an aperture, a display assembly positioned in the aperture, and an antenna, including antenna circuitry, a resonant structure including a sheet of conductive material disposed between the housing and the display assembly, the resonant structure electrically coupled to the antenna circuitry, and a conductive shunt disposed between the resonant structure and the housing.

In some examples, the conductive shunt includes a metal. The conductive shunt can include a ferrous metal. The shunt can capacitively couple with the antenna circuitry. The antenna circuitry can include a WI-FI antenna. The antenna circuitry can operate at a frequency of at least one of 2.4 GHz or 5 GHz. The conductive shunt can tune a resonant frequency of the antenna circuitry.

According to some examples, an electronic device can include a housing defining an aperture, a display positioned in the aperture, the display and the housing defining an internal volume, and a speaker assembly disposed in the internal volume, the speaker assembly including a speaker enclosure sealed to the housing within the internal volume. The speaker enclosure and the housing can define a speaker volume. A speaker module can be in fluid communication with the speaker volume, the speaker module can include a diaphragm positioned at an aperture defined by the speaker volume, the diaphragm defining multiple ridges.

In some examples, the device can further include a compressible material disposed on the speaker enclosure opposite a surface of the speaker enclosure defining the speaker volume. The compressible material can include a foam. The compressible material can at least partially surround the aperture defined by the speaker volume. The compressible material can contact a surface of the display that at least partially defines the internal volume. The compressible material can include a first portion positioned adjacent to a first side of the aperture and a second portion separate from the first portion and positioned adjacent to a second side of the aperture. The diaphragm can have a length and a width, the multiple ridges spaced apart along the length. The diaphragm can define between 5 and 15 ridges.

According to some examples, an audio component can include a speaker enclosure at least partially defining a speaker volume and an aperture, a speaker module in fluid communication with the speaker volume and positioned at the aperture, and a passive radiator disposed in the speaker volume and defining an opening. A portion of the speaker enclosure can extend through the opening to affix the passive radiator to the speaker enclosure.

In some examples, the passive radiator includes a plate defining perforations. The plate can include a metal. The speaker enclosure can include a polymer material. The portion of the speaker enclosure extending through the opening can be deformed after passing therethrough to define a structure that secures the passive radiator to the enclosure.

BRIEF DESCRIPTION OF THE DRAWINGS

The disclosure will be readily understood by the following detailed description in conjunction with the accompanying drawings, wherein like reference numerals designate like structural elements, and in which:

FIG. 12A shows a top view of a portion of a speaker assembly.

FIG. 14A shows an enlarged partial front view of an electronic device.

FIG. 14B shows an enlarged partial front view of the electronic device of FIG. 14A.

DETAILED DESCRIPTION

Figure 1A:
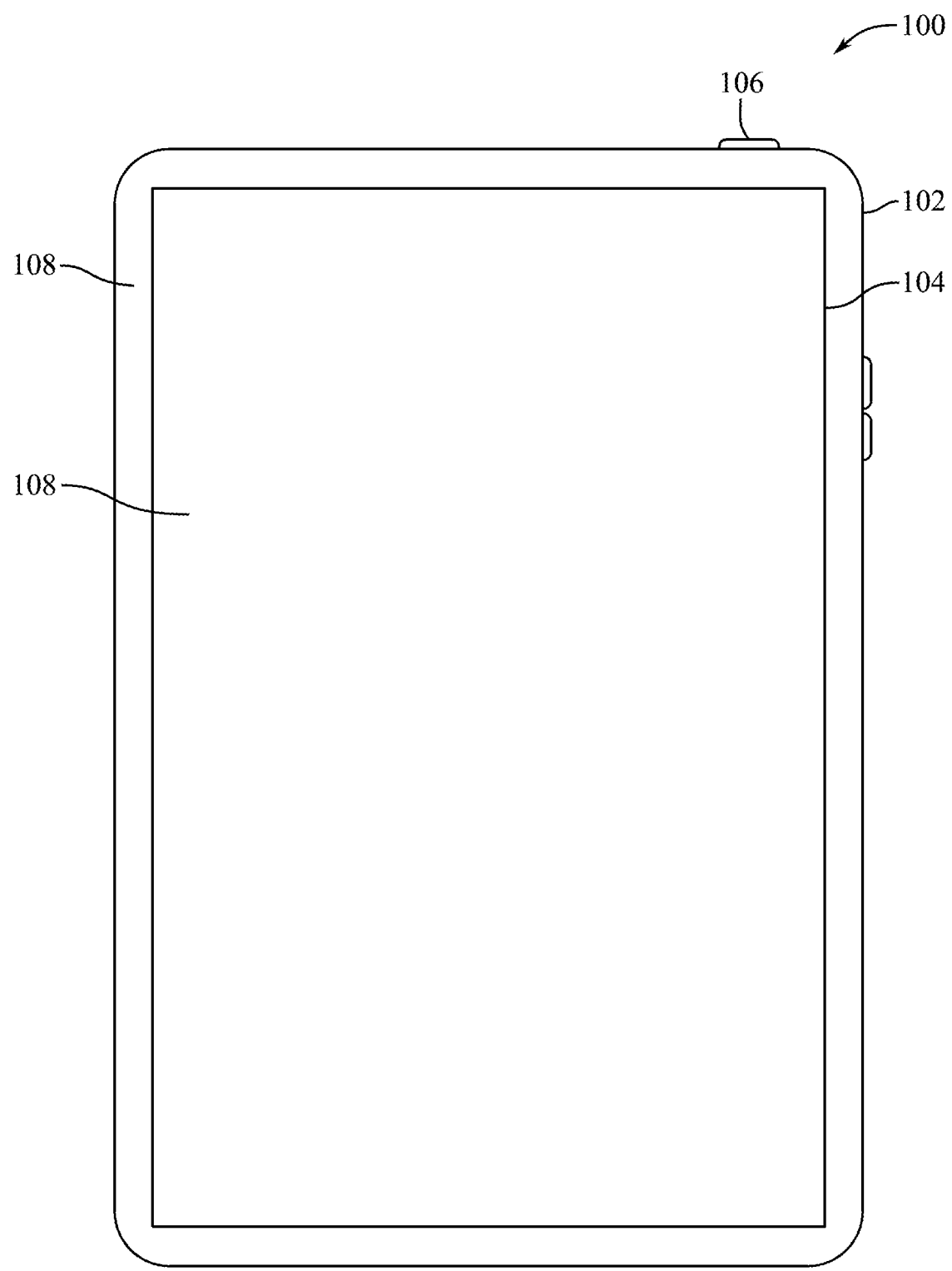
FIG. 1A shows a front view of an electronic device.

The present description provides examples, and is not limiting of the scope, applicability, or configuration set forth in the claims. Thus, it will be understood that changes can be made in the function and arrangement of elements discussed without departing from the spirit and scope of the disclosure, and various embodiments can omit, substitute, or add other procedures or components, as appropriate. For instance, methods described can be performed in an order different from that described, and various steps can be added, omitted, or combined. Also, features described with respect to some embodiments can be combined in other embodiments.

According to one aspect of the present disclosure, a portable electronic device can include a housing at least partially defining an internal volume. A display can be coupled to the housing and can be overlaid by a cover that, together with the housing, can define the internal volume of the device. The device can include a number of components that can provide desired functionalities and levels of performance. For example, the device can include multiple speaker assemblies, each of which can include a back volume that is defined by a speaker enclosure including a five-sided box that is sealed to the enclosure. The speaker back volume can be ported into the internal volume of the device, rather than directly to the ambient environment, to provide for a surround sound type experience. Additionally, the speaker back volume can also function as an antenna volume to provide enhanced antenna performance for wirelessly connecting the device to one or more other devices or components. In some examples, the device can further include a biometric component to authenticate a user. The biometric component can be incorporated into an existing input component, such as a button.

The architecture and components of the electronic devices, including portable electronic devices, described herein can allow for configurations of an electronic device that can maximize performance as well as provide a number of desired functionalities. In traditional electronic device configurations, such as with traditionally designed portable devices individual components may only have one function and may not be able to share space in the internal volume of the device with other components. Additionally, component performance can be compromised in traditional device configurations because singularly functional components may need to be formed into undesirable configurations to allow for their inclusion in the device. In contrast, and as described herein, multi-functional components as well as the position of one or more components with respect to other components of the device, as well as the device itself, can allow for a desired level of performance and a desired user experience.

These and other examples are discussed below with reference to FIGS. 1A-20. However, those skilled in the art will readily appreciate that the detailed description given herein with respect to these Figures is for explanatory purposes only, and should not be construed as limiting.

FIG. 1A depicts an electronic device 100, such as a tablet computing device. The tablet computer of FIG. 1A is merely one representative example of a device that can be used in conjunction with the systems and methods disclosed herein. Electronic device 100 can correspond to any form of portable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device, a consumer device, or simply as a device.

The electronic device 100 includes a housing 102 at least partially surrounding a display 104. The housing 102 can at least partially define an internal volume that can enclose, or partially enclose, the display and other internal components of the electronic device 100. The housing 102 can be formed of one or more components operably connected together, such as a front piece and a back piece. Alternatively, the housing 102 can be formed of a single piece operably connected to the display 104.

The display 104 can provide a visual output to the user. The display 104 can include any suitable display technology, including, but not limited to, a liquid crystal display element, a light emitting diode element, an organic light-emitting display element, an organic electroluminescence element, and the like.

A cover sheet 108 can be positioned over the front surface (or a portion of the front surface) of the electronic device 100. In some examples, at least a portion of the cover sheet 108 can sense touch and/or force inputs. The cover sheet 108 can be formed with any suitable material, such as glass, plastic, sapphire, or combinations thereof. In some examples, touch and force inputs can be received by the portion of the cover sheet 108 that covers the display 104. In some examples, touch and/or force inputs can be received across other portions of the cover sheet 108 and/or portions of the housing 102. Together, the cover sheet 108 and the housing 102 can define the internal volume of the electronic device 100.

Various layers of a display stack (such as the cover sheet 108, display 104, touch sensor layer, force sensor layer, and so on) can be adhered together with an adhesive and/or can be supported by a common frame or portion of the housing 102. A common frame can extend around a perimeter, or a portion of the perimeter, of the layers, can be segmented around the perimeter or a portion of the perimeter, or can be coupled to the various layers of the display stack in another manner.

In some examples, each of the layers of the display stack can be attached or deposited onto separate substrates that can be laminated or bonded to each other. The display stack can also include other layers for improving the structural or optical performance of the display 104, including, for example, polarizer sheets, color masks, and the like. Additionally, the display stack can include a touch and/or force sensor layer for receiving inputs on the cover sheet 108 of the electronic device 100.

Figure 1B:
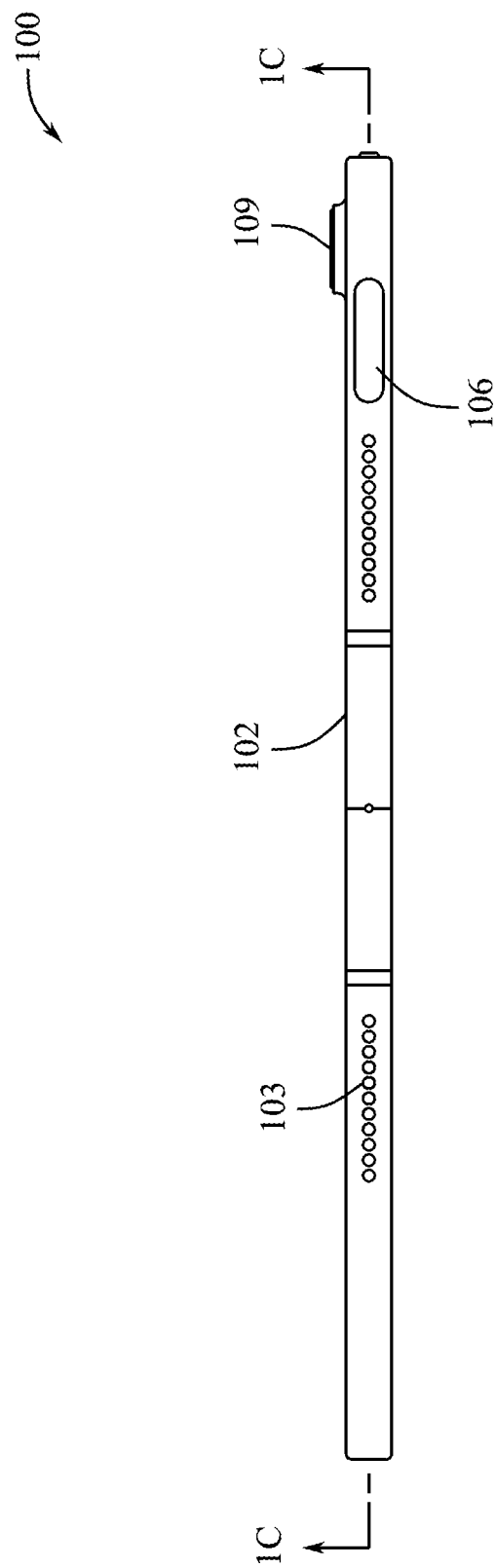
FIG. 1B shows a top view of the electronic device of FIG. 1A.

In many cases, the electronic device 100 can also include a processor, memory, power supply and/or battery, network connections, sensors, input/output ports, acoustic components, haptic components, digital and/or analog circuits for performing and/or coordinating tasks of the electronic device 100, as described herein. For simplicity of illustration, the electronic device 100 is depicted in FIGS. 1A and 1B without many of these components, each of which can be included, partially and/or entirely, within the housing 102. The electronic device 100 can further include one or more input components, such as an input component 106. In some examples, the input component 106 can include a button, such as a power or sleep/wake button. In some examples, the input component 106 can have additional functionalities and can, for example, include a biometric input component 106, as described herein.

FIG. 1B depicts a top view of the electronic device of FIG. 1A. The electronic device 100 can include a biometric input component 106, which can be partially or entirely recessed within the housing 102. The electronic device 100 can include several openings defined by the housing 102. For example, the electronic device 100 can include openings 103 that allow one or more audio module disposed in the internal volume of the electronic device 100 to emit acoustical energy out of the electronic device 100. The housing 102 can further define other openings or apertures that can allow for components of the electronic device 100 to communicate with or receive information from the ambient environment. For example, the housing 102 can define an aperture that can receive a camera or imaging module 109.

Figure 1C:
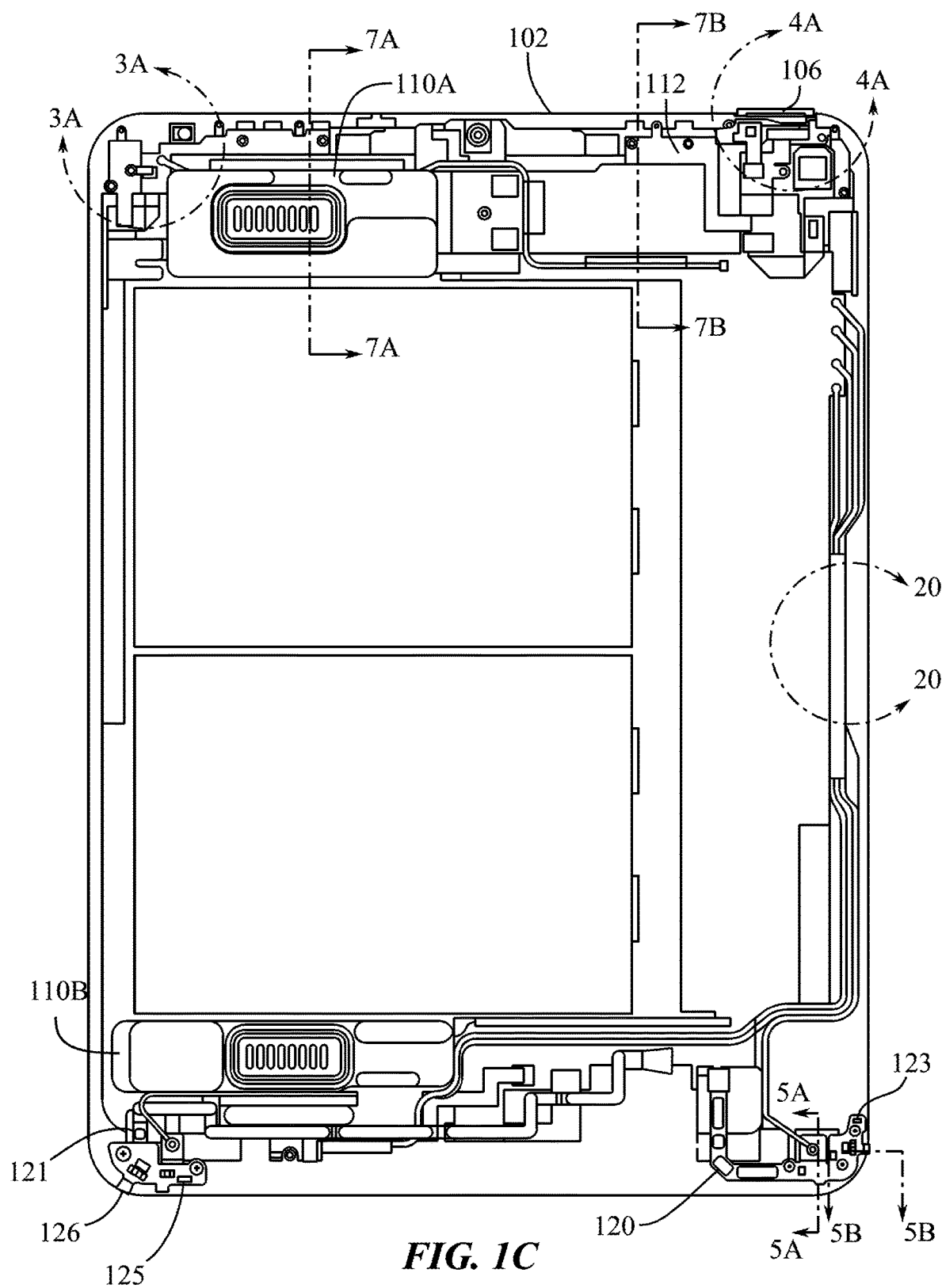
FIG. 1C shows cross-sectional view of the electronic device of FIG. 1A.

FIG. 1C shows a cross-sectional view of the electronic device 100 taken along the line indicated in FIG. As can be seen, FIG. 1C illustrates the housing 102 of the electronic device 100 and various internal components that are at least partially disposed in the internal volume defined by the housing 102. In addition to components such as a processor, memory, power supply and/or battery, the electronic device 100 can include components that can provide desired levels of performance and functionality to the electronic device 100. In some examples, the electronic device 100 can include a first speaker assembly 110A and a second speaker assembly 110B, as described further herein. The device 100 can also include one or more wireless antennas, for example to wirelessly transmit information between the device 100 and one or more other devices. In some examples, the device can include at least a first antenna assembly 112, a second antenna assembly 120, and a third antenna assembly 121. The electronic device 100 can also include one or more input components, such as an input component 106 that can also function as a biometric component as described herein.

In some examples, the antenna assemblies can include one or more electrical grounding features or components as described further herein. For example, the second antenna assembly 120 can feature or components that can ground at least a portion of the second antenna assembly 120 to the housing 102. These components and features are described with respect to FIGS. 5A and 5B, below. In some examples, the second antenna assembly 120 can also include one or more features, such as a spring finger 123 that can provide electrical coupling, for example to provide grounding, to one or more other components of the device 100. In some examples, the second antenna assembly 120 can include a spring finger 123 that can electrically couple with a display assembly that can overlay the second antenna assembly 120 as described herein. In some examples, the spring finger 123 can make electrical contact with a surface of the display assembly, such as a surface of the display assembly that at least partially defines the internal volume of the device 100. In some examples, the spring finger 123 can be soldered to the second antenna assembly 120, connected through surface mount technology (SMT), or coupled with any other technique as desired.

In some examples, the third antenna assembly 121 can include some or all of the electrical grounding features or components of any of the antenna assemblies described herein, including the second antenna assembly 120. In some examples, the third antenna assembly 121 can include a spring finger 125 that can provide electrical coupling, for example to provide grounding, to one or more other components of the device 100. In some examples, the second antenna assembly 120 can include a spring finger 123 that can electrically couple with a display assembly that can overlay the second antenna assembly 120 as described herein. In some examples, the spring finger 123 can make electrical contact with a surface of the display assembly, such as a surface of the display assembly that at least partially defines the internal volume of the device 100. In some examples, the third antenna assembly 121 can include one or more features, such as grounding plates or tabs, that can be electrically coupled with the housing 102, for example as described with respect to FIG. 4B.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding engagement and retention features, can apply not only to the specific examples discussed herein, but to any number of embodiments in any combination. Various examples of electronic devices including components, such as wireless antennae, having various features in various arrangements are described below, with reference to FIGS. 2-7B.

Modern electronic devices, such as, smart phones, tablet computers, and so on, often incorporate wireless communication hardware (e.g., antenna and related circuitry). Traditionally, a housing of the electronic device was at least partially constructed out of materials that act as transparent to radio frequency (RF) signals. These RF transparent portions can be referred to as RF windows or RF openings. These materials are often less rigid than other RF non-transparent materials and are therefore susceptible to break or crack if the electronic device is accidently dropped. Moreover, an electronic device having a housing made of a plastic or other RF transparent material can be cosmetically unappealing to consumers. Nonetheless, consumers desire electronic devices having housing which are cosmetically appealing and more durable than can be provided with housing that include RF windows. One aspect of the present disclosure relates to housing segments coupled with antenna circuitry to function as an antenna. Non-limiting examples of housings configured to function as antennas are described U.S. Patent Application Publication No. 2020/0073445, published Mar. 5, 2020, the disclosure of which is hereby incorporated by reference in its entirety.

Figure 2:
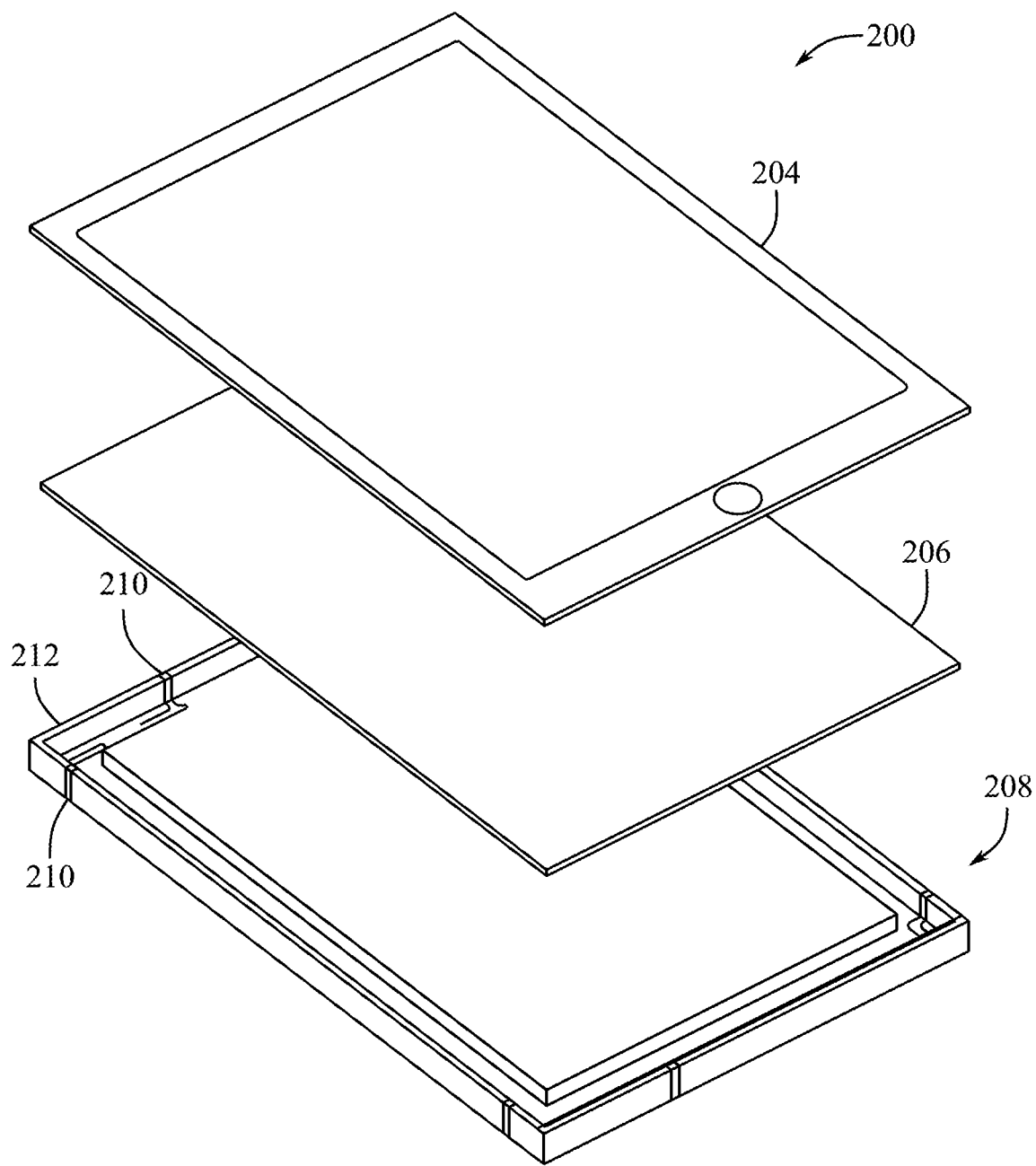
FIG. 2 shows an exploded view of an electronic device.

FIG. 2 shows an electronic device 200, according to an example. The electronic device 200 includes a cover 204, a display 206, and a housing 208. The cover 204 can be at least partially transparent and define an input surface of the electronic device 200 by including touch and/or force sensors. The display 206 can be at least partially covered by the cover 204 and define an output region in which graphical outputs are presented to the user via liquid-crystal display (LCD), organic light emitting diode display (OLED), or any other suitable components or display technology. The cover 204 and display 206 can be positioned within the housing 208.

The housing 208 can include molded elements 210 positioned in within gaps, spaces, slots or other areas between portions of housing segments 212. The housing segments 212 can define portions of exterior surface of the electronic device 200, such as a portion of a sidewall and a back wall of the housing 208. The housing segment 212 can include a conductive material, such as a metal (e.g., aluminum, steel, stainless steel, titanium, amorphous alloy, magnesium, or other metal or alloy), carbon fiber, or the like. The molded elements 210 can be formed from or include a substantially non-conductive material or electrically insulating material. Thus, the housing segment 212 between molded elements 210 can act as an antenna for the electronic device 200. Further details of the housing are provided below with reference to FIG. 3A-3C.

Figure 3A:
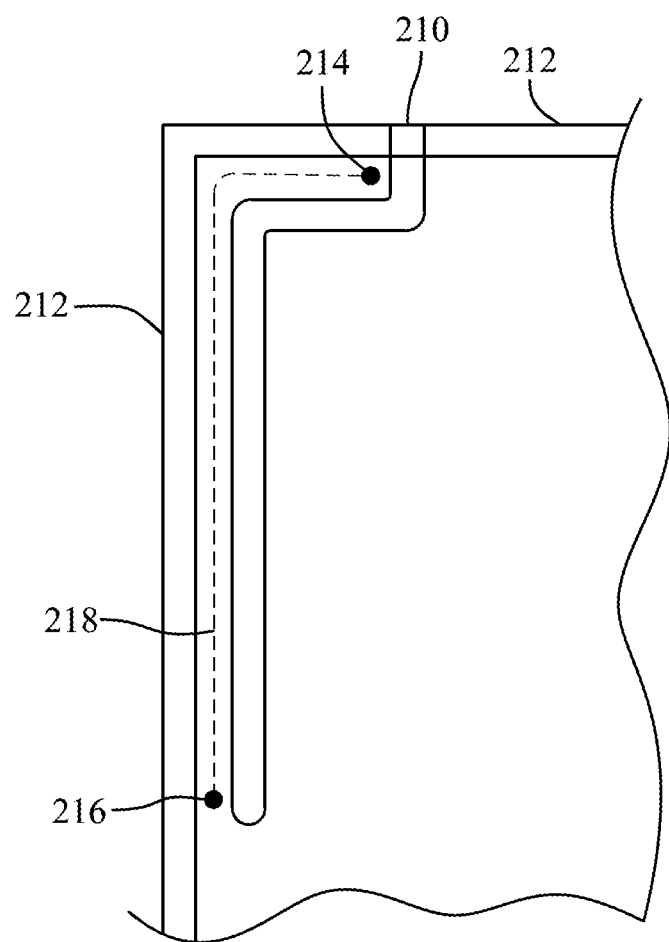
FIG. 3A shows a close-up view of a region of the electronic device of FIG. 2.
Figure 3B:
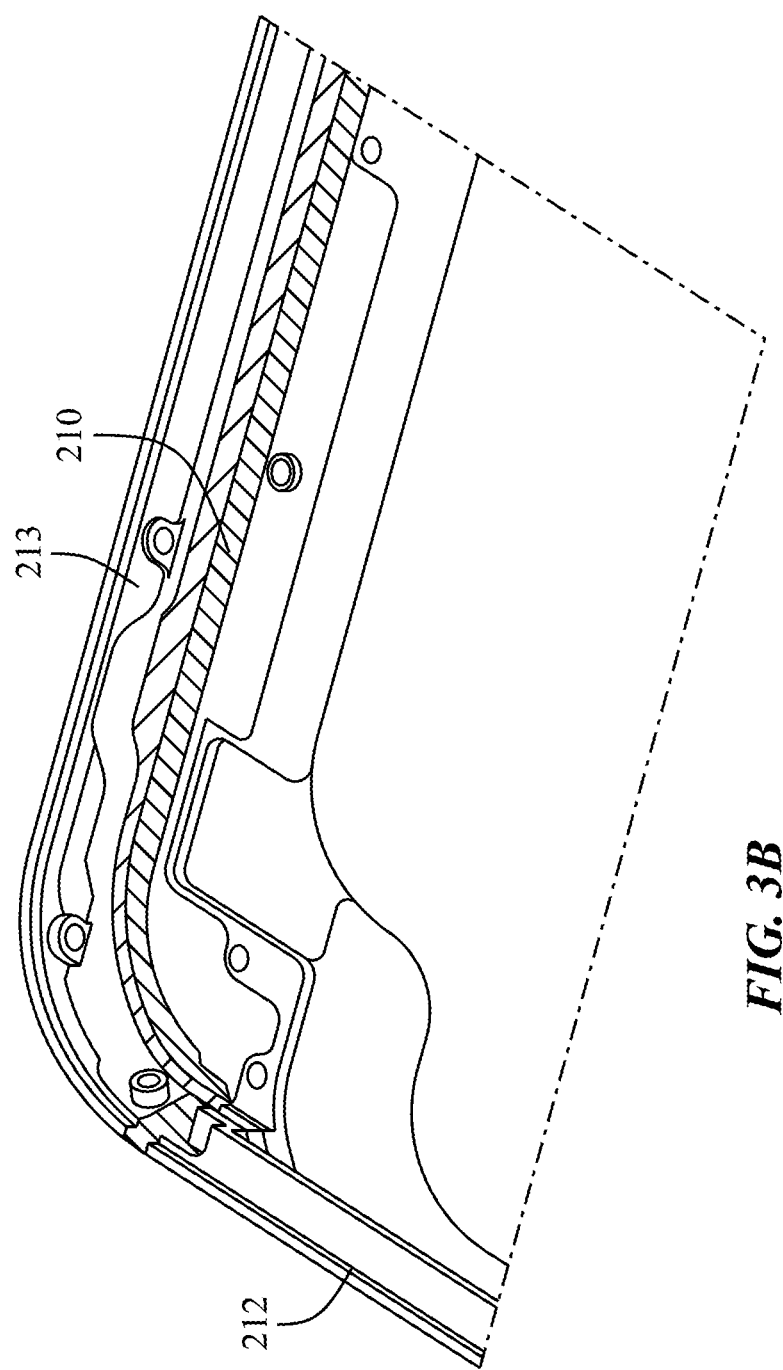
FIG. 3B shows a close-up perspective view of a region of the electronic device of FIG. 1A.

FIG. 3A shows a partial view of the housing 208, according to an example. The housing 208 of FIG. 3A shows the molded element 210 extending along a length of the housing segment 212. The housing segment 212 can be electrically coupled to antenna circuitry (not shown) to form an antenna. For example, the antenna circuitry can be connected to the housing segment 212 at a first connection point 214 and a second connection point 216. In some cases, the first connection point 214 is coupled to an electrical ground, and the second connection point 216 is coupled to an antenna feed (e.g., a source of an electromagnetic signal that transmits wireless signals to the housing segment 212 and/or a circuit that receives and/or analyzes an electromagnetic signal received by the housing segment 212). A conductive path 218 can be defined between the connection points 214, 216, corresponding to the conductive path corresponding to an electromagnetic component of a transmitted or received wireless communication signal. FIG. 3B shows a close-up perspective view of a region the electronic device of FIG. 1A.

FIG. 3B shows a partial view of the housing 208, according to another example. The housing 208 of FIG. 3B shows the molded element 210 extending along a length of a first housing segment 212 and a second housing segment 213. The housing segments 212, 213 can be separate and electrically isolated from one another. In some examples, the molded element 210 can join the first and second housing segments 212, 213 to one another while maintaining the electrical isolation of the housing segments 212, 213. One or both of the housing segments 212, 213 can be connected to antenna circuitry, as described herein. Additionally, the molded element 210 can interlock with recesses, pores, protrusions, and/or other features of the housing segments 212, 213 to mechanically join the housing segments 212, 213 to one another.

In some examples, the electrically isolated structure of the housing segments 212, 213 can allow for antennas that are electrically coupled to those segments 212, 213 to operate in a wider range of bands as compared to antennas that are connected to a single piece housing structure. In some examples, one or more electrical components can be used to electrically couple the first housing segment 212 to the second housing segment 213 at one or more desired locations. In some examples, the electrical component or components can have substantially any combination of resistances, capacitances, and/or inductances, as desired, and as may be selected to optimize antenna performance and/or bandwidth. In some examples, an electrical component or components electrically connecting the first housing segment 212 to the second housing segment 213 can function as an electrical short at low bands while functioning as an electrical open at high bands, thereby allowing for low and high band antennas to be coupled to the same housing segment or segments 212, 213 while still having different antenna path lengths and/or different resonant frequencies, as desired. In some examples, an electrical component or components electrically connecting the first housing segment 212 to the second housing segment 213 can have first resistance, capacitance, and/or inductance values for a first range of bands, and can have second, different resistance, capacitance, and/or inductance values for a second, different range of bands.

Figure 3C:
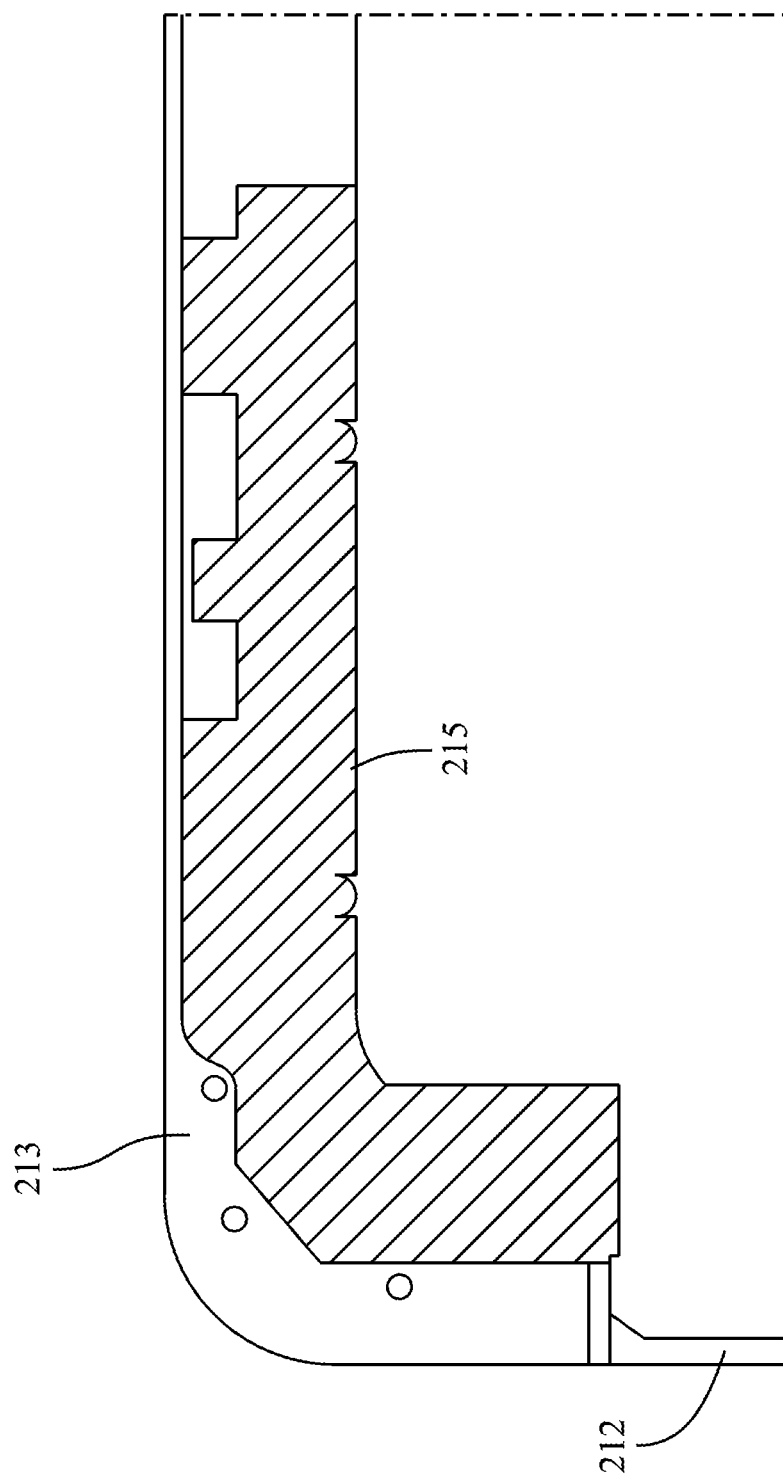
FIG. 3C shows a close-up top view of the region of FIG. 3B.

In some examples, and as shown in FIG. 3B, one or more areas or portions of the housing segments 212, 213 near or adjacent to the molded segment 210 can be recessed or indented with respect to other portions of the housing segments 212, 213. FIG. 3C illustrates the same region of the housing 208 shown in FIG. 3B, including a structural component 215 coupled to the first housing segment 212 and the second housing segment 213. In some examples, the structural component 215 can be sized and shaped to correspond to the indented or recessed portions of the first and second housing segments 212, 213. In some examples, the structural component 215 can include an electrically insulating material, such as a polymer material, a ceramic material, and/or a polymer and ceramic composite material. In this way, the structural component 215 can mechanically join, retain, or assist in retaining the first housing segment 212 to the second housing segment 213 without electrically coupling the housing segments 212, 213 with one another through the structural component 215. In some examples, the structural component 215 can be coupled to the housing segments 212, 213 by any desired technique, including fasteners, screws, adhesives, or combinations thereof. Although illustrated with respect to a single corner or portion of the housing 208, in some examples, any number and location of regions of the housing 208 can include electrically isolated segments that can be joined by a molded segment 210 and/or a structural element 215. Additional details of the electronic device are provided below with reference to FIGS. 4A-4B.

Figure 4A:
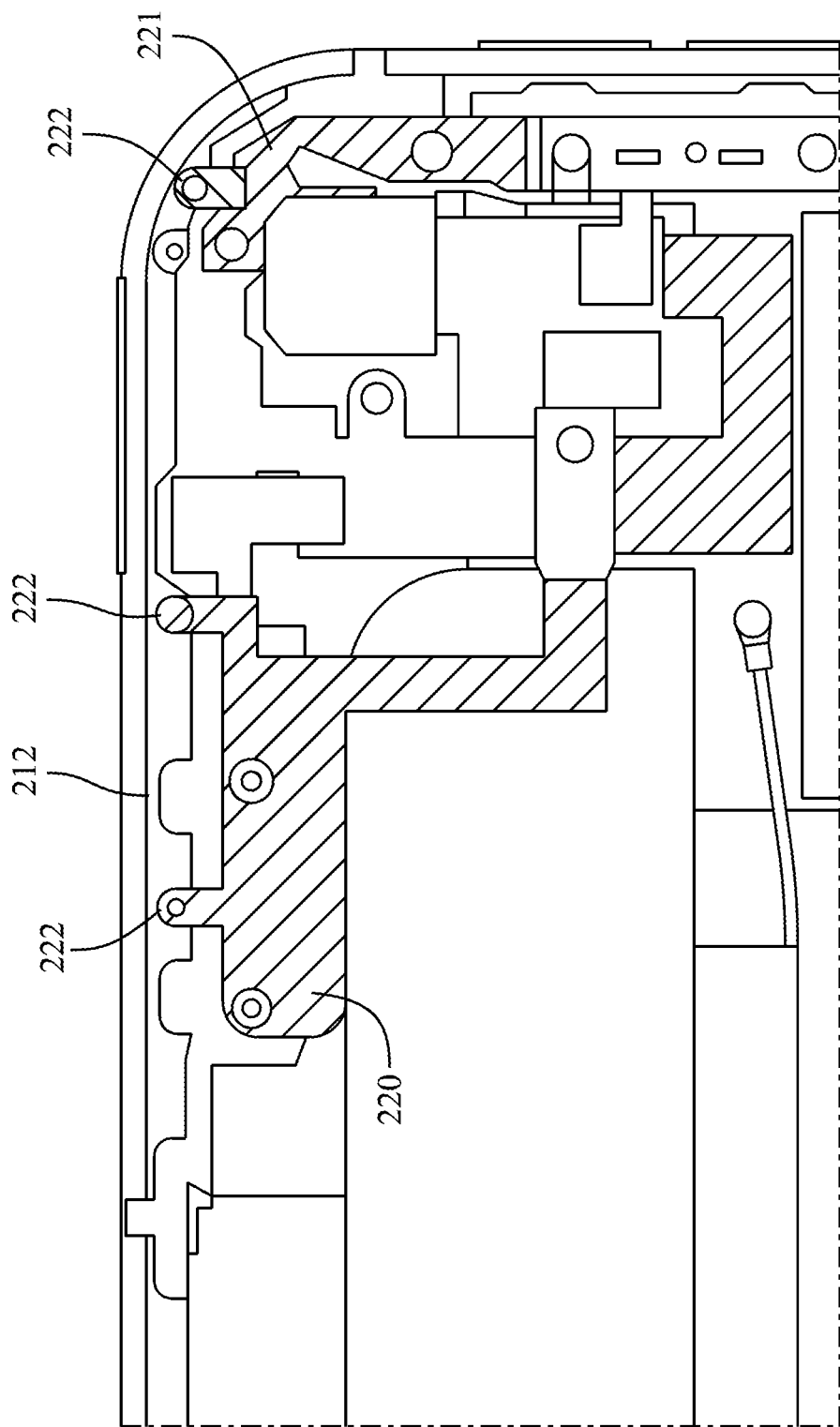
FIG. 4A shows a top close-up view of a region of an electronic device.

FIG. 4A shows a close-up view of the upper right region of an electronic device that can be substantially similar to, and can include some or all of the features of the electronic device shown in FIG. 1C. The device can include grounding plates 220 and 221 that can be electrically coupled to one or more electronic components and the housing 212 of the electronic device. As shown, the grounding plates 220, 221 can also be coupled to the housing segment 212 at one or more tabs 222.

Figure 4B:
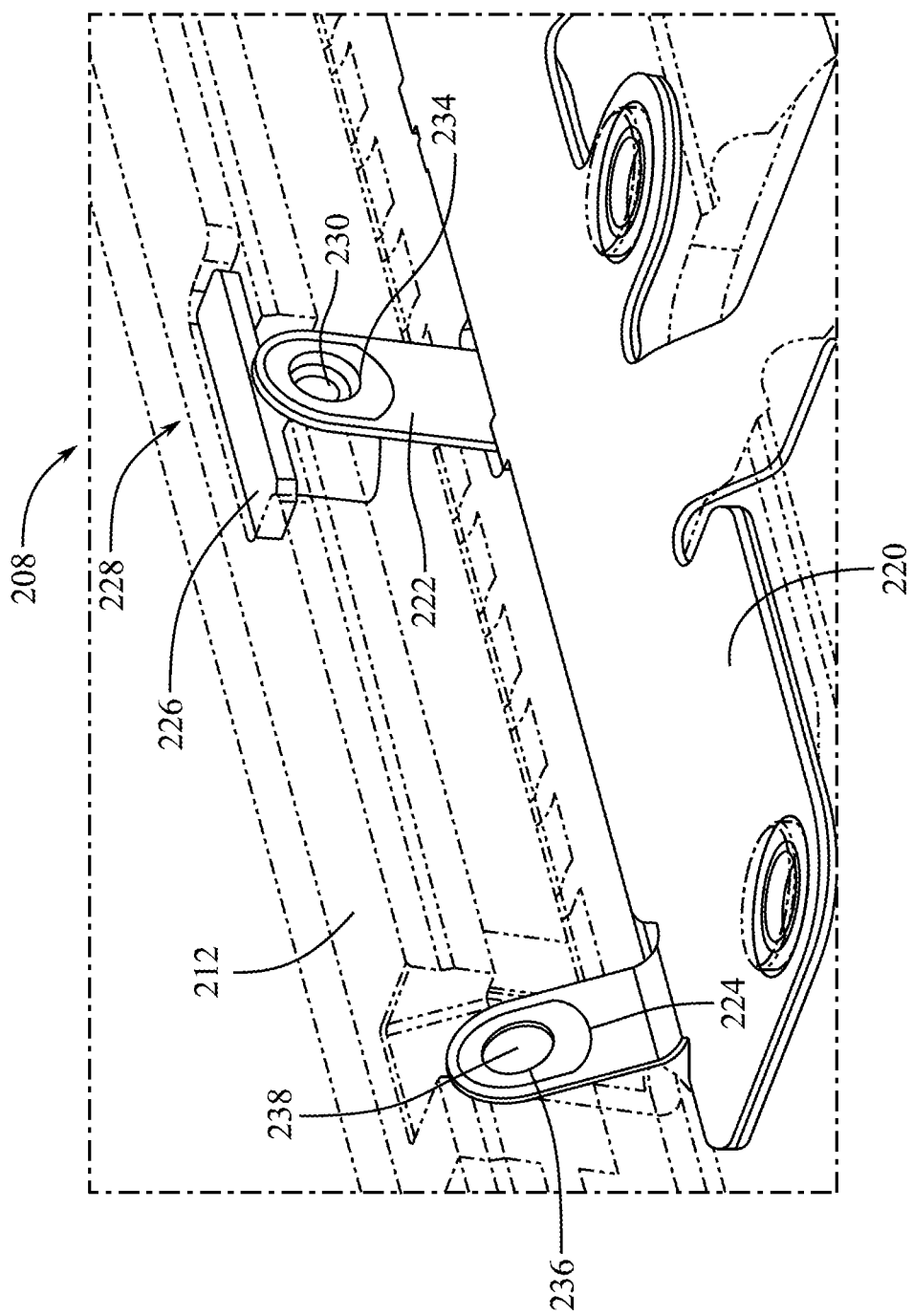
FIG. 4B shows a perspective close-up view of a region of an electronic device.

FIG. 4B shows a close-up perspective view of a grounding plate 220, including the first connection point (similar to the first connection point 214 from FIG. 3A coupled to a ground). In FIG. 4B, the first connection point is represented as a grounding plate 220 having first and second tabs 222, 224 which interface with the housing segment 212 to ground the housing segment 212. The first tab 222 of the grounding plate 220 can extend perpendicular or substantially perpendicular from the grounding plate 220. The first tab 222 can interface or otherwise couple to an insert 226 positioned at least partially within a recess 228 formed by the housing segment 212. The insert 226 can be affixed to the housing segment 212 for example, by laser welding or another coupling process which provides a sufficient electrical conductance between the housing segment 212 and the insert 226.

The insert 226 can include a conductive material, such as a metal (e.g., aluminum, steel, stainless steel, titanium, amorphous alloy, magnesium, or other metal or alloy) or otherwise have a metallic plating affixed to an outer surface of the insert 226. The insert 226 can be received within the recess 228 of the housing segment 212 such that the insert 226 is flush with the housing segment 212 (i.e., the insert 226 does not protrude from the housing segment 212). For example, the insert 226 can include a planar top surface that defines overhangs or flanges that contact the recess 228 within the housing segment 212. The insert 226 can also include a threaded aperture 230 to receive a fastener (see FIG. 5A, a sectional view at the location indicated in FIG. 1C).

In some examples, the use of an insert 226 to allow a grounding plate 220 to electrically connect to a component or part of the device, such as the housing segment 212, can allow for the grounding location to be selected independent of other structural features or considerations of the housing segment 212. Accordingly, the length of the path to ground can be highly controlled, as desired, and can be chosen to optimize efficiency and/or performance of one or more components, such as antennas. In some examples, the location, and/or design of one or more grounding components, such as the insert 226, can allow for the position of components to be selected to provide more robust contact with other components, such as a display module that can overlie the insert 226.

Figure 5A:
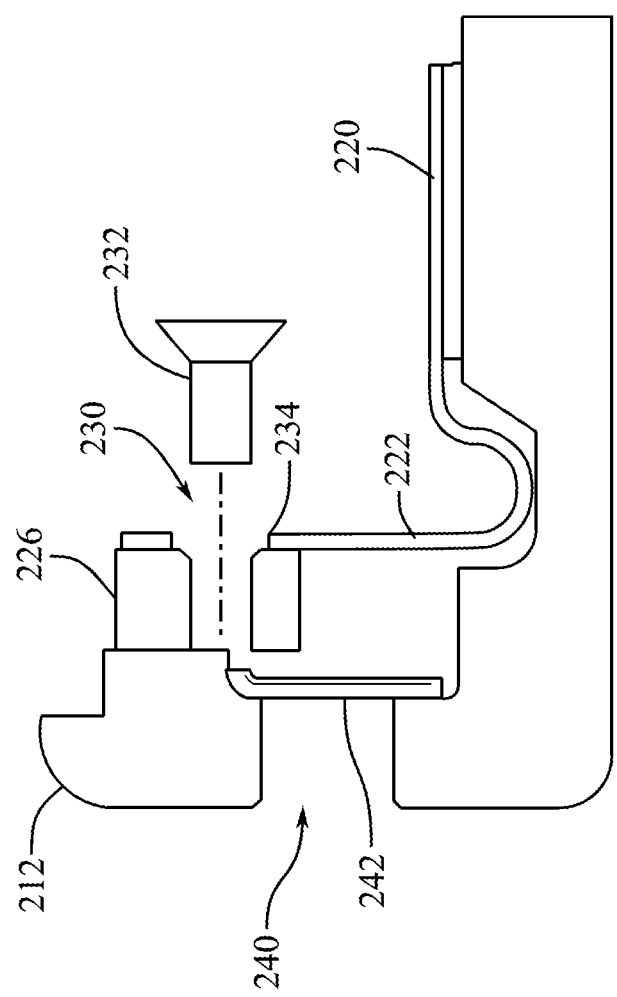
FIG. 5A shows a cross-sectional view of a portion of an electronic device.
Figure 5B:
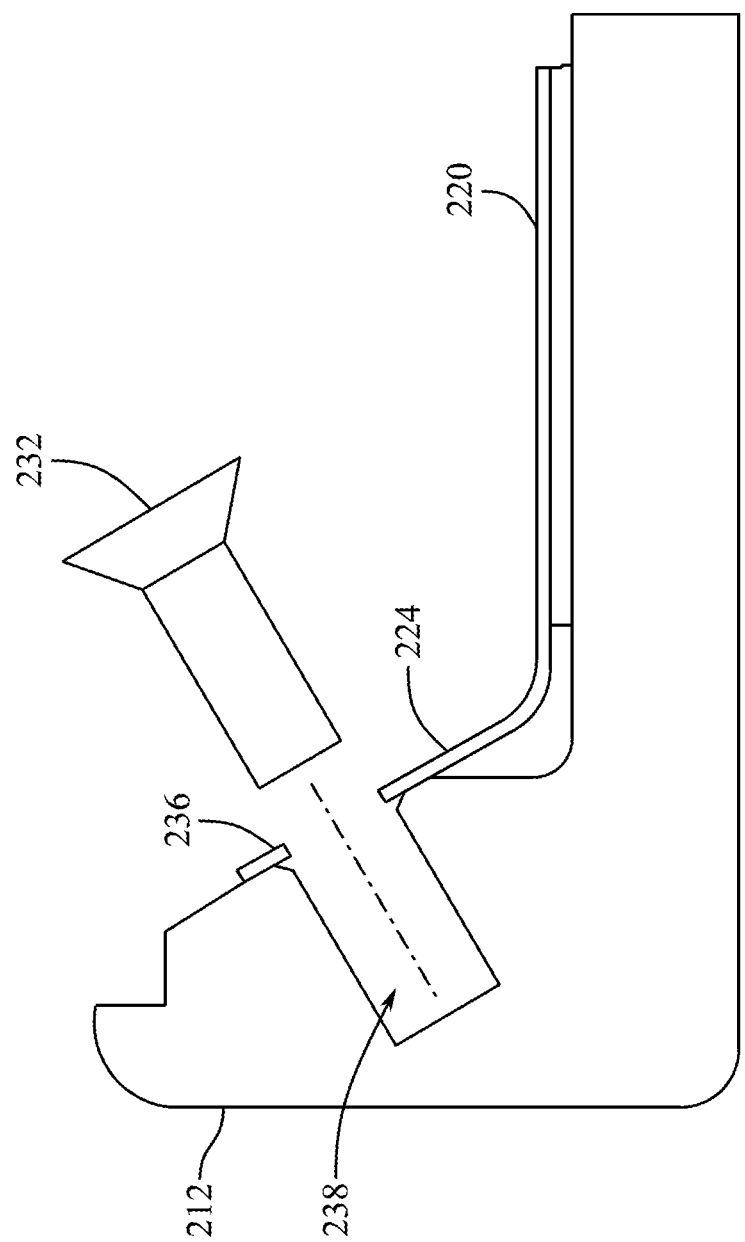
FIG. 5B shows a cross-sectional view of a portion of an electronic device.

The second tab 224 can extend from the grounding plate 220 at an angle of between about 30 degrees and about 60 degrees, such as about 45 degrees, and can couple directly to the housing segment 212 (i.e., couple to the housing segment 212 without utilizing an insert 226). As shown in FIGS. 5A and 5B, the first and second tabs 222, 224 can be coupled to the housing 208, for example, by fasteners 232. In some examples, each fastener 232 can be extended through respective apertures 234, 236 within the first and second tabs 222, 224 to retain the first and second tabs 222, 224 to the housing segment 212. As described herein, the insert 226 can define a threaded aperture 230 to receive and retain the fastener 232. Thus, the first tab 222 can be retained to the insert 226 between the insert 226 and a head of the fastener 232. The housing segment 212 can define a threaded angled aperture 238 to receive and retain the fastener 232 extended through the second tab 224. For example, the threaded angled aperture 238 can be machined along a longitudinal axis that is perpendicular to the second tab 224.

As shown in FIG. 5B, a sectional view at the location indicated in FIG. 1C, the threaded angled aperture 238 occupies a significant portion of the housing segment 212. As such, additional features, such as, channels, through-holes, slots, and so cannot extend along the housing segment 212 where the second tab 224 is affixed. The insert 226, however, provides a coupling mechanism which does not occupy a significant portion of the housing segment 212. As shown in FIG. 5A, the insert 226 allows apertures, channels, slots, and so on to be formed within the housing segment 212 wherein the first tab 222 is affixed. For example, an aperture 240 for an audio output apparatus (e.g., a speaker, see speaker cover 242) can be formed within the housing segment 212. Moreover, coupling the housing segment 212 to the first tab 222 using the insert 226 requires less space within the housing 212 because the first tab 222 extends perpendicular to the grounding plate 220 and therefore is positioned closer to the housing segment 212 than the non-perpendicular second tab 224. Thus, the first tab 222 occupies less space within the housing 208 and therefore provides additional space within the housing 208 for other components of the electronic device 200. As space within the housing 208 is finite, freeing up additional space via the first tab 222 and insert 226 provides significant design and performance advantages.

Figure 6A:
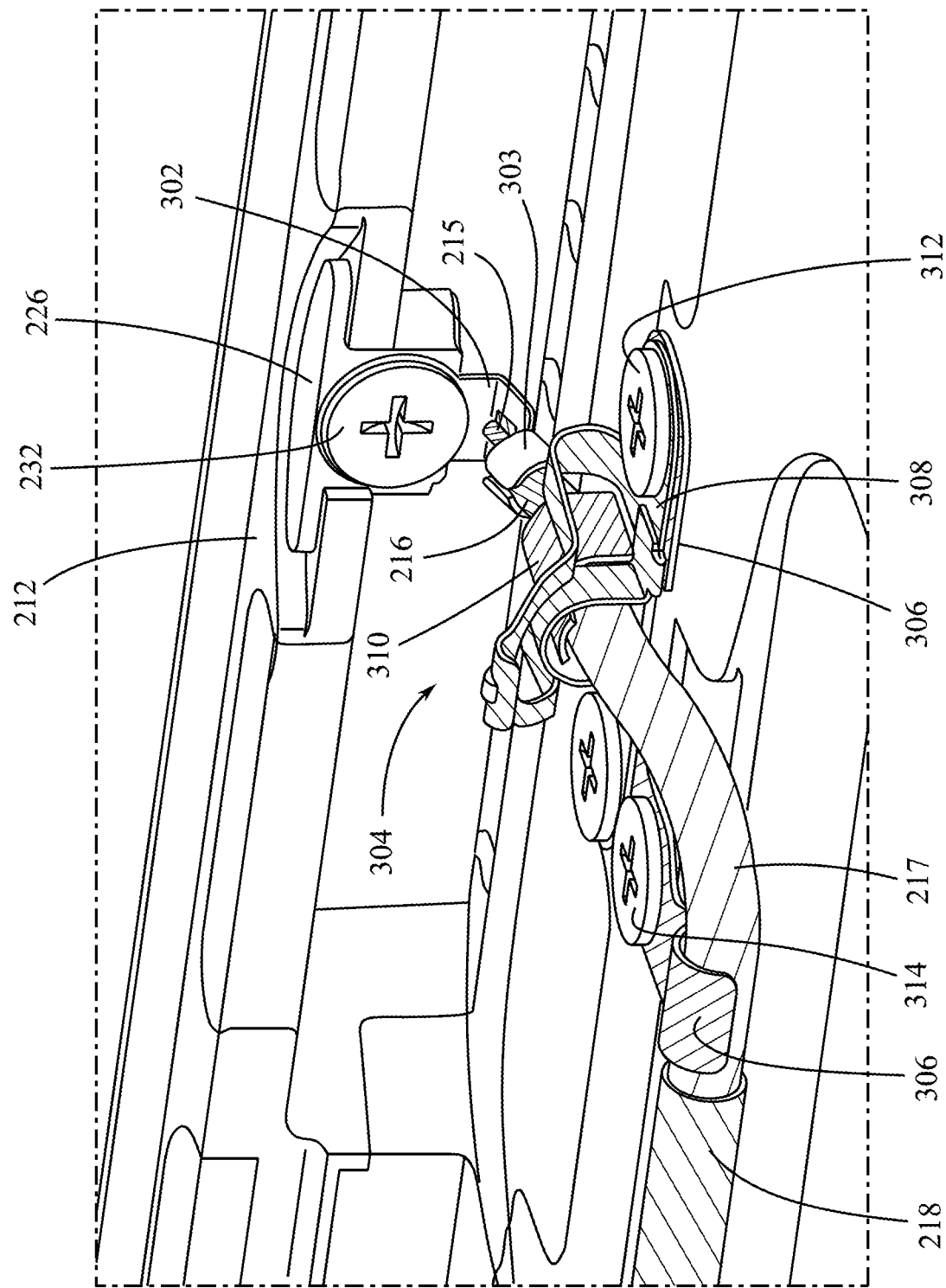
FIG. 6A shows a close-up view of a region of an electronic device.

FIG. 6A shows an example of the second connection point (coupled to an antenna feed 218). The second connection point can include an insert 226 that is electrically and/or mechanically coupled to the housing segment 212. In some examples, the insert 226 can be affixed to the housing segment 212 via laser welding or another process that provides electrical conductivity between the insert 226 and the housing segment 212. In some examples, one or more parts or portions of the antenna feed 218 can then be electrically coupled to the housing segment 212 and/or other components of the device in order to provide electrical grounding and to allow these features to act as radiating bodies for the antenna. For example, the antenna feed 218 can include a ground portion or ground braid 217, a non-conductive coating 216, and a conductive core 215. The non-conductive coating 216 can provide electrical insulation between the ground portion 217 and the conductive core 215, for example to electrical isolate these portions from one another. In some examples, the ground portion 217 can be electrically coupled to the housing 212 at a first location or portion that can be electrically isolated from a second location or portion to which the conductive core 215 is electrically coupled. In some examples, this configuration can allow for one or both of these portions of the housing segments, as well as an components in electrical communication therewith, to act as radiating parts of an antenna.

As can be seen, the component 304 can include a first portion or bracket 306 that can be in electrical communication with both the ground braid 217 and a portion of the housing 212. For example, the first bracket 306 can define one or more apertures, and a fastener 314 can extend through the aperture to electrically and mechanically couple the first bracket 305 to the housing 212. A second portion or bracket 308 can be in electrical communication with the first bracket 306 and can be electrically and mechanically coupled thereto. For example, the second bracket 308 can define one or more apertures that are aligned with one or more apertures defined by the first bracket 306. Fasteners, such as fastener 312 can extend through the apertures defined by the first and second brackets 306, 308 can and can be received by the housing 212 to electrically and/or mechanically couple the brackets thereto.

In some examples, one or more surfaces of the second bracket 308 can include a non-conductive and/or insulating coating 310 to prevent undesirable electrical contact between the second bracket 308 and other components of the device. In some examples, the second bracket 308 can also electrically couple with one or more components of the devices as desired in order to electrically couple the ground braid 217 with those components. For example, an electronic device can include a display assembly that can overlay the second bracket 308 as described herein. The second bracket 308 can this be electrically coupled to, or in contact with, a surface of the display assembly (not shown). In some examples, the second bracket 308 can electrically contact a surface of the display assembly that at least partially defines an internal volume of the device. In this way, some or all of the display assembly can act as a radiating element for an antenna including the antenna feed 218.

In some examples, the conductive core 215 can be electrically coupled to another portion of the housing 212 as described herein, for example, through an insert 226. In some examples, a component or tab 302 can be electrically and/or mechanically coupled to the insert 226 and the conductive core 215. In some examples, the tab 302 can define an aperture and can be coupled to the insert 226 with a fastener, such as a screw 232, that passes through the aperture and is retained by the insert 226. The tab 302 can also include a crimped portion 303 that can mechanically retain the non-conductive coating 216 and the conductive core 215 in a desired position with respect to the tab 302. In some examples, the conductive core 215 can be electrically coupled to the tab 302 and can be soldered, welded, brazed, or otherwise mechanically coupled to the tab 302. By electrically coupling the conductive core 215 to the insert 226, the portion of the housing 212 that is electrically coupled to the insert 226 can act as a radiating element for an antenna including the antenna feed 218.

In some examples, one or more portions of the component 304 can include conductive material (e.g., aluminum, steel, stainless steel, titanium, amorphous alloy, magnesium, or other metal or alloy) or otherwise have a metallic plating affixed to an outer surface thereof. For example, the component 304 can include stainless steel having a conductive plating of nickel and/or gold thereon. The component 304 can be affixed at any location within the housing 212 to support a wire, feed, conductive path, or other component of the electronic device 200.

Figure 6B:
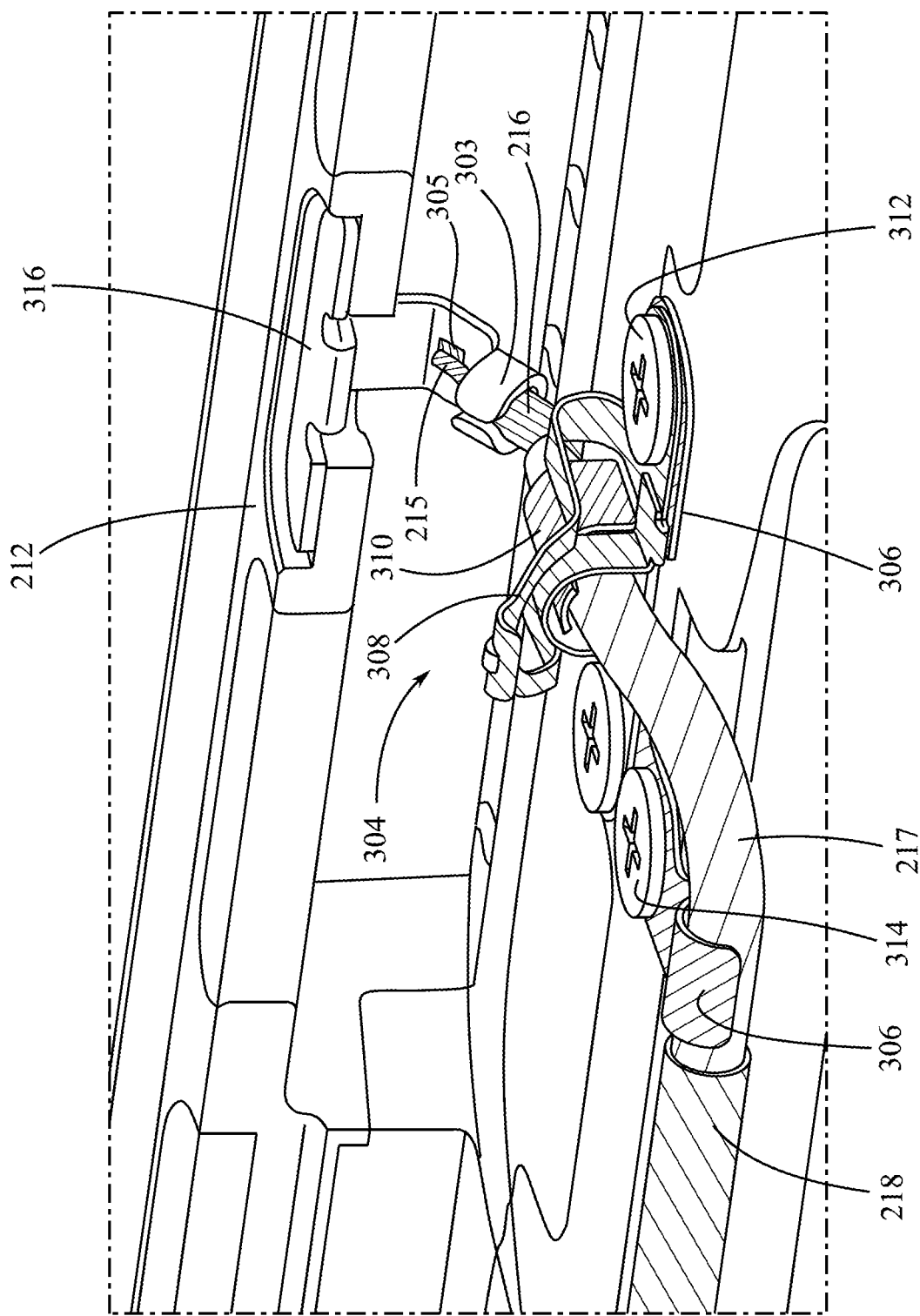
FIG. 6B shows a close-up view of a region of an electronic device.

FIG. 6B shows an example of a connection point similar to the connection point illustrated in FIG. 6A and coupled to an antenna feed 218. The connection point illustrated in FIG. 6B can be substantially similar to and can include some or all of the features of the connection point illustrated in FIG. 6A. For example, the connection point can include an antenna feed 218, a first bracket 306, and a second bracket 308 that can be similar to the antenna feed 218, a first bracket 306, and a second bracket 308 described with respect to FIG. 6A. In some examples, the connection point can include an integrated insert 316. In some examples, the integrated insert 316 can be affixed to the housing segment 212 via laser welding or another process that provides electrical conductivity between the insert 316 and the housing segment 212. By directly connecting the conductive path 218 to the insert 316 without a flexible connector, controller, or other component disposed therebetween, signal losses between the conductive path 218 and insert 316 can be significantly reduced, thereby enhancing antenna performance in addition to saving space within the electronic device. In some examples, the conductive core 215 and insulating layer 216 can be retained in a position relative to the insert 316 by a crimped portion 303. In some examples, the conductive core 215 can be electrically coupled to a conductive contact portion 305 of the insert 316. In some examples, the conductive core 215 can be soldered, welded, or otherwise electrically coupled to the insert 316. By directly connecting the conductive path 218 to the insert 316 without a flexible connector, controller, or other component disposed therebetween, signal losses between the conductive path 218 and insert 316 can be significantly reduced, thereby enhancing antenna performance in addition to saving space within the electronic device.

The functionality of modern electronic devices, such as, smart phones, tablets, etc. is increasingly expanding to include high performance speakers, cameras, wireless communication hardware, and so on. As such, space within the housing of a modern electronic device quickly consumed by the many components providing functionality. Some components can require a particular position within the electronic device to adequately perform. For example, the placement of speakers within the housing can impact the quality of the audio emitted from the device. Antennas also require particular placement within the enclosure to sufficiently transmit and receive wireless signals. In some cases, an antenna volume required to satisfactorily operate the antenna can impede the placement of a speaker at an optimal position relative to the user. One aspect of the present disclosure incorporates a grounding layer, such as copper tape, over at least a portion of an audio output apparatus (e.g., a speaker) to ground the audio output apparatus to the antenna volume. Thus, a speaker can be at least partially incorporated within the antenna volume.

Figure 7A:
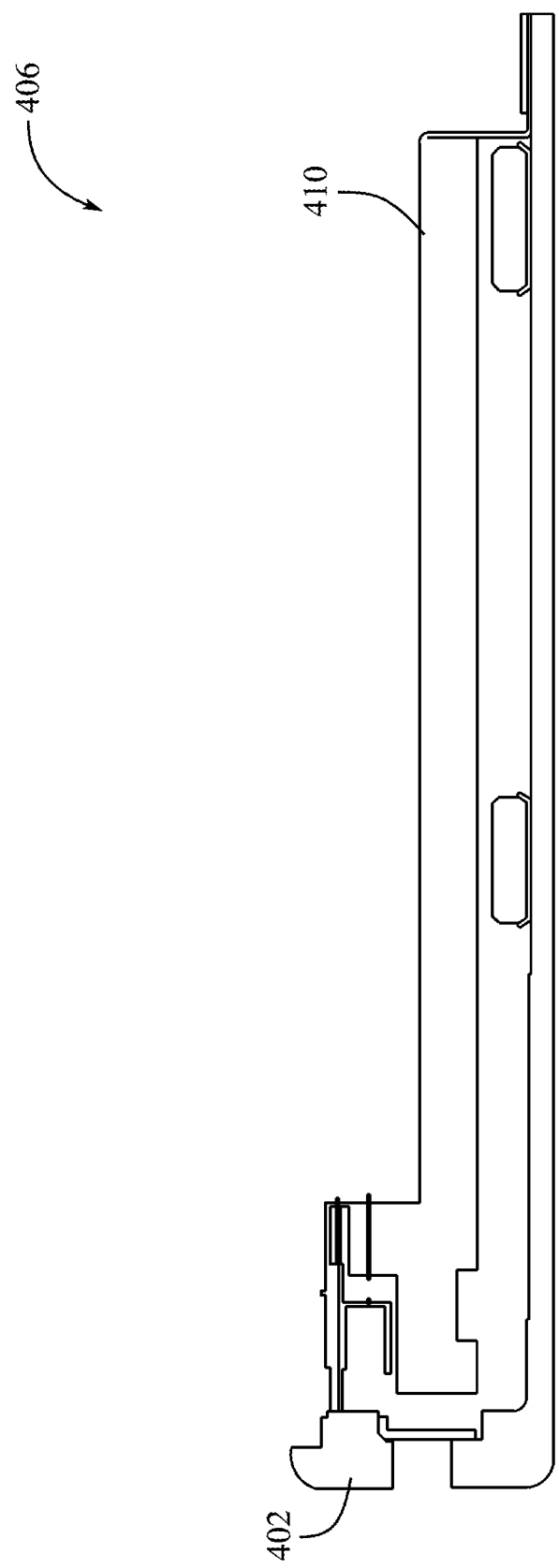
FIG. 7A shows a cross-sectional view of a portion of an electronic device.
Figure 7B:
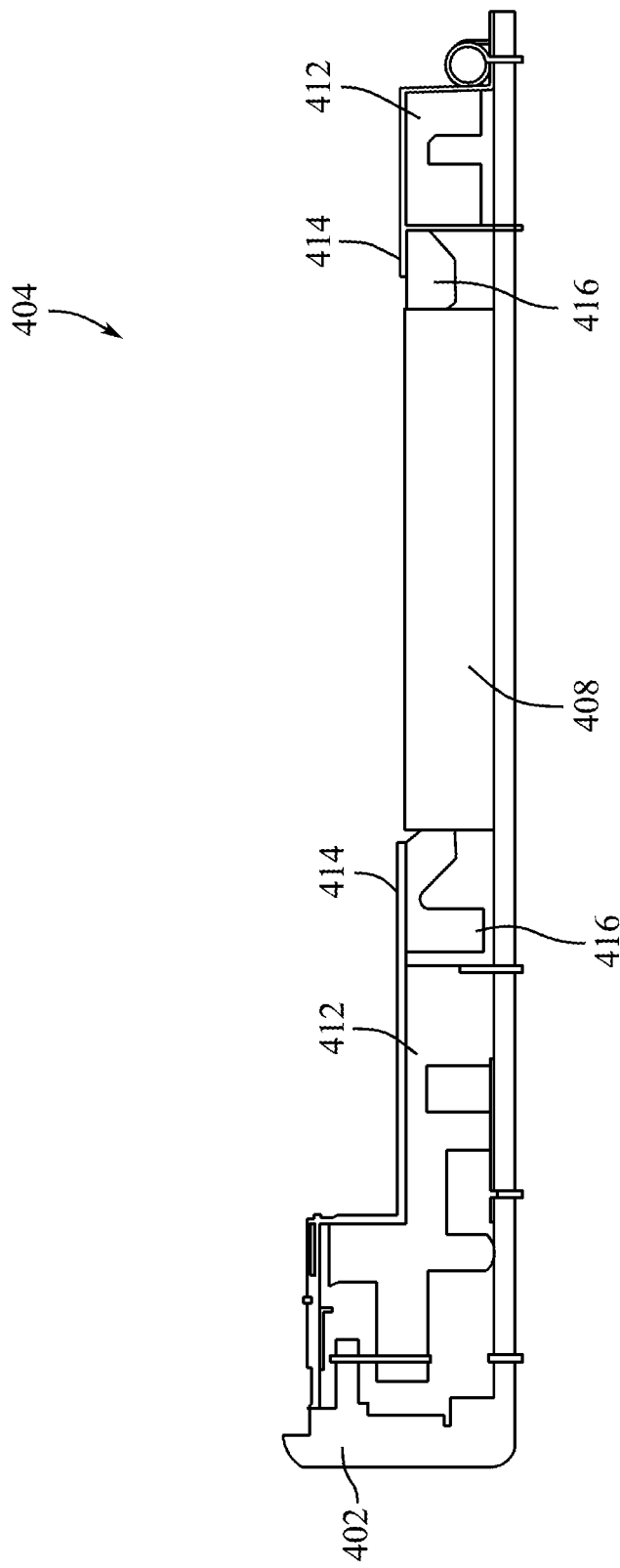
FIG. 7B shows a cross-sectional view of a portion of an electronic device.

FIG. 7A shows a partial section view of the second antenna volume 406, for example at the location indicated in FIG. 1C. As shown in FIG. 7A, a radiating component 410 occupies a substantial portion of the second antenna volume 406. The radiating component 406 can be coupled to the housing 402 and antenna circuitry (not shown). FIG. 7B shows a partial section view of the first antenna volume 404 having the audio output apparatus 408 positioned between portions of the radiating component 412. To at least partially overcome this issues inherent in placing the audio output apparatus 408 within the first antenna volume 404, at least a portion of the audio output apparatus 408 can be electrically grounded to the radiating component 412. For example, a coupling layer 414 can be applied over the radiating portions 412 and at least a portion of the audio output apparatus 408. In some examples, the coupling layer 414 can be a copper tape or other conductive material which electrically grounds a portion of the audio output apparatus 408 to the radiating components 412. The coupling layer 414 can be applied such that a periphery of the audio output component 408 is covered by the coupling layer 414.

FIG. 7B shows a partial section view of the first antenna volume 404, for example at the location indicated in FIG. 1C, having at least a portion of the audio output apparatus 408 coupled to the radiating component 412 via the coupling layer 414. More specifically, an audio output enclosure 416 supporting the audio output apparatus 408 is electrically coupled to the radiating components 412 via the coupling layer 414. Thus, a portion of the audio output apparatus 408 can also be used as effective antenna volume within the first antenna volume 404.

FIGS. 7A and 7B show an electronic device including a housing 402 a first antenna volume 404 and a second antenna volume 406 according to an example. The first antenna volume 404 can include an audio output apparatus (speaker) 408 positioned within the first antenna volume 404. In this particular example, the second antenna volume 406 does not include a speaker positioned therein. An antenna volume is an actual volume within the housing 402 of the electronic device 400 that is occupied by a radiating component of the antenna. The size or volume of the antenna volume directly impacts the functionality or performance of the antenna. Thus, a component such as a speaker within the antenna volume can impact the performance and/or functionality of the antenna.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding engagement and retention features, can apply not only to the specific examples discussed herein, but to any number of examples in any combination. Various examples of electronic devices including components, such as speaker assemblies, having various features in various arrangements are described below, with reference to FIGS. 8-12.

Figure 8:
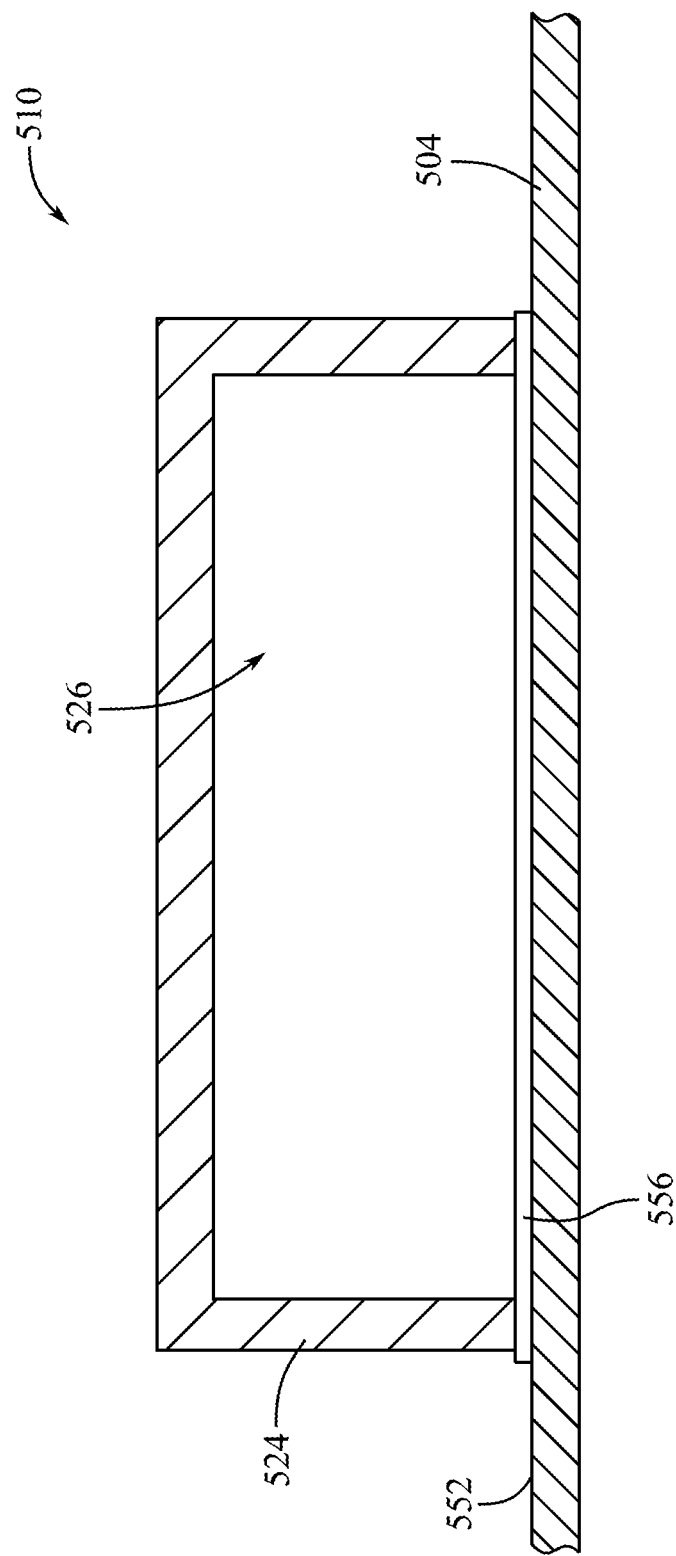
FIG. 8 shows a cross-sectional side view of a speaker enclosure.

FIG. 8 illustrates a cross-sectional side view of a speaker enclosure 524 coupled with a surface of a housing 504. The speaker enclosure 524 can be substantially similar to, and can include some or all of the features of the speaker enclosures described herein. The speaker enclosure 524 can be plastic. In some examples, a speaker module (not shown in FIG. 8) is positioned in the volume 526 defined by the speaker enclosure 524 to form a speaker assembly 510. The volume 526 can serve as the back volume for the speaker assembly 510. In some examples, the speaker enclosure 524 can be a five-sided box having an open side or large aperture. An adhesion element, film, layer, or material 556, such as a pressure-sensitive adhesive (PSA) can be configured to adhere the speaker enclosure 524 to the housing 504. The adhesion element 556 can also be configured to form a seal between the speaker enclosure 524 and the housing 504.

In some examples, a thin sheet of a textile or similar woven structure, a rubber sheet (or a sheet of any other polymeric material), or combinations thereof can be configured to cover or occlude the open end of the five-sided box 524. The speaker enclosure 524 can be secured to the interior surface 552 of the housing 504 such that the sealing film 556 is positioned between the speaker enclosure 524 and the housing 504. In some examples, a film can be secured over the aperture of the speaker enclosure 524 prior to securing the speaker enclosure 524 to the housing 504. In this manner, the manufacturing process of the electronic device can be improved by ensuring a proper sealed volume in the speaker enclosure 524 prior to securing the speaker enclosure 524 to the housing 104. Further details of speaker assemblies are discussed below with reference to FIGS. 9A-9E.

Figure 9A:
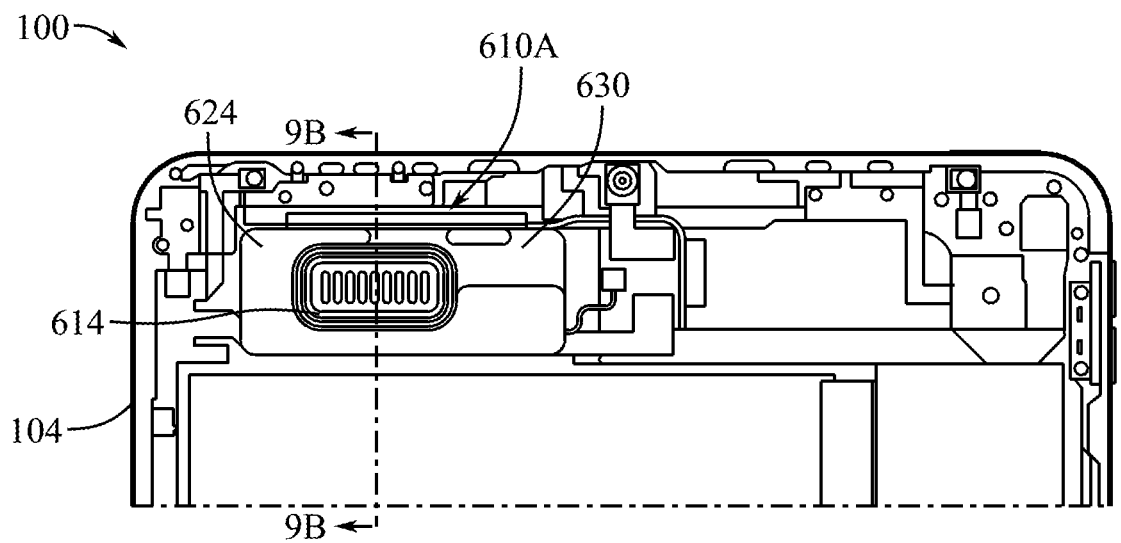
FIG. 9A shows an enlarged front view of an electronic device.
Figure 9B:
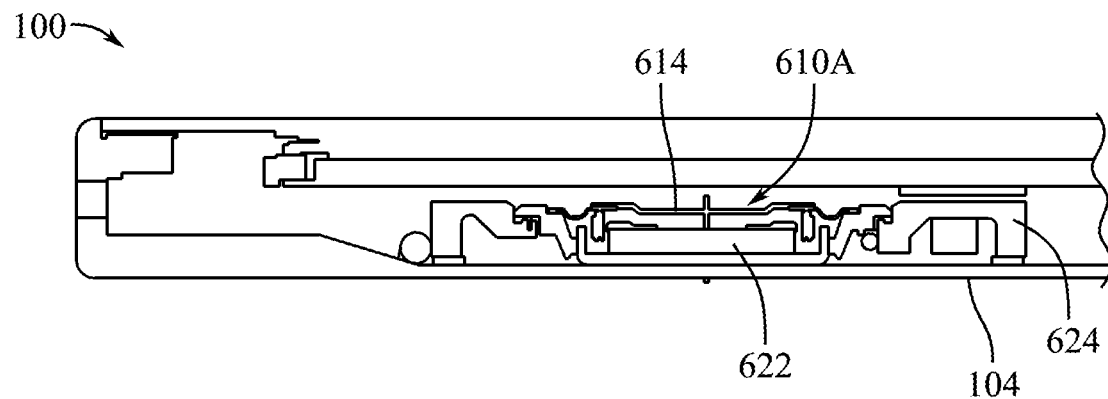
FIG. 9B shows a cross-sectional side view of the electronic device of FIG. 9A.

FIG. 9A illustrates an enlarged front view of the electronic device 100 and FIG. 9B illustrates a cross-sectional side view of the electronic device 100 taken from cross-section 9B-9B as shown in FIG. 9A. Further, FIG. 9C illustrates an exploded perspective view of a speaker assembly 610A.

With reference to FIGS. 9A-9E, a speaker assembly 610A can be positioned in the upper region or "forehead" of the electronic device 100. The speaker assembly 610A can include a speaker enclosure 624. The speaker enclosure 624 can be substantially similar to, and can include some or all of the features of the speaker enclosures described herein. In some examples, the speaker enclosure 624 can be affixed to an interior surface of the housing 104. The speaker enclosure 624 can include a variable amount of sides or regions. In other words, a speaker volume which houses the speaker components and forms a back volume can be defined not only by the speaker enclosure 624, but also by one or more walls or regions of the housing 104, for instance a back wall of the housing 104 (i.e., opposite the display).

Figure 9C:
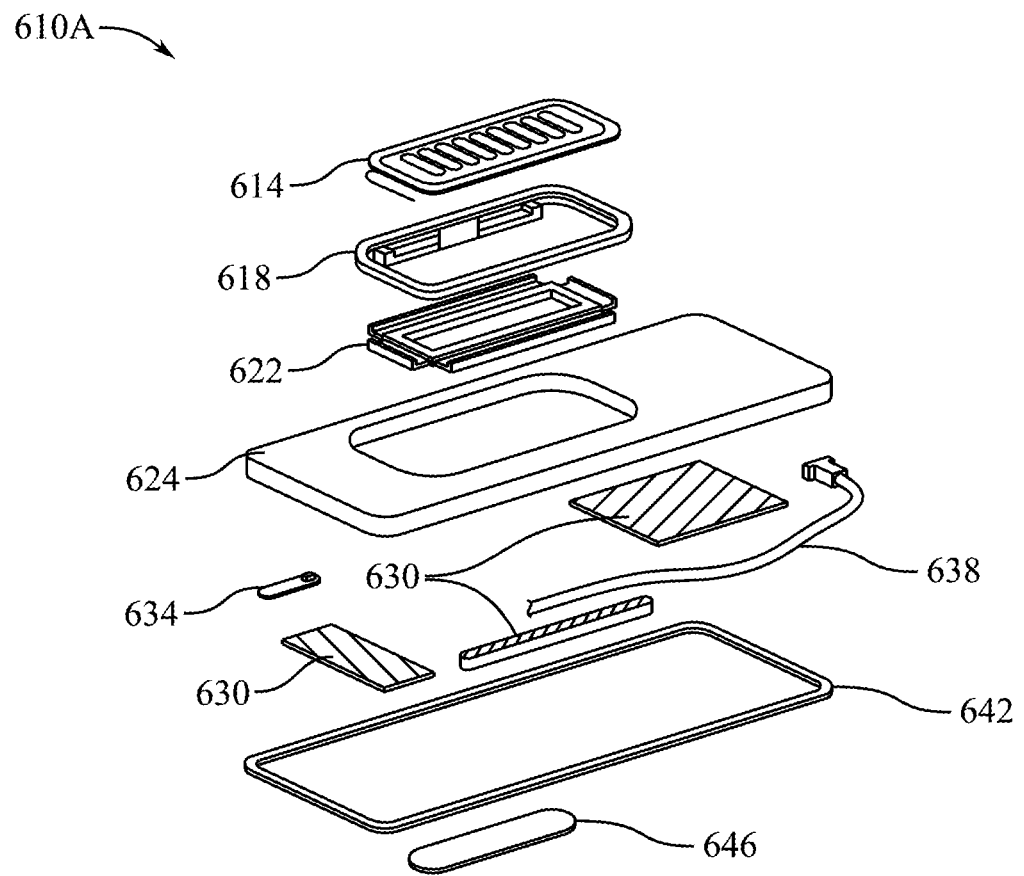
FIG. 9C shows an exploded perspective view of a speaker assembly.

As best illustrated in FIGS. 9B and 9C, the speaker assembly 610A can include a moving mass 614 such as a diaphragm, a driver frame 618, a magnet assembly 622, a speaker enclosure 624, wiring 638, acoustic dampening and/or directing foams 630, an adhesion element 642, such as sealing PSA, and adhesive 646 for the driver. The foams 630 can be positioned and optimized to direct acoustic energy along a desired path. In some examples, the foams 630 are positioned to direct acoustic energy into the system, for instance, toward a center of the electronic device. By strategically placing the foams 630, the stereo quality of the speaker assembly 610A can be improved. In some examples, the foams 630 can touch up on the top of the module.

In some examples, the speaker enclosure 624, in combination with the moving mass or diaphragm 614, can form a five-sided box having an open side that defines an aperture. As can be seen in FIG. 9C, the speaker enclosure 624 can define an opening in which the diaphragm 614 resides. As used herein, the term "five-sided box" refers to any generally three-dimensional enclosure, such as a cuboid shaped enclosure, that partially defines a volume but that includes an aperture so as to not fully enclose the volume. The five-sided speaker enclosure 624 can have any shape and is not limited to a square or rectangular shape. The speaker enclosure 624 can then be secured on a back interior surface of the housing 104 using PSA 642, such that the interior surface covers or occludes the open side of the speaker enclosure 624 to form an enclosed speaker volume. An advantage of utilizing a five-sided box is that the height of the speaker enclosure is reduced seeing as the wall of the housing 104 is acting as a side of the speaker enclosure. It can be desirable to increase the back volume of a speaker assembly to achieve desired levels of performance, while reducing the amount of space within the internal volume of an electronic device occupied by a speaker assembly. This can be accomplished by utilizing a five-sided speaker enclosure.

Figure 9D:
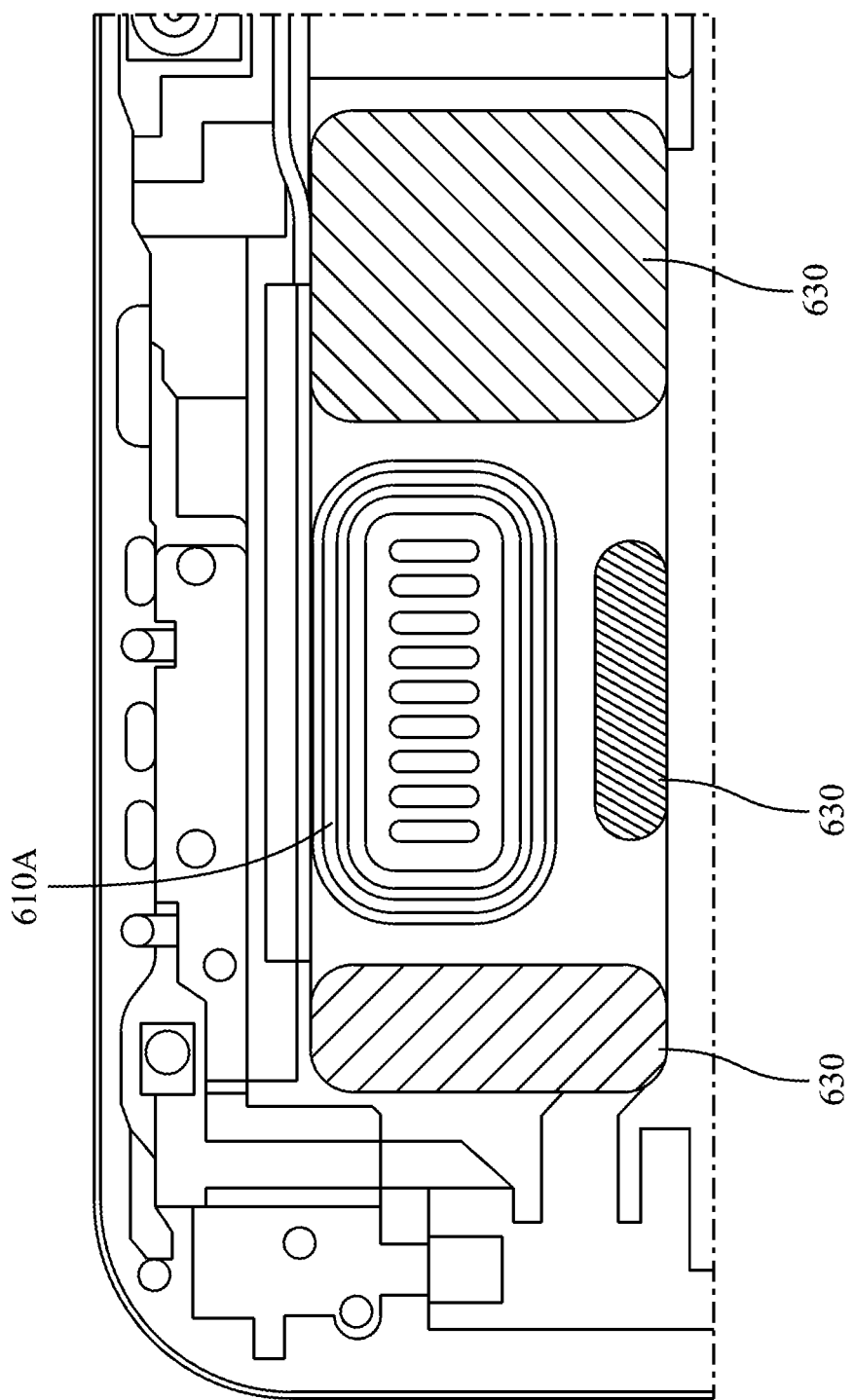
FIG. 9D shows a top view of a speaker assembly of the electronic device of FIG. 9A.

FIG. 9D shows a top view of a speaker assembly 610A shown in FIG. 9A including compressible material, in the form of compressible portions or members 631 positioned on top of the speaker enclosure 624 of the speaker assembly 610A. Although the speaker assembly 610A can have any location within an electronic device as described herein, in some examples and as shown in FIG. 9D, the speaker assembly 610A can be positioned near or adjacent to an edge or edges of the device. In some examples, it can be desirable to direct sound produced by the speaker assembly 610A in one or more directions, such as towards an edge of the device, where a port or opening may be present to allow sound to emanate from the device. In the example shown in FIG. 9D, it can be desirable to direct sound produced by the moving diaphragm 614 toward the edge of the device positioned at the top of the page. As such, the compressible portion 631 can be positioned on a top surface the enclosure 624 to direct sound and/or audio signals produced by the speaker assembly 610A in one or more desired directions. In some examples, the compressible portions 631 can include any desired compressible and/or resilient material, such as a foam, including a polymer foam. In some examples, the compressible portions 631 can include one or more separate portions, or a single continuous portion. In some examples, the compressible portions 631 can at least partially surround an aperture in which a speaker module including a diaphragm can be disposed. In some examples, the compressible portions 631 can surround at least one, at least two, or at least three sides of the aperture.

Figure 9E:
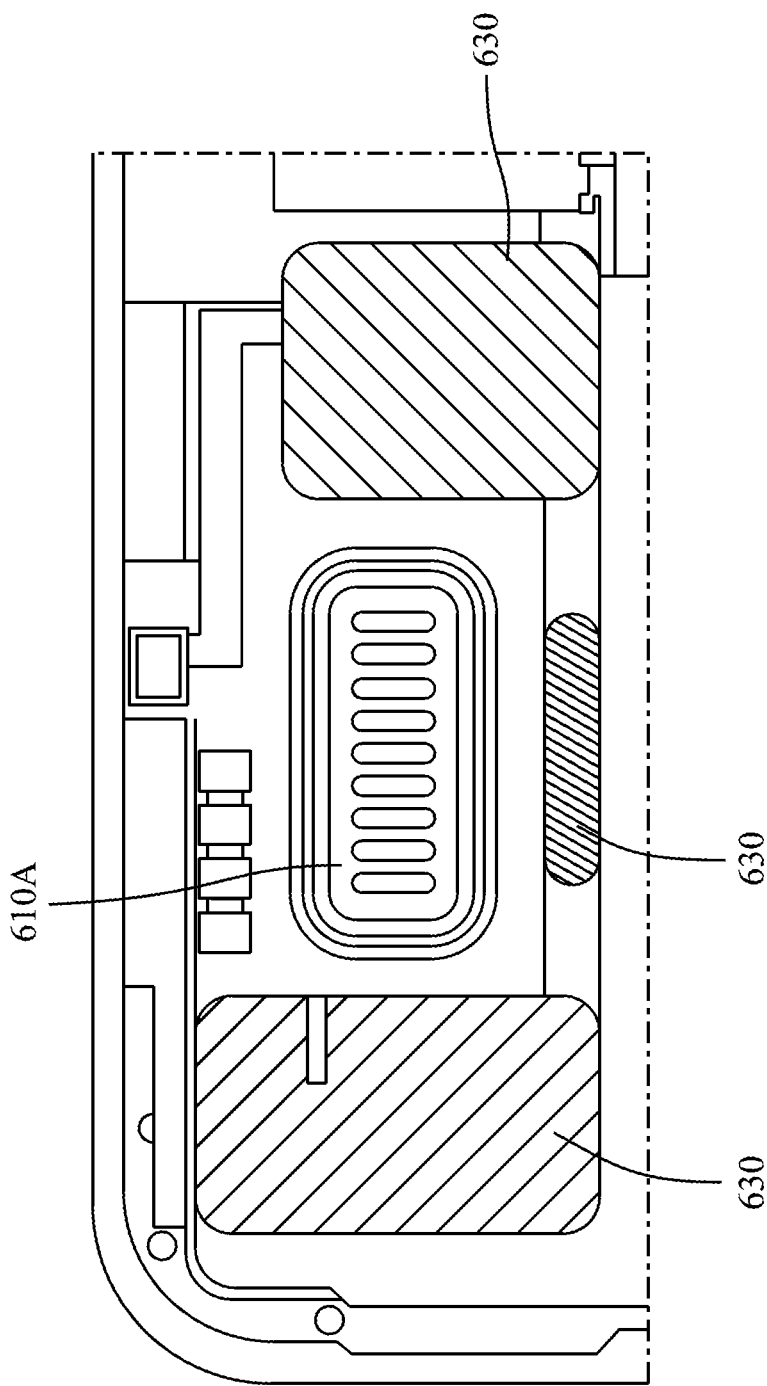
FIG. 9E shows a top view of a speaker assembly of the electronic device of FIG. 9A.

FIG. 9E shows a top view of a speaker assembly 610A shown in FIG. 9A, including the foam portions 631 disposed on an exterior surface of the speaker assembly 610A and their position relative to the other components of the speaker assembly 610A. The foam portion 631 locations and/or sizes can be different than the foam portion 631 locations and/or sizes shown in FIG. 9D. For example, certain of the foam portions 631 of FIG. 9E can be larger or smaller than corresponding foams 631 shown in FIG. 9D in order to accommodate or make room for other components in the device, while still providing the same or similar sound directing functions. In some examples, the foams 631 shown in FIGS. 9D and 9E can reduce air pressure imbalances that can occur when driving the speaker without the foams 631 present. In some examples, the reduction of such pressure imbalances can reduce the occurrence of rocking of the speaker assembly 610A and can lead to improved sound quality and increased efficiency, especially for low frequency sounds. Additionally, the presence of the foam 631 on top of the speaker enclosure can prevent inadvertent and/or undesirable contact between the diaphragm of the speaker assembly 610 and any components of the device that may be disposed over the speaker assembly 610A, such as a display assembly. Further details of speaker assemblies are provided below with reference to FIG. 10A-12.

Figure 10A:
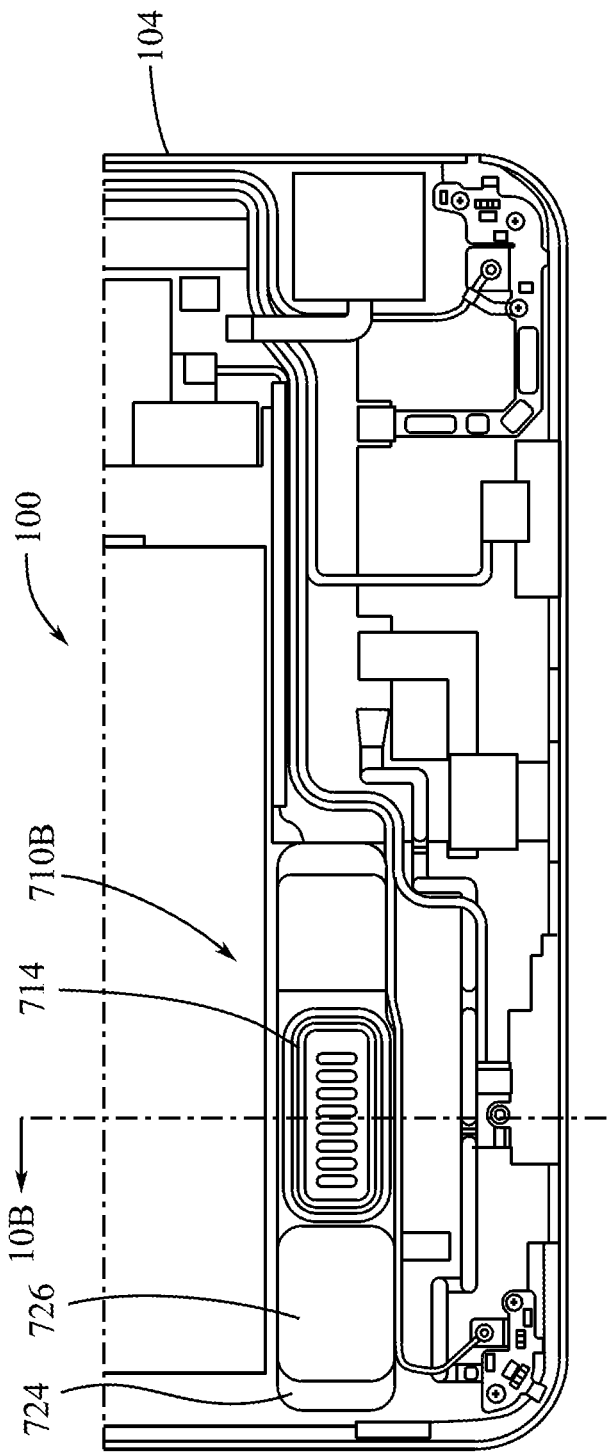
FIG. 10A shows an enlarged front view of an electronic device.
Figure 10B:
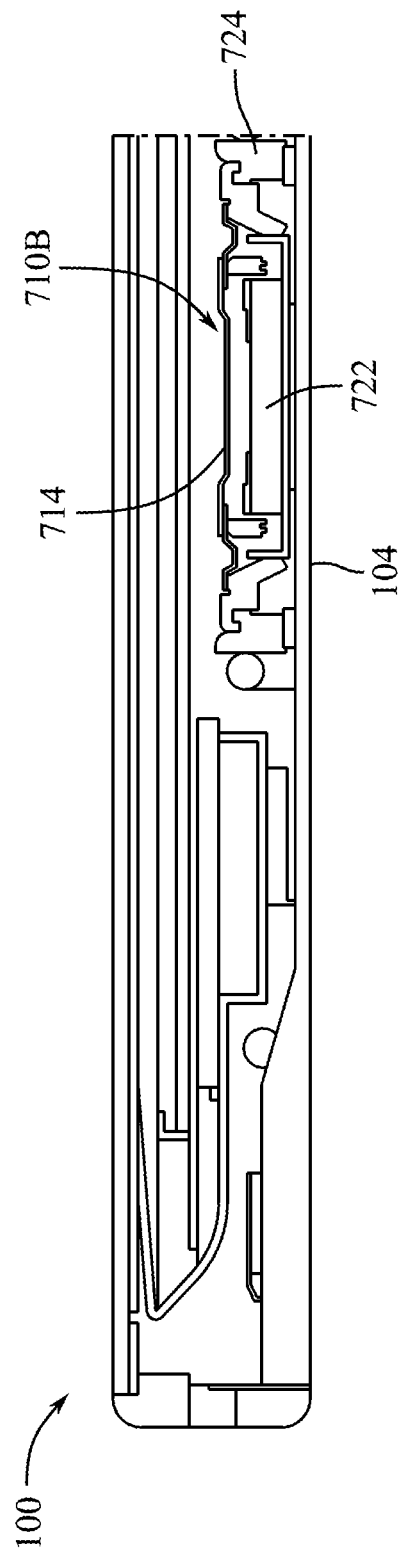
FIG. 10B shows a cross-sectional side view of the electronic device of FIG. 10A.
Figure 11A:
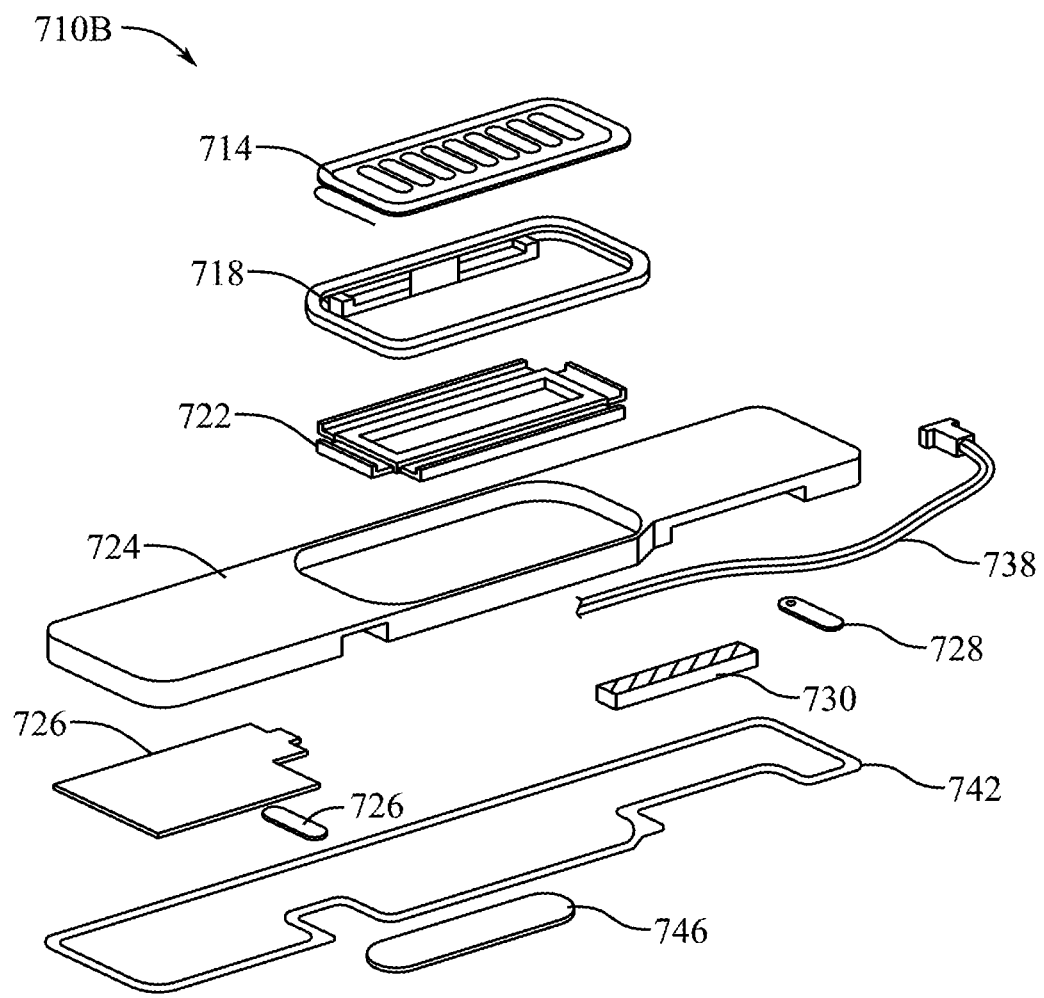
FIG. 11A shows an exploded perspective view of a speaker assembly.

FIG. 10A illustrates an enlarged front view of a lower region or chin of the electronic device 100 and FIG. 10B illustrates a cross-sectional side view of the electronic device 100 taken from cross-section 10B-10B as shown in FIG. 10A. Further, FIG. 11A illustrates an exploded view of the speaker assembly 710B. As best illustrated in FIG. 11A, the speaker assembly 710B can include a moving mass 714 such as a diaphragm, a driver frame 718, a magnet assembly or driver 722, a speaker enclosure 724, wiring 738, a barometric vent 728, acoustic dampening and/or directing foams 730, a passive radiator 726, an adhesion element 742, such as sealing PSA, and adhesive for the driver 746.

The speaker assembly 710B can be substantially similar to, and can include some or all of the features of the speaker assembly 610A, described herein. However, the speaker assembly 710B can be smaller than the speaker assembly 610A, due to space constraints in the bottom of the device 100. Accordingly, the speaker assembly 710B can include a passive radiator 726 to amplify the acoustics and generate a more balanced experience for the user. The speaker assembly 710B can include a speaker enclosure 724. In some examples, the speaker enclosure 724 can be affixed to an interior surface of the housing 104, for example, with PSA 742. The speaker enclosure 724 can include a variable amount of sides or regions. In other words, a speaker volume can be defined not only by the speaker enclosure 724, but also by one or more walls or regions of the housing 104, for instance a back wall of the housing 104 (i.e., opposite the display). The speaker enclosure 724 can define an opening in which a moving mass or diaphragm 714 resides. In some examples, the speaker enclosure 724, in combination with the diaphragm 714, can be a five-sided box having an open side that defines an aperture. The speaker enclosure 724 can then be positioned on a back interior surface of the housing 104 such that the interior surface covers or occludes the open side of the speaker enclosure 724 to form an enclosed speaker volume.

Figure 11B:
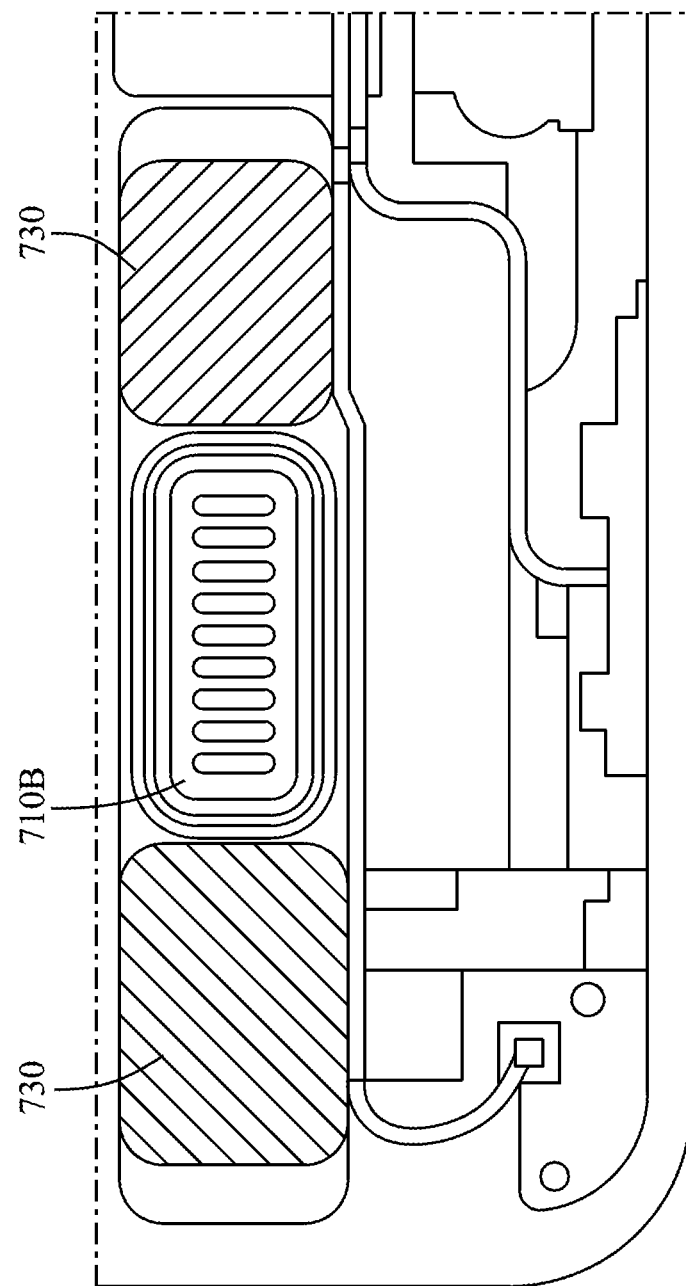
FIG. 11B shows a top view of a speaker assembly of the electronic device of FIG. 10A.

FIG. 11B shows a top view of a speaker assembly 710B similar to the one shown in FIG. 11A including foam portions 731 disposed on a surface of the speaker enclosure of the speaker assembly 710B. Although the speaker assembly 710B can be positioned at any location within an electronic device as described herein, in some examples, the speaker assembly 710B can be positioned near or adjacent to an edge or edges of the device. In some examples, it can be desirable to direct sound produced by the speaker assembly 710B in one or more directions, such as towards an edge of the device, where a port or opening may be present to allow sound to emanate from the device, as well as away from the edge and into the internal volume of the device. As such, the foams 731 can be positioned in the enclosure 724 to direct sound and/or audio signals produced by the speaker assembly 710B in two or more desired directions.

FIG. 12A shows a top view of a portion of a speaker assembly 810 that can be substantially similar to, and can include some or all of the features of the speaker assemblies described herein, such as speaker assemblies 610A and 710B. As with the other speaker assemblies described herein, the speaker assembly 810 can include a moving mass 814, such as a diaphragm, that can be coupled to a frame 818 and can be driven by a magnet assembly or a driver disposed below the diaphragm 814.

Figure 12B:
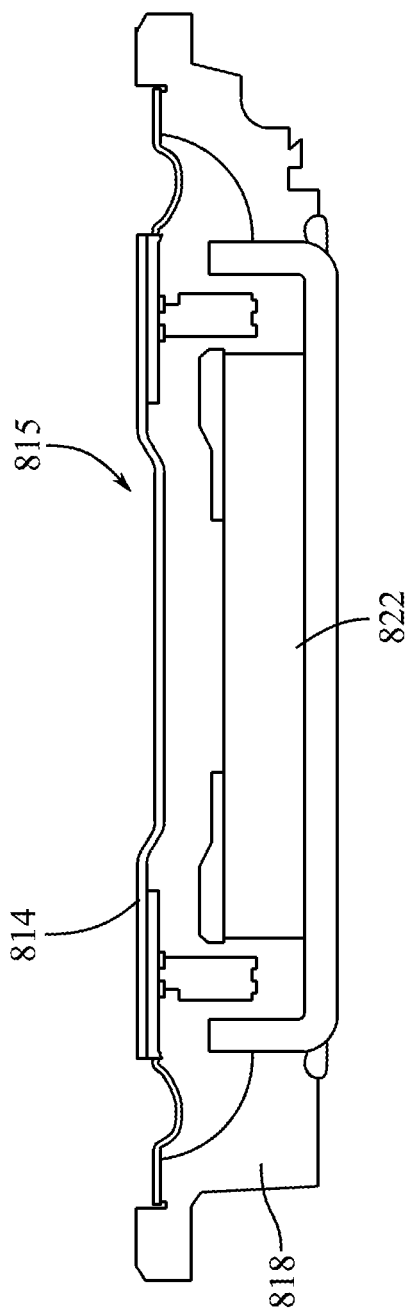
FIG. 12B shows a cross-sectional side view of the speaker assembly of FIG. 12A.

FIG. 12B shows a cross-sectional side view of the speaker assembly 810 of FIG. 12A taken along the line indicated in FIG. 12A. As can be seen, the speaker assembly 810 can include a driver 822 disposed below the diaphragm 814 in a volume at least partially defined by the frame 818. In some examples, the diaphragm 814 can be a relatively flexible and pliant material, such as a rubber and/or polymer material. Further, in some examples, a single speaker assembly 810 can be used to produce both high and low frequency sounds, thereby eliminating the need for separate woofer and tweeter modules, and saving space within the internal volume of the electronic device. In some examples, however, the flexibility of the diaphragm 814 that allows for a desired quality of low frequency sound output may be too flexible to achieve a desired quality for high frequency sound output. Accordingly, in some examples, the diaphragm 814 can define a non-planar structure or feature, such as an indentation 815 as shown in FIG. 12B.

Figure 12C:
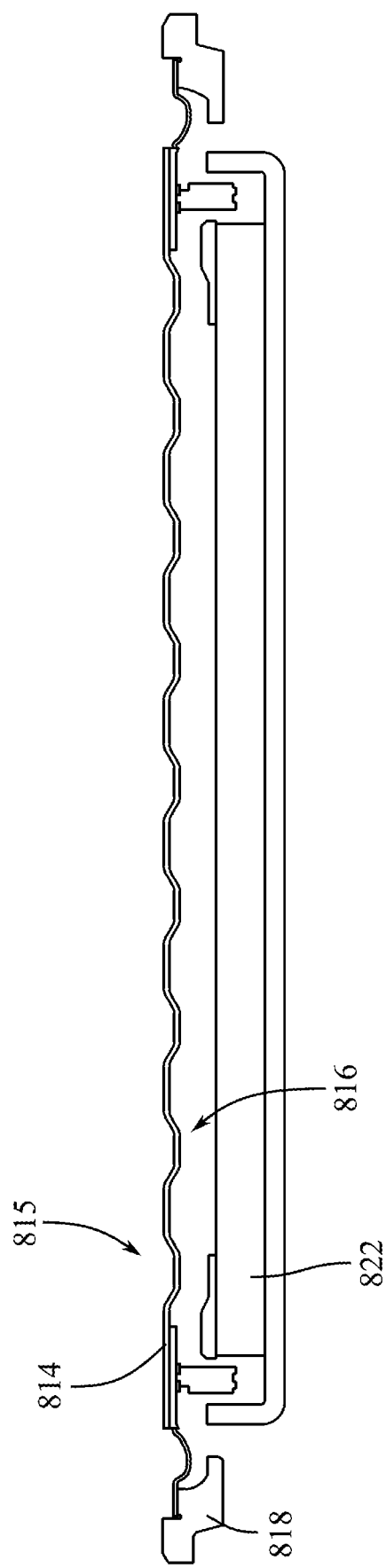
FIG. 12C shows a cross-sectional side view of the speaker assembly of FIG. 12A.

FIG. 12C shows a cross-sectional side view of the speaker assembly of FIG. 12A taken perpendicular to the cross-sectional view shown in FIG. 12B. Whereas the diaphragm 814 may define a single indentation 815 along the axis shown in FIG. 12B, the diaphragm 814 can also define multiple indentations 815 spaced along the length or width of the diaphragm 814. In some examples, adjacent indentations 815 can define a ridge or raised portion 816, and the diaphragm 814 can define one or more ridges 816, as desired. In some examples, the diaphragm 814 can define between 1 and 50 ridges, between 1 and 25 ridges, between 5 and 20 ridges, or between 5 and 15 ridges, for example about 8, 9, 10, 11, or 12 ridges. The indentations 815 and/or ridges 816 defined by the diaphragm 814 can serve to increase the stiffness of the diaphragm 814 over one or more desired frequency ranges. Accordingly, the diaphragm 814 can include a material having a flexibility that can provide a desired quality of sound at low frequencies, while the indentations 815 and/or ridges 816 defined by the diaphragm 814 can serve to stiffen the diaphragm 814 and allow for a desired level of sound quality for high frequency sound output. Further details regarding a speaker assembly for an electronic device are provided with respect to FIGS. 13A and 13B.

Figure 13A:
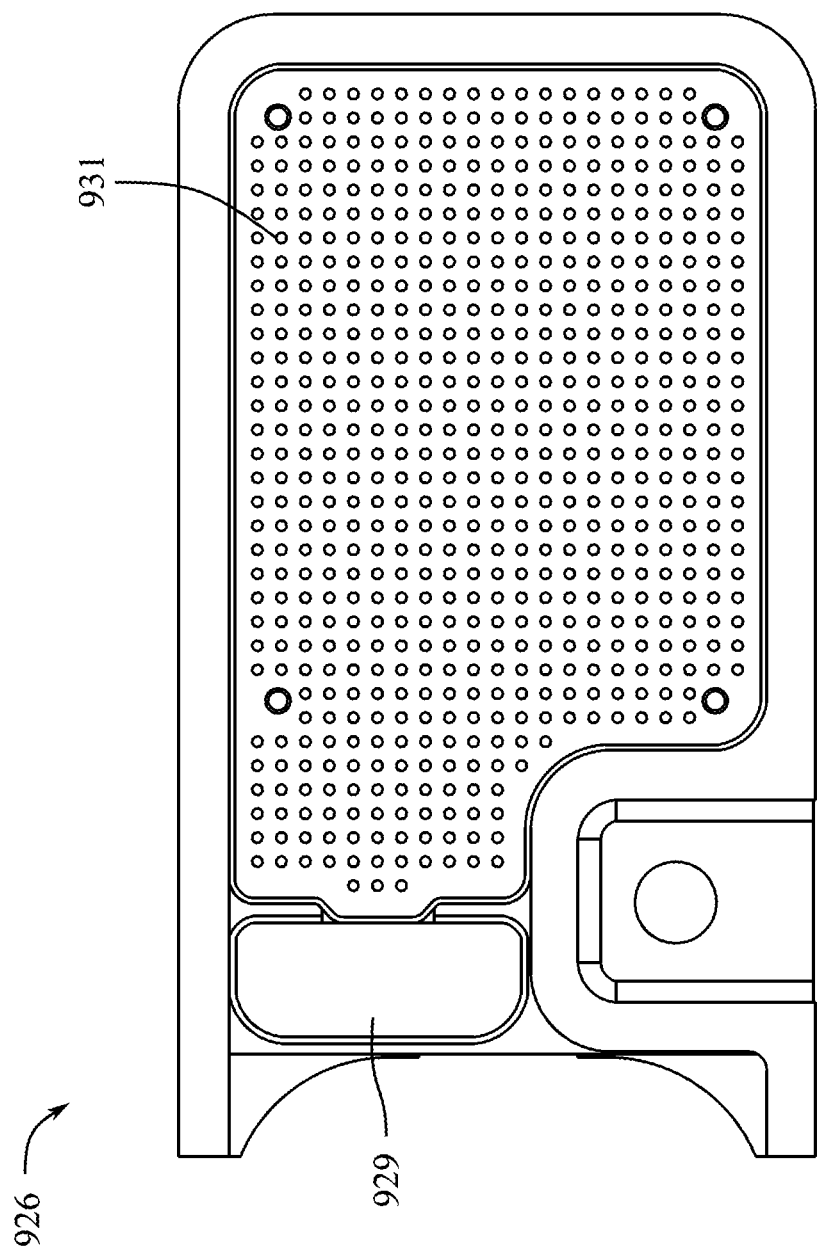
FIG. 13A shows a front view of a component of a speaker assembly.

FIG. 13A illustrates a front view of the passive radiator 926, as shown in FIG. 11A. The passive radiator 926 can include a high tension, low elongation mesh 929, such as a SAATI mesh, adhered with PSA and a stainless steel etched plate 931. To improve performance of the speaker assembly 710B in the chin, the passive radiator 926 can be positioned in the back volume to amplify the speaker assembly 710B. Because the speaker assembly 710B has less speaker volume than the speaker assembly 610A due to space constraints near the bottom of the device, the speaker assembly 710B can incorporate the passive radiator 926 to supplement the performance of the speaker assembly 710B to better match and balance with the speaker assembly 610A.

Figure 13B:
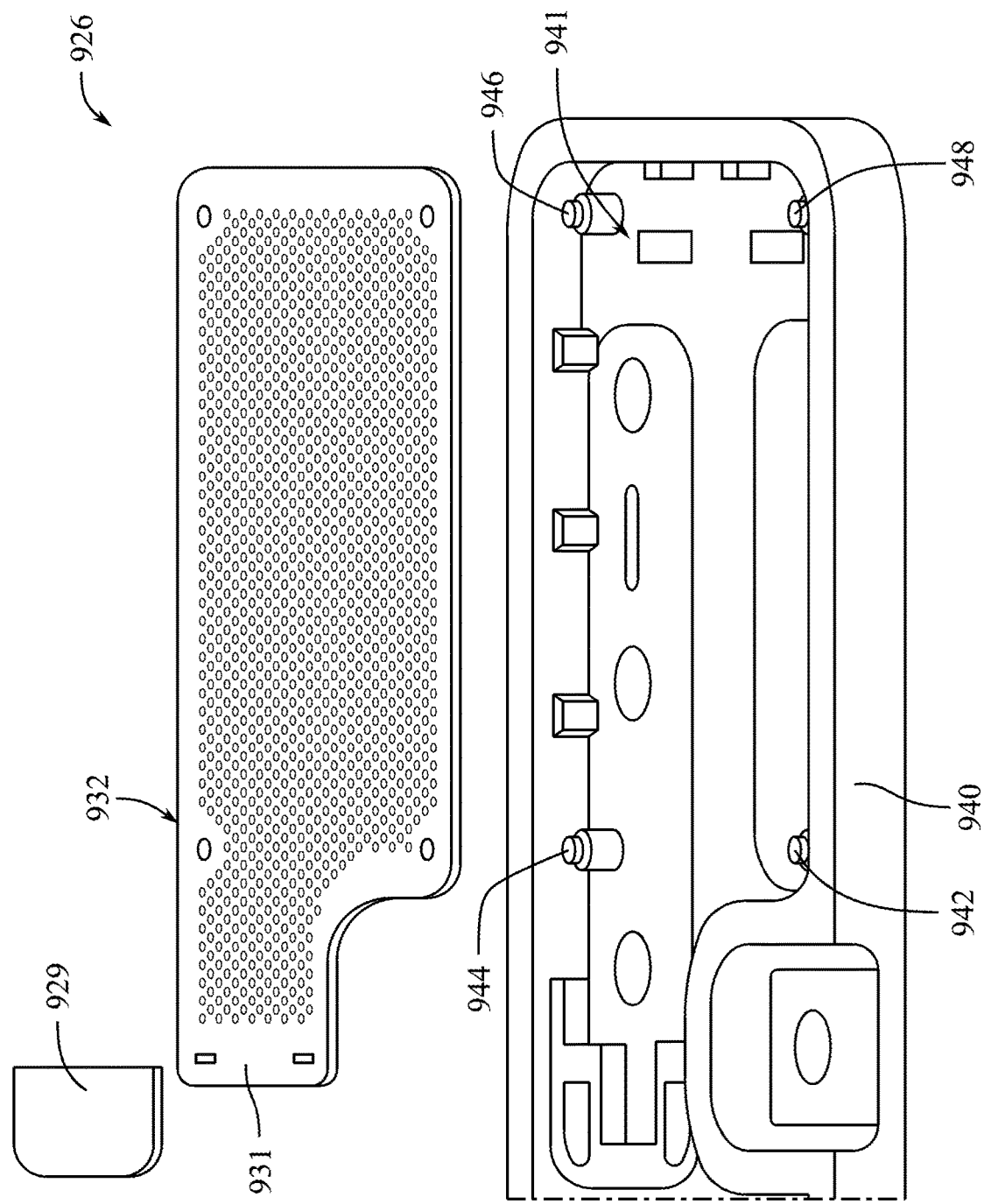
FIG. 13B shows an exploded view of the component of FIG. 13A.

FIG. 13B shows an exploded view of the passive radiator 926 of FIG. 13A, including the SAATI mesh 929, a perforated stainless steel plate 931, and the speaker enclosure 940. As can be seen, the plate 931 can define one or more holes or apertures 932. In some examples, the apertures 932 can be separate from the perforations of the mesh, although in some other examples the apertures can be the perforations of the mesh. The apertures 932 can be positioned near corners and/or edges of the plate 931, as desired. In some examples, the apertures 932 can align with one or more posts or stakes, 942, 944, 946, 948 that can be positioned in a volume 941 at least partially defined by the enclosure 940. In some examples, during an assembly process, stakes 942, 944, 946, 948 can be positioned at least partially in or through the apertures or opening 932 and the plate 931 can be heat staked to the enclosure 940 in order to retain it in a desired location. Thus, in some examples, the speaker enclosure can include a polymer material that can be selectively melted and/or deformed once the stakes 942, 944, 946, 948 have passed through the openings 932 to form a structure which cannot pass back through the openings 932, thereby securing the plate 931 to the enclosure 940. Although shown only at a single location of an enclosure of a speaker assembly, such as assembly 710B, the speaker assemblies described herein can include any number of passive radiators in any desired configuration. In some examples, a speaker assembly can include two passive radiators positioned on opposite sides of a speaker driver. This configuration can increase the balance of the speaker assembly, thereby reducing rocking and improving sound quality.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding engagement and retention features, can apply not only to the specific examples discussed herein, but to any number of examples in any combination. Various examples of electronic devices including components, such as antennas, having various features in various arrangements are described below, with reference to FIGS. 14A-16.

FIG. 14A illustrates an enlarged front view of the upper region of an electronic device that can be substantially similar to, and can include some or all of the features of the electronic devices described herein, such as electronic device 100. This upper region can be referred to as the "forehead" of the electronic device and can include a housing 1012 that can at least partially define an internal volume of the device and one or more speaker assemblies 1010, as described herein. The forehead region can also contain one or more antennas, such as antenna modules 1020, 1022, and 1024. In some examples, any of these antenna modules 1020, 1022, 1024 can radiate at one or more desired frequencies, such as WI-FI frequencies and/or cellular, LTE, and 5G frequencies. In some examples, the antenna module 1020 can operate at 2.4 GHz, the antenna module 1022 can operate at 5 GHz, and the antenna module 1024 can be a dual-band antenna that operates at 2.5 GHz and 5 GHz.

In some examples, the housing 1012 can include a relatively electromagnetically opaque material, such as metal. Accordingly, the antenna modules may not be able to radiate out of the back of the housing 1012 and will instead radiate in a substantially upward direction, for example, extending out of the page from FIG. 14A. In some examples, and as shown in FIG. 1A, a display or a top module (not shown) can be disposed above the antenna modules 1020, 1022, 1024. In some examples, an antenna module 1020 can be coupled to a component 1021 that can at least partially define the cavity of the antenna module 1020. In some examples, this component 1021 can include a metallic material, for example, in the form of a plate or sheet. Thus, in some examples, the antenna module 1020 and component 1021 can include a parallel plate antenna. Although the component 1021 can be positioned near the antenna module 1020, in some examples, other components that are in electrical communication with other antenna modules 1022, 1024 may not be located adjacent thereto.

In some examples, a component 1026 can be coupled to the antenna module 1022 to form a parallel plate antenna, while a component 1025 can be coupled to the antenna module 1024 to form a parallel plate antenna. Additionally the antenna modules 1020, 1022, 1024, and/or the components 1021, 1025, 1026 can be electrically grounded to one or more other components of the device to tune the antenna and to achieve desired levels of antenna performance.

Further, because the antennas described herein can be parallel plate antennas, the presence of other components of the device, such as the display or top module, can have a capacitance value that can affect the tuning of the antenna. Accordingly, as shown in FIG. 14B, conductive components can be added at desired locations to compensate for the capacitance of components of the device. For example, a conductive tape 1030 can be positioned as shown, and can be electrically connected to one or more components of the device, such as the housing 1012, to compensate for the capacitance of the top module on the parallel plate antennas described herein. Further details regarding antenna components are described with respect to FIGS. 15A-15E.

Figure 15A:
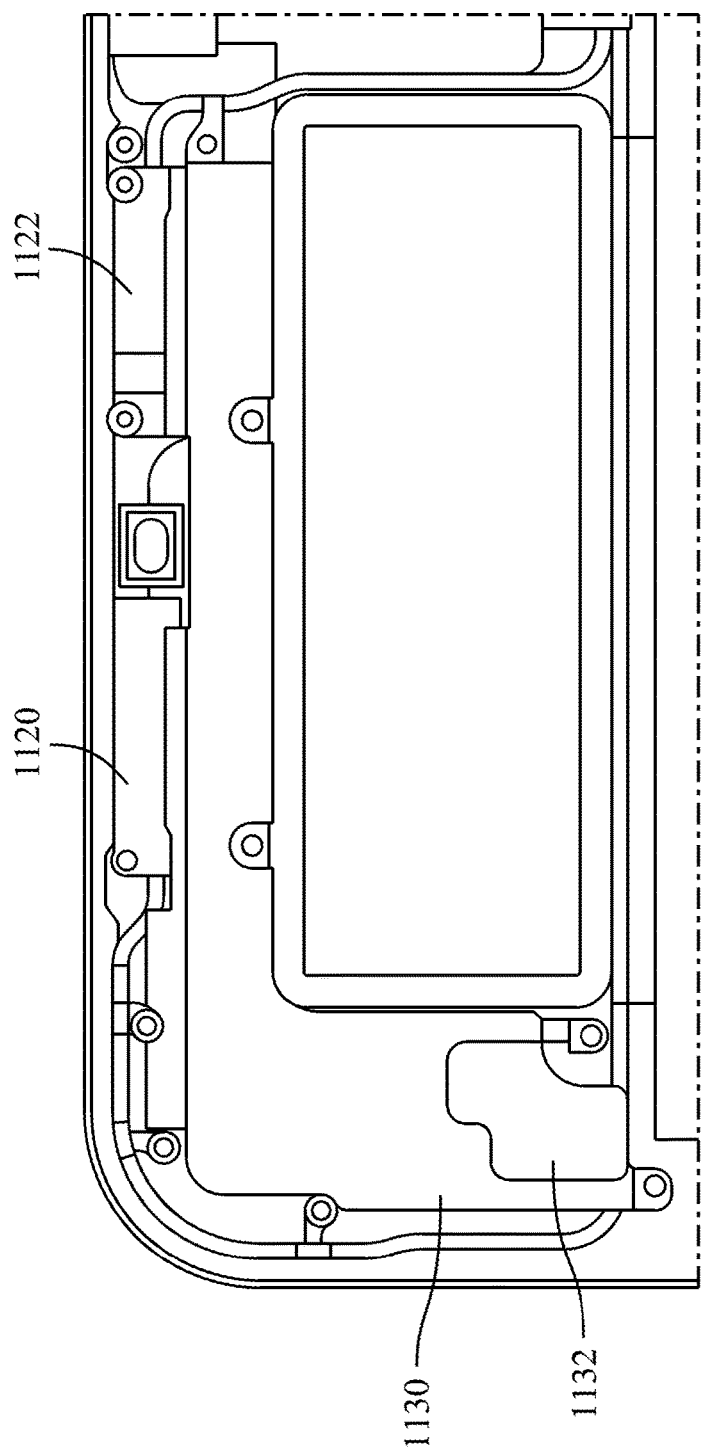
FIG. 15A shows a close-up view of components of a region of an electronic device.

FIG. 15A shows a close-up view of several components of the forehead region of an electronic device, for example, as shown in FIG. 14A. As described herein, the device can include one or more antenna modules 1120, 1122 that can be single or multi-band modules. In some examples, the antenna module 1020 can operate at 2.4 GHz and the antenna module 1022 can operate at 5 GHz. One or both of the antenna modules 1120, 1122 can be electrically coupled to an antenna resonant structure 1130. This structure can include a metallic material, for example, in the form of a metallic sheet. In some examples, the resonant structure can include a first material coated with a second, more conductive metal, such as steel or plastic coated with copper. The antenna resonant structure 1130 can be in electrical communication with one or both antenna modules 1120, 1122, for example, through a flexible electrical connector that can be soldered, connected by SMT, or otherwise connected to the antenna resonant structure 1130.

Typically, discrete modules having desired capacitance and/or inductance values can be added to an electrical circuit including the antenna to tune the antenna performance. Due to the relatively compact geometry of the devices described herein, however, it can be desirable to tune antenna performance without the addition of such components. Accordingly, a shunt 1132 can be positioned near the antenna resonant structure 1130 to tune the performance and/or resonant frequency of the antenna modules 1120, 1122 by capacitively coupling with the antenna circuits during operation. Accordingly, the material, size, and geometry of the shunt 1132 can be selected to tune the performance of the antenna modules 1120, 1122. In some examples, the shunt 1132 can include a conductive material, such as a metal. In some example, the shunt 1132 can include a ferrous material, such as steel. Further details regarding antenna tuning are discussed below with reference to FIGS. 15C-15E.

Figure 15B:
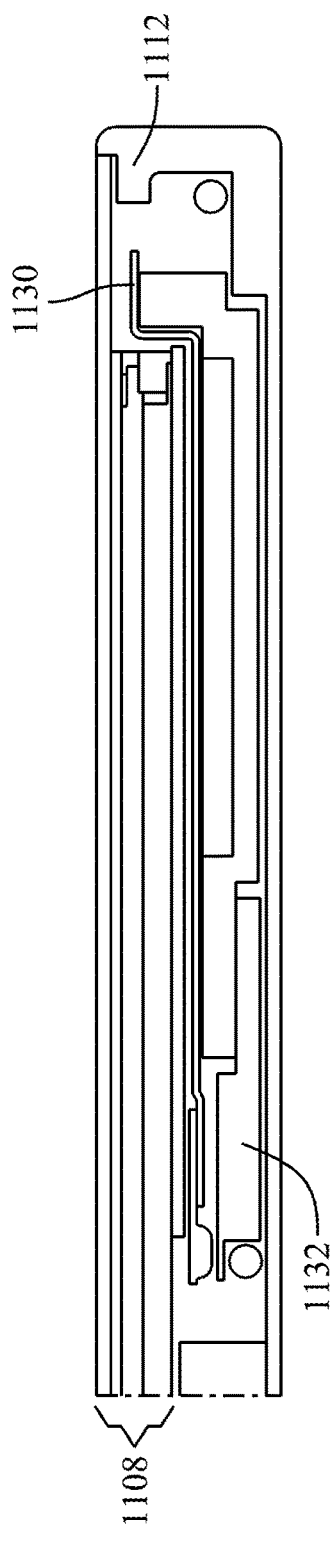
FIG. 15B shows a cross-sectional side view of the region of the electronic device of FIG. 15A.
Figure 15C:
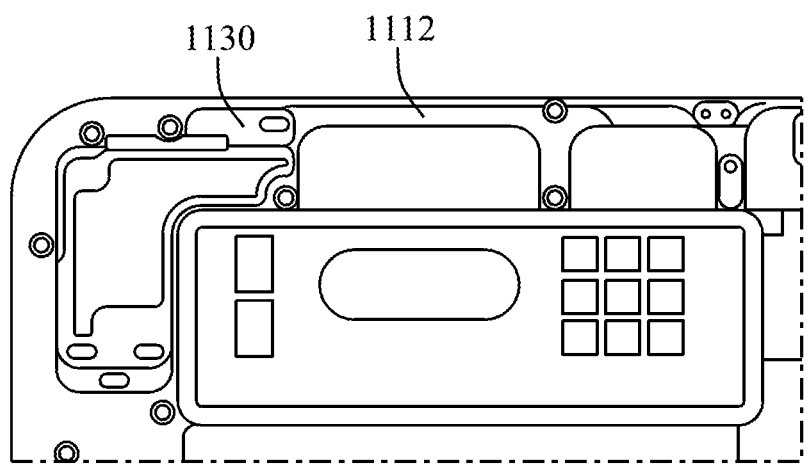
FIG. 15C shows a top view of components of the region of FIG. 15A.

FIG. 15C shows a close-up view of the housing 1112 of the region of the device shown in FIG. 15A. In some examples, and as shown in FIG. 3B, the housing 1112 can define an indentation or recessed region, and a dielectric component 1132 can be disposed in the recess to assist in coupling multiple portions of the housing 1112 to one another. In some examples, however, the dielectric component may not provide any mechanical coupling or support. In some examples, the dielectric component 1132 can include one or more dielectric materials, such as one or more polymers, ceramics, or combinations thereof. In some examples, the dielectric component 1132 can include a polymer-ceramic composite material. In some examples, the dielectric component 1132 can include a glass-filled laminated polymer material. In some examples, the dielectric component 1132 can include a ceramic and Polytetrafluoroethylene (PTFE) composite material. In some examples, the dielectric component 1132 can have a dielectric constant of from about 1 to about 10, or from about 2 to about 5, such as about 3.

Figure 15D:
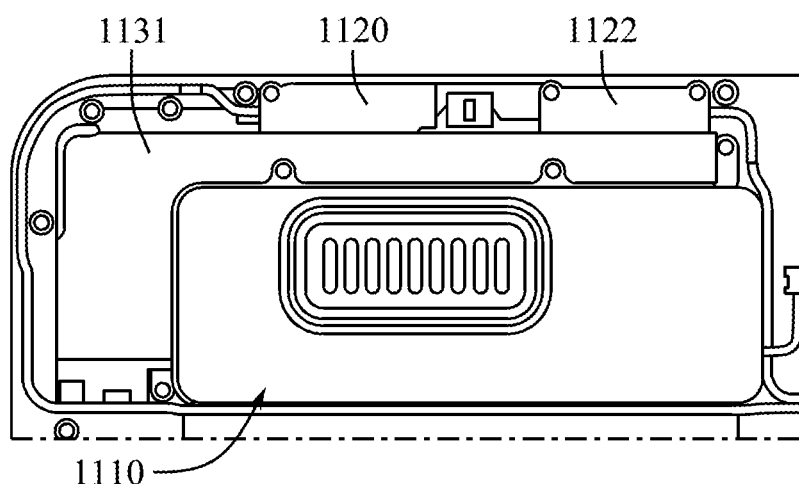
FIG. 15D shows a top view of components of the region of FIG. 15A.

As shown in FIG. 15D, the dielectric component 1132 can be disposed under an antenna resonant structure 1130 that can be coupled to one or more antenna modules 1120, 1122, for example as described with respect to FIGS. 15A and 15B. The resonant structure 1130 functions as one plate of a parallel plate antenna structure, as described herein. Therefore, the performance of any antenna circuits including the resonant structure 1130 can be tuned by controlling the dielectric constant of any materials present between the parallel plates of the parallel plate antenna. Accordingly, the material, size, geometry, and location of the dielectric component 1132 can be selected to improve performance of the antennas, as desired. In some examples, the presence of the dielectric component 1132 described herein can improve the efficiency of an antenna including the resonant structure 1130 for frequencies between about 5500 MHz and about 5900 MHz, as compared with an identical parallel plate antenna that does not include the dielectric component 1132. Additionally, the antenna resonant structure 1130 can be positioned adjacent to, and at least partially surrounding, a periphery of a speaker assembly 1110, as described herein.

Figure 15E:
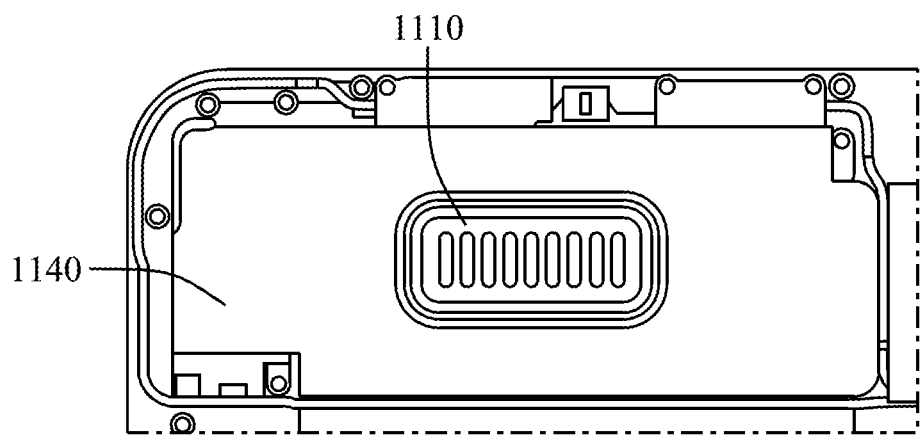
FIG. 15E shows a top view of components of the region of FIG. 15A.

FIG. 15E shows a top view of the region of FIGS. 15B and 15C, including an enclosure disposed over the antenna resonant structure 1130 and at least some of the speaker assembly 1110. In some examples, the enclosure 1140 can serve to electrically isolate the antenna resonant structure 1130 and the speaker assembly 1110 from other components of the device, such as a display module that can be disposed over the components, as described herein.

Figure 16:
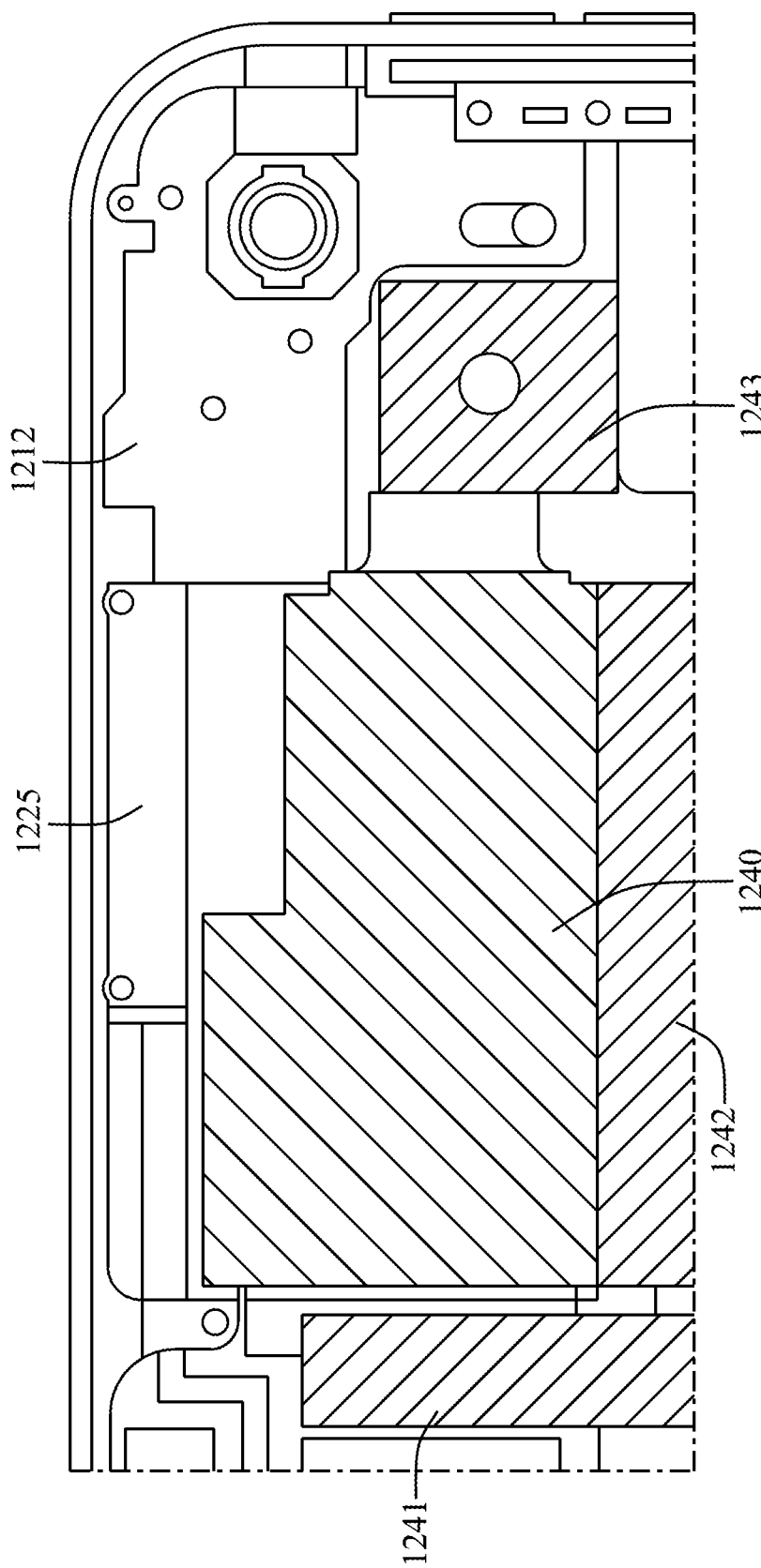
FIG. 16 shows a close-up view of a component of a region of an electronic device.

FIG. 16 illustrates a top view of the region of the forehead adjacent to the region shown in FIGS. 15A-15E. The region of the device shown in FIG. 16 can include an antenna module 1225, a housing 1212 that can at least partially define the internal volume of the device, and an electronic component 1240. In some examples, the electronic component 1240 can be electrically coupled to the antenna module 1225 and can be part of an antenna circuit. In order to provide electric grounding for the component 1240 and/or antenna circuit, portions of conductive material 1241, 1242, 1243 can be electrically coupled to the component 1240 and to other portions of the device, such as the housing 1212. In some examples, the portions of conductive material 1241, 1242, 1243 can include conductive tapes. In some examples, the portions of conductive material 1241, 1242, 1243 can provide electrical shorts between various locations of the device to provide a desired antenna path length, and to give a broad antenna frequency response, as desired.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding engagement and retention features, can apply not only to the specific examples discussed herein, but to any number of examples in any combination. Various examples of electronic devices including components, such as biometric components, having various features in various arrangements are described below, with reference to FIGS. 17-19C.

Figure 17:
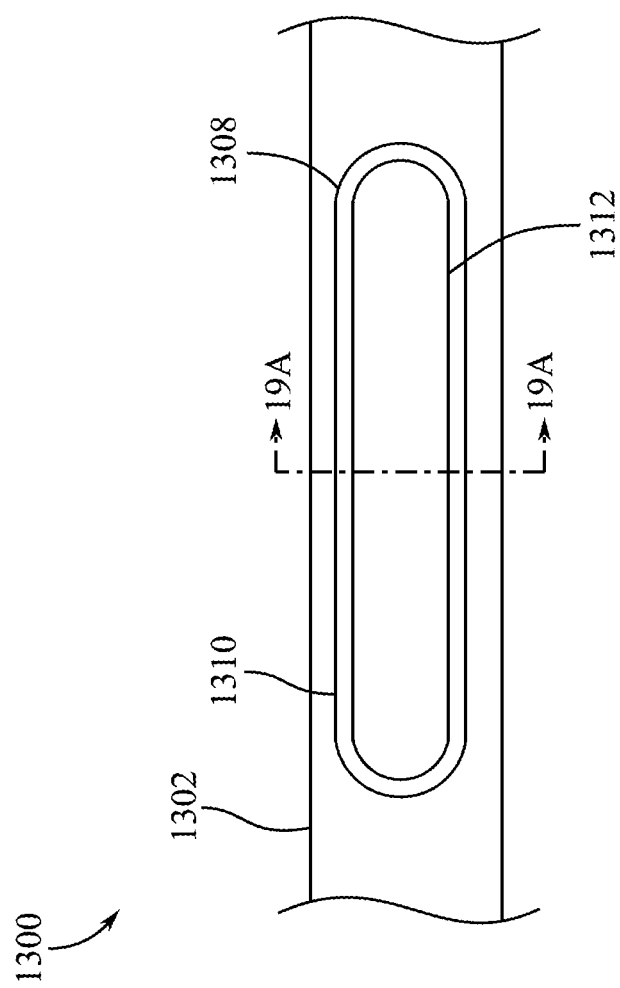
FIG. 17 shows a close-up view of a portion of an electronic device.

FIG. 17 illustrates a close-up view of the region of an electronic device, such as electronic device 100 as shown in FIG. 1C. In some examples, the electronic device 1300 can include some or all of the features of any of the electronic devices as described herein, such as electronic device 100. In some examples, the electronic device 1300 can include a biometric input component 1306.

The biometric input component 1306 can be disposed in an opening or aperture formed in the housing 1302. In some examples, the aperture extends through the housing 1302 and one or more components of the biometric input component 1306 are positioned in the housing. In some examples, the housing 1302 defines a recess to retain the biometric input device 1306, and can additionally include one or more apertures through which a portion of the biometric input component 1306 extends through the housing 1302.

The biometric input component 1306 can include a sensor cover 1312, which can be a dielectric cover that is surrounded by a conductive frame 1310. The conductive frame 1310 can be a ring of conductive material. The sensor cover 1312 (e.g., dielectric cover) can define an external surface of the electronic device 1300, which can come in contact with an object, such as a user's finger. When a finger or other body part contacts the external surface of the sensor cover 1312, the skin of the finger can become at least partially flattened over the external surface, though this is not required. With the skin of the finger in contact with the external surface of the sensor cover 1312, sensors below the sensor cover 1312 can capture biometric information, such as a fingerprint image. The sensors can be organized into a sensor layer, as discussed in more detail below.

In an example, the biometric input component 1306 can be a capacitive fingerprint sensor; the fingerprint sensor can be a sensor layer in the stack up of the biometric input component. The capacitive fingerprint sensor can include an array of capacitive electrodes which can be driven by an electrical signal. In some examples, a user's finger can also come in contact with the conductive frame 1310, which can be held at a reference voltage level, such as a ground. Other examples can use different types of sensing technologies. For example, ultrasonic, infrared, multi-spectral, RF, thermal, optical, resistance, and piezoelectric technologies can be used instead of, or in addition to, capacitive sensing.

In some examples, a biometric input component 1306 can receive additional inputs. For example, the biometric input component 1306 can use capacitive or similar sensing to sense touch and/or gesture inputs on the sensor cover 1312. Accordingly, the biometric input device 1306 can be configured to capacitively detect a motion of a finger across the sensor cover 1312, such as a swipe along a length of the sensor cover 1312. In response to such gestures, the electronic device 1300 can perform a function, such as a change in volume, a change in brightness of the display 569, opening an application, changing another setting of the electronic device 1300, and soon.

Figure 18A:
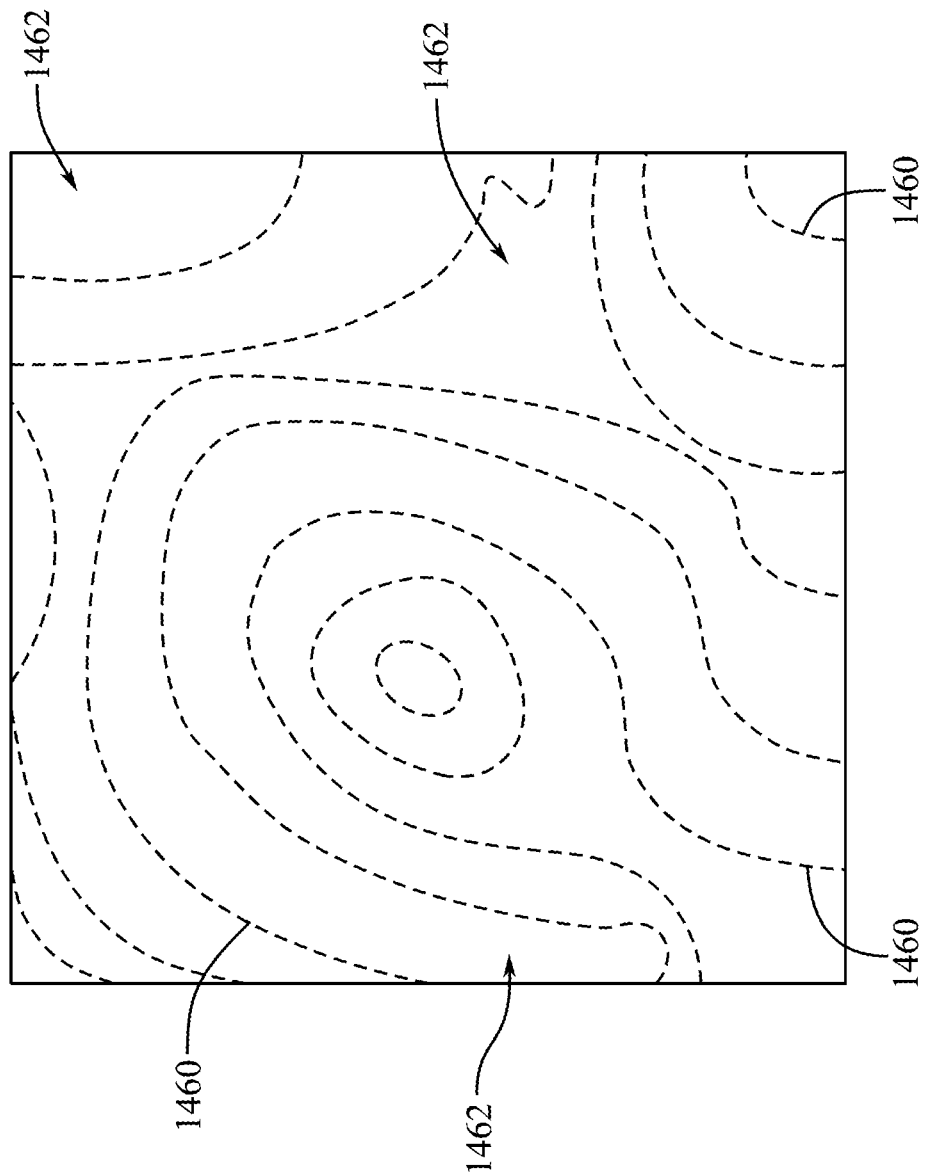
FIG. 18A shows a fingerprint image.

A fingerprint is generally formed from ridges and valleys arranged in a unique pattern. FIG. 18A depicts a graphic illustration of a portion of a fingerprint image. In FIG. 18A, the ridges 1460 are represented with dashed lines. The valleys 1462 are located in the areas between the ridges 1460. Typically, the capacitance measured between a ridge 1460 and an electrode in the fingerprint sensor varies from the capacitance measured between a valley 1462 and another electrode in the fingerprint sensor. An elongated fingerprint sensor(s) described herein can capture, at a single time, a single image that is compared against a stored image in order to authenticate a user or otherwise execute functionality of the electronic device, rather than capturing a series of images as a user moves his or her finger across the sensor.

The measured capacitance between a ridge and an electrode in the fingerprint sensor can be greater than the measured capacitance between a valley and another electrode in the fingerprint sensor because the ridge is closer to the electrodes. The differences in the measured capacitances can be used to distinguish between ridges and valleys and produce or generate a fingerprint image.

It should be appreciated that alternative fingerprint sensing technologies can measure fingerprints differently, and it should be further appreciated that these alternative fingerprint sensing technologies can be used or incorporated into examples described herein. For example, ultrasonic, optical, inductive and/or thermal fingerprint sensing technologies can be used with various examples described herein instead of capacitive sensing.

As used herein, the term "image" or "fingerprint image" includes an image and other types of data that can be captured by a fingerprint sensor (which can be a sensor layer) and/or used to represent a fingerprint. By way of example only, a fingerprint sensor can produce a data structure that defines the features in a fingerprint. In some examples, multiple images of various portions of a fingerprint can be combined to create a composite image.

For example, a fingerprint image can be considered to be made up of several nodes, with each node representing a region of the fingerprint image. Nodes can generally be overlapping, such that the nodes can be stitched together to form an entire fingerprint image. One or more electrodes in the fingerprint sensor/layer can capture a node. One or more nodes can be matched with data stored in memory, such as a fingerprint template, to authenticate a user's access to features of the electronic device. For example, nodes captured by the fingerprint sensor can be compared to stored nodes of the fingerprint template, or a captured fingerprint image can otherwise be compared to a stored fingerprint image. Such comparison can be of the overall captured image to the overall stored image, of nodes of the captured image to nodes of the storied image, of a hash or other mathematical representation or abstraction of the captured image to a hash or other mathematical representation or abstraction of the stored image, of a portion of the captured image to a portion of the stored image, and so on. All of the foregoing is embraced by the concept of comparing a captured fingerprint image (or captured fingerprint data) to a stored fingerprint image (or stored fingerprint data). While multiple nodes and/or images can be captured to create the fingerprint template, during an authentication operation a single set of nodes is typically captured by the sensor. Further, this single set of nodes is captured in one capture operation at a single instant in time, rather than across multiple capture operations.

Figure 18B:
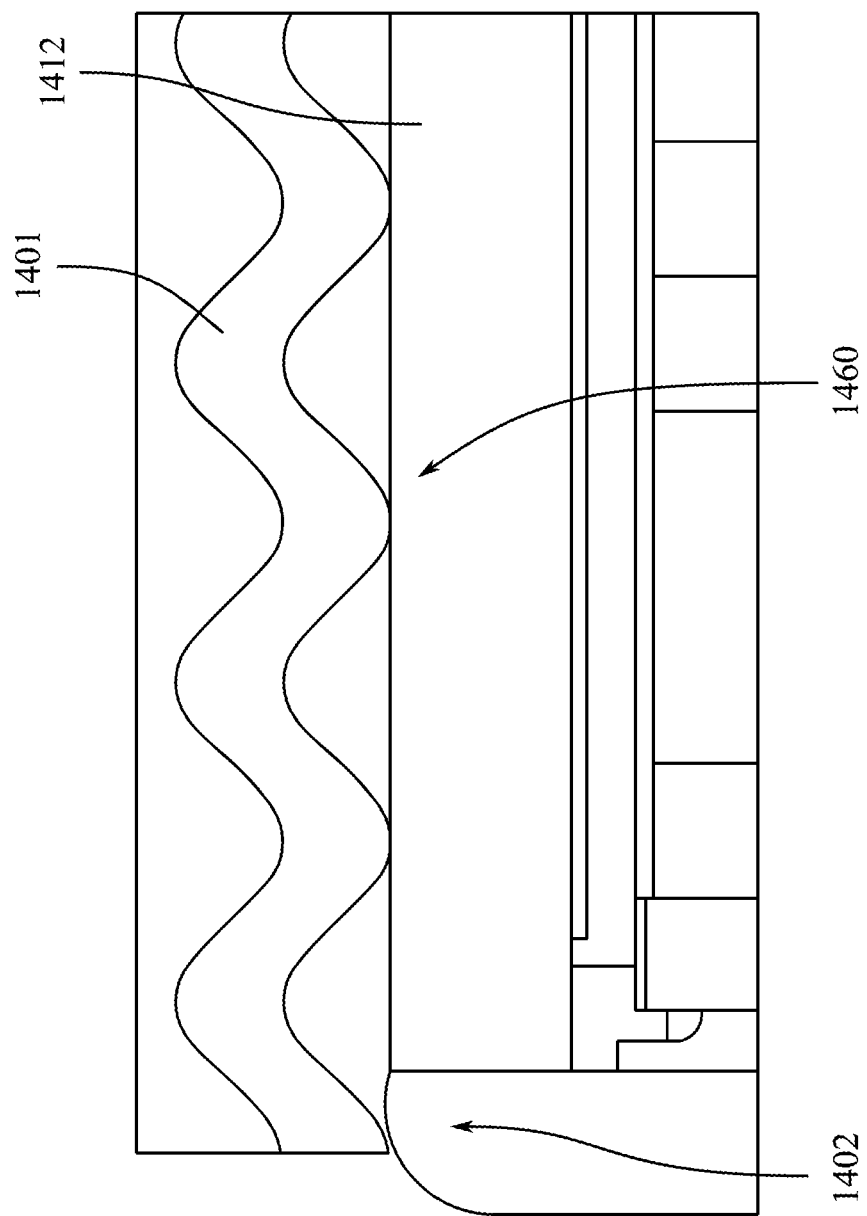
FIG. 18B shows a close-up view of a user's appendage in contact with an electronic device.

FIG. 18B shows a cross-sectional view of a user's finger 1401 contacting a biometric input component, as described herein. In the present example, the biometric input component can be substantially similar to, and can include some or all of the features of the biometric input components described herein, including a sensor cover 1412 and a conductive frame 1402. The ridges 1460 of the user's finger 1401 can contact the sensor cover 1412 during operation. However, the user's finger 1401 can also contact the frame or trim 1402. In some examples, in order to maximize the sensing area of the biometric component, the active sensing area disposed under the sensor cover 1412 can be disposed adjacent to, or very close to, the frame 1402. For example, the active sensing area can be less than about 1 mm, less than about 0.75 mm, less than about 0.5 mm, less than about 0.3 mm, or even closer to the frame 1402. In some examples, it can be desirable to seal the sensor cover 1412 to the frame 1402 in order to prevent ingress of contaminants or other materials that may affect sensing, such as sweat.

Figure 18C:
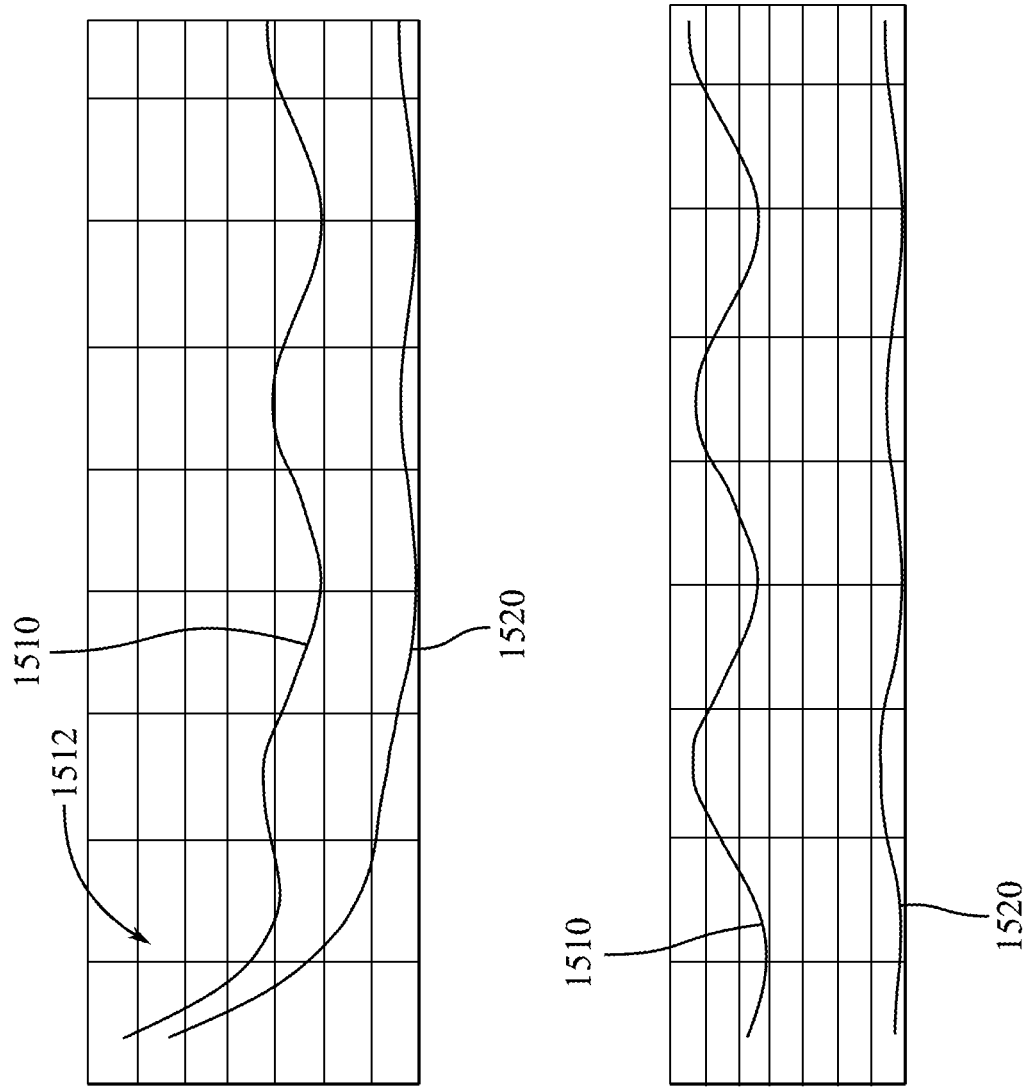
FIG. 18C shows a plot of capacitance versus distance for a sensor of an electronic device.

As shown in FIG. 18C, the small distance between the sensing area under the cover 1412 and the frame 1402 can produce noise in the biometric sensor near that location, here indicated as region 1512. Thus, signals 1510 and 1520 detected by the biometric sensor that can correspond to the ridges and valleys of a user's finger can be washed out by the noise near the sensor edge. In some examples, the biometric input component and/or other components of the electronic can apply one or more algorithms to the data or signal generated by the biometric input component to normalize the signal near the edge region, effectively flattening out the noise in that area, resulting in signals 1510 and 1520, as shown in the lower graph in FIG. 18C.

Returning to FIG. 17, the biometric input component 1306 can be formed as a compressible button. Accordingly, the conductive frame 1310, the sensor cover 1312, and other components of the biometric input component can deflect in response to force on the sensor cover 1312 and/or the conductive frame. The biometric input component 1306 can incorporate a pressure- or force-sensing component to register the application of force. For example, an electrical switch can cause an actuation signal to be produced in response to the application of sufficient force to the biometric input component 1306.

In response to the actuation signal, the electronic device 1300 can initiate a process. For example, the fingerprint sensor in the biometric input component 1306 can be activated to capture a fingerprint image in response to the actuation signal, without requiring the user to move his or her finger, for example as a single set of nodes (or other fingerprint data) captured at a single time. In other examples, the actuation signal can additionally or alternatively cause another action, such as a software action, power on or power off of the electronic device 1300, a change in volume, or another action.

In some examples, the biometric input component 1306 can incorporate a non-binary force sensor, or a force sensor which measures an amount of force with a range of values. In other words, the force sensor can exhibit a non-binary electrical response (e.g., a change in voltage, capacitance, resistance, or other electrical parameter) indicating the amount of force applied to the biometric input component 1306. This non-binary response can yield or be a non-binary signal that conveys information corresponding to an amount of force exerted on an input surface, such as one defined by the sensor cover, and is not limited to being present or absent (e.g., on/off).

For example, the biometric input component 1306 can incorporate a force sensor which can distinguish between three or more force values, and can respond differently to different threshold values of force. As one example, no action can occur below a first threshold force value. Between the first threshold force value and a second threshold force value, the biometric input component 1306 can capture one or more fingerprint images. Above the second threshold force value, the electronic device 1300 can power off. It should be understood that a variety of actions can result from the application of varying amounts of force, and that the above illustrations are exemplary in nature.

Figure 19A:
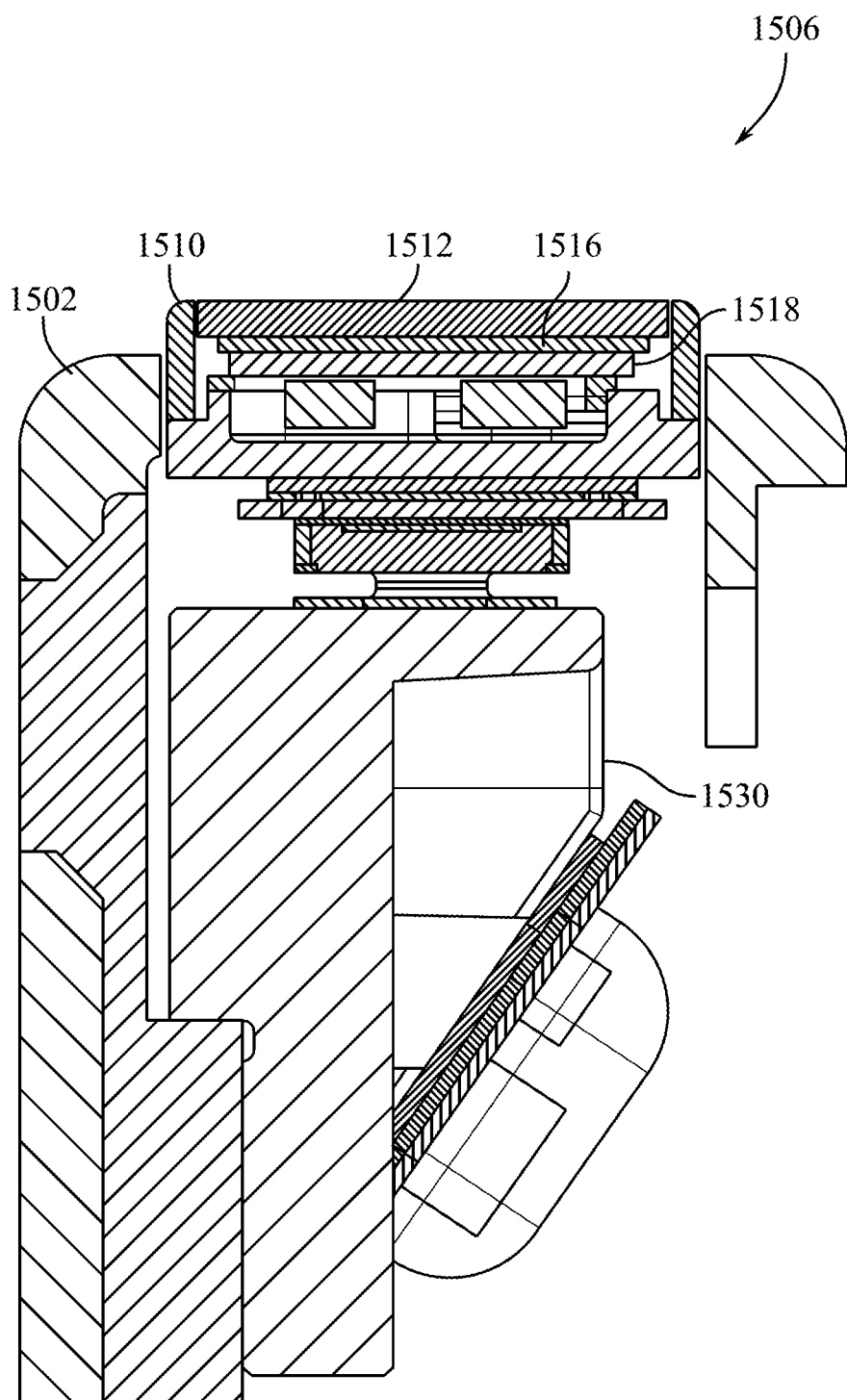
FIG. 19A shows a cross-sectional view of an electronic device.

FIG. 19A depicts a cross-sectional view of the biometric input component 1506 taken along the section shown in FIG. 17. As shown in FIG. 19A, the biometric input component 1506 can be at least partially recessed within the housing 1502 of the electronic device. The biometric input component 1506 can include a bracket 1530 or other support structure that can be attached or otherwise affixed to the housing 1502. In some examples, the housing 1502 can include a shelf or other support structure for supporting a bracket 1530.

The biometric input component 1506 can include a sensor cover 1512 and a sensor layer 1518. The sensor cover 1512 can be any appropriate dielectric or otherwise non-conductive material, such as glass, sapphire, ceramic, plastic, acrylic, or combinations of such materials. In some examples, the sensor cover 1512 can be formed from a material which is at least partially transparent, though this is not necessary and opaque materials can also be used. One or more layers can be disposed between the sensor cover 1512 and the sensor layer 1518, such as a color masking layer to reduce visibility of the biometric sensor 1518 and provide a desired visual appearance to a user.

The sensor layer 1518 can be coupled to the sensor cover 1512 by an adhesive layer 1516. The adhesive layer 1516 can include a pressure-sensitive adhesive, or another adhesive which adheres the sensor cover 1512 to the sensor layer 1518. The sensor layer 1518 can include an array of capacitive electrodes disposed over a substrate (e.g., silicon or another appropriate material). Analog and/or digital circuitry can be electrically coupled to the array of capacitive electrodes to control the operation of the electrodes and receive biometric data. In some examples, the sensor layer 1518 can include the analog and/or digital circuitry, and in other examples the analog and/or digital circuitry can be provided on another layer or separate from the biometric input component 1506. The sensor layer 1518 can be disposed within the conductive frame 1510, and may not come into contact with the conductive frame 1510.

A circuit layer 1520, such as a flexible circuit, connects the sensor layer 1518 to additional processing circuitry. As an example, the circuit layer 1520 can connect the sensor layer 1518 to additional processing circuitry to transmit signals to or from the fingerprint sensor. In some examples, some of the additional processing circuitry can be disposed in the circuit layer 1520.

The conductive frame 1510 can surround and support the components of the biometric input component 1506. When a force is applied to the sensor cover 1512 and/or the conductive frame 1510, the conductive frame 1510 can deflect, moving the sensor cover 1512 and other components into a cavity of the housing 1502. In some examples, the conductive frame 1510 can be formed from a material sufficiently rigid to provide structural support to the sensor cover 1512. The conductive frame 1510 can therefore be formed from an appropriate material, such as steel, aluminum, brass, nickel, and other conductive materials or combinations of materials.

The conductive frame 1510 can also be coupled to a reference voltage, such as system ground. When a user contacts the conductive frame 1510, the coupling to ground can reduce signal attenuation due to variable capacitive coupling between the user and the system ground as a result of other fingers, hands, or body parts coming in contact with other parts of the electronic device 1500.

In some examples, the sensor cover 1512 can be sealed to the frame 1510 around some or all of a periphery of the sensor cover 1512. In some examples, the sensor cover 1512 can be sealed to the frame 1510 with an adhesive to prevent ingress of material or contaminants that might undesirably affect the performance of the sensor layer 1518. In some examples, the adhesive can have a viscosity such that the adhesive can wick into a gap between the sensor cover 1512 and the frame 1510 to fill substantially the entire volume of the gap. In some examples, the frame 1510 can at least partially surround a periphery of the sensor layer 1518. In some examples, the conductive frame 1510 can entirely surround a periphery of the sensor layer 1518. In some examples, the sensor layer 1518 can include sensing pixels, with each pixel providing a corresponding signal. In some examples, a distance between a sidewall of the conductive frame 1510 and a pixel of the sensor layer 1518 can be less than 1 mm, less than 0.9 mm, less than 0.75 mm, less than 0.5 mm, or less than 0.3 mm, or less than 0.25 mm, or even less.

Figure 19B:
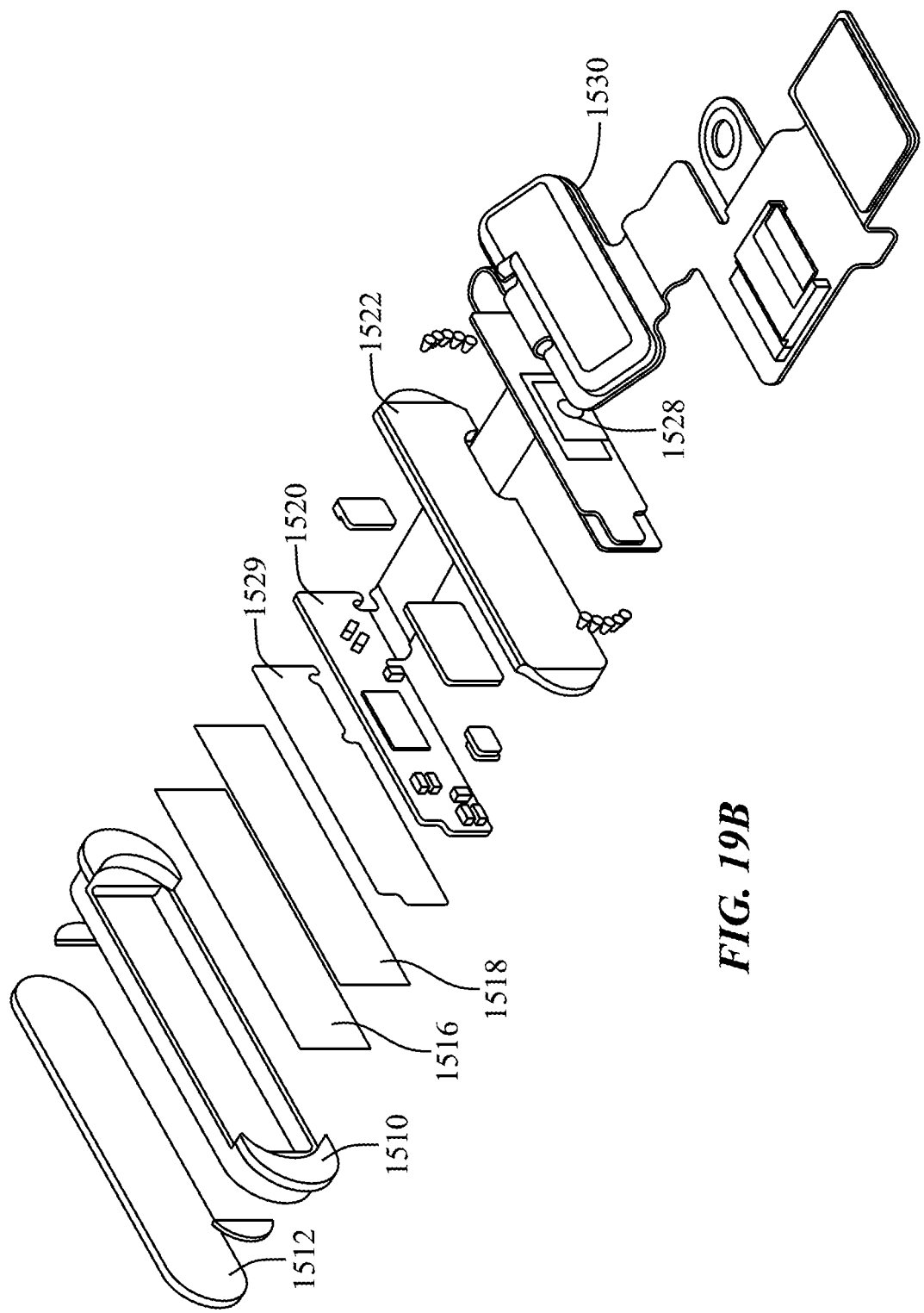
FIG. 19B shows an exploded view of a component of an electronic device.

Referring now to FIG. 19B, which illustrates an exploded view of the biometric input component 1506, an isolation member or layer can be positioned between the housing sensor layer 1518 and the sensor cover 1512 in order to electrically isolate the components of the biometric input component 1506 from the housing 1502. For example, the housing 1502 can be formed from a conductive material, such as aluminum, steel, or other metals. In such cases, the isolation member can further reduce signal attenuation in biometric data captured by the biometric input component 1506 by electrically isolating the sensor layer 1518 from the housing 1502. In some examples, the isolation layer can include an insulating or relatively non-conductive material, such as a polymeric material.

In some examples, isolating the conductive frame 1510 from the housing 1502 can be achieved by any technique as desired, such as a film or surface treatment of the housing 1502 and/or the conductive frame 1510. For example, an anodization layer can be formed in the portion of the housing 1502 around the biometric input component 1506. The anodization layer can be formed at a sufficient thickness to electrically isolate the conductive frame 1510 from the housing 1502.

As depicted in FIG. 19B, the conductive frame 1510 can be coupled to a stiffener layer 1522. The sensor cover 1512, sensor layer 1518, and circuit layer 1520 can coupled to the stiffener layer 1522 to transfer force applied to the sensor cover 1512 to a force sensor 1528. In some examples, the force sensor 1528 is disposed within the housing 1502 of the electronic device. Accordingly, a bracket 1530 or other support component can be joined or fixed to the housing 1502, thereby coupling the biometric input component 1506 to the housing 1502.

The conductive frame 1510, bracket 1530, and stiffener layer 1522 can be formed of the same or different materials, and can be coupled together by an appropriate technique, such as welding, soldering, brazing, one or more adhesive layers, a mechanical coupling (e.g., screws or studs which pass through the stiffener layer 1522 and into the conductive frame 1510), and so on. The stiffener layer 1522 generally provides a rigid structure through which force can be transferred to the force sensor 1528. In some examples, the stiffener layer 1522 can include a metal which can be the same or a different metal from the conductive frame 1510, and in other examples the stiffener layer 1522 can be formed from glass, plastic, sapphire, or another material. In some examples, the conductive frame 1510 can be electrically grounded to one or more components of the device, including the device housing, for example through the bracket 1530. In some examples, the stiffener layer 1522 can include a conductive material and can be in electrical communication with the frame 1510 and one or more other components of the device to ground the frame 1510 or other portions of the component 1506. In some examples, the stiffener layer can include a bracket or a bent portion of material.

The stiffener layer 1522 can be coupled to a force sensor 1528 by an adhesive layer (which can be the same or a different adhesive as the adhesive layer 1516). In some examples, a flexible circuit can be coupled to the force sensor 1528, and can provide signals to and from the force sensor 1528. The force sensor 1528 can further be coupled to the circuit layer 1520 (for example, connected to one another by vias or flex circuits, or otherwise electrically and/or physically coupled together) and/or processing circuitry. Accordingly, the operation of the fingerprint sensor can be controlled or affected by actuation of the force sensor 1528.

The force sensor 1528 can be positioned near a structural component, such as bracket 1530 of the electronic device. In some examples, the force sensor 1528 can be an electrical switch, such as a compressible dome switch. As force is applied to the sensor cover 1512, the force can be transferred from the conductive frame 1510, to the stiffener layer 1522, and from the stiffener layer 1522 through an adhesive layer 1527 to the force sensor 1528.

The force sensor 1528 can include a compliant and/or biasing component, such as a compressible dome, spring, beam, or other structure. When force is transferred from the stiffener layer 1522 to the force sensor 1528, the biasing component can come in contact with the structural component 1530 and compress. In some examples, as the biasing component collapses it completes an electrical circuit, thereby causing an actuation signal to be generated or otherwise sent to processing circuitry and/or the sensor layer 1518. When an input on the sensor cover 1512 is released, the compressible dome can provide a restoring force, returning at least the sensor cover and conductive frame of the biometric input device 1506 to their original positions.

In other examples, the force sensor 1528 can be implemented as another type of switch or force sensing device. For example, the force sensor 1528 can detect a non-binary amount of force through capacitive force sensing, ultrasonic force sensing, strain gauge, optical, resistance, and piezoelectric technologies. The force sensor 1528 can in some examples output a range of signal voltages to processing circuitry, and in other examples can additionally or alternatively provide actuation signals at given force thresholds.

In some examples, the bracket 1530 can include one or more attachment features, such as an aperture or orifice through which a fastener can pass to join the bracket 15150 to the housing 1502 and fix the biometric input component 1506. In some examples, the bracket 1530 can maintain a position of the biometric input component 1506 so that the force sensor 1528 can be actuated in a direction perpendicular to the direction of attachment between the housing 1502 and the bracket 1530. In some examples, the bracket 1530 can include a relatively stiff and rigid material, such as a metallic material, for example aluminum or steel. Further details regarding the bracket 1530 are described with respect to FIG. 19C.

Figure 19C:
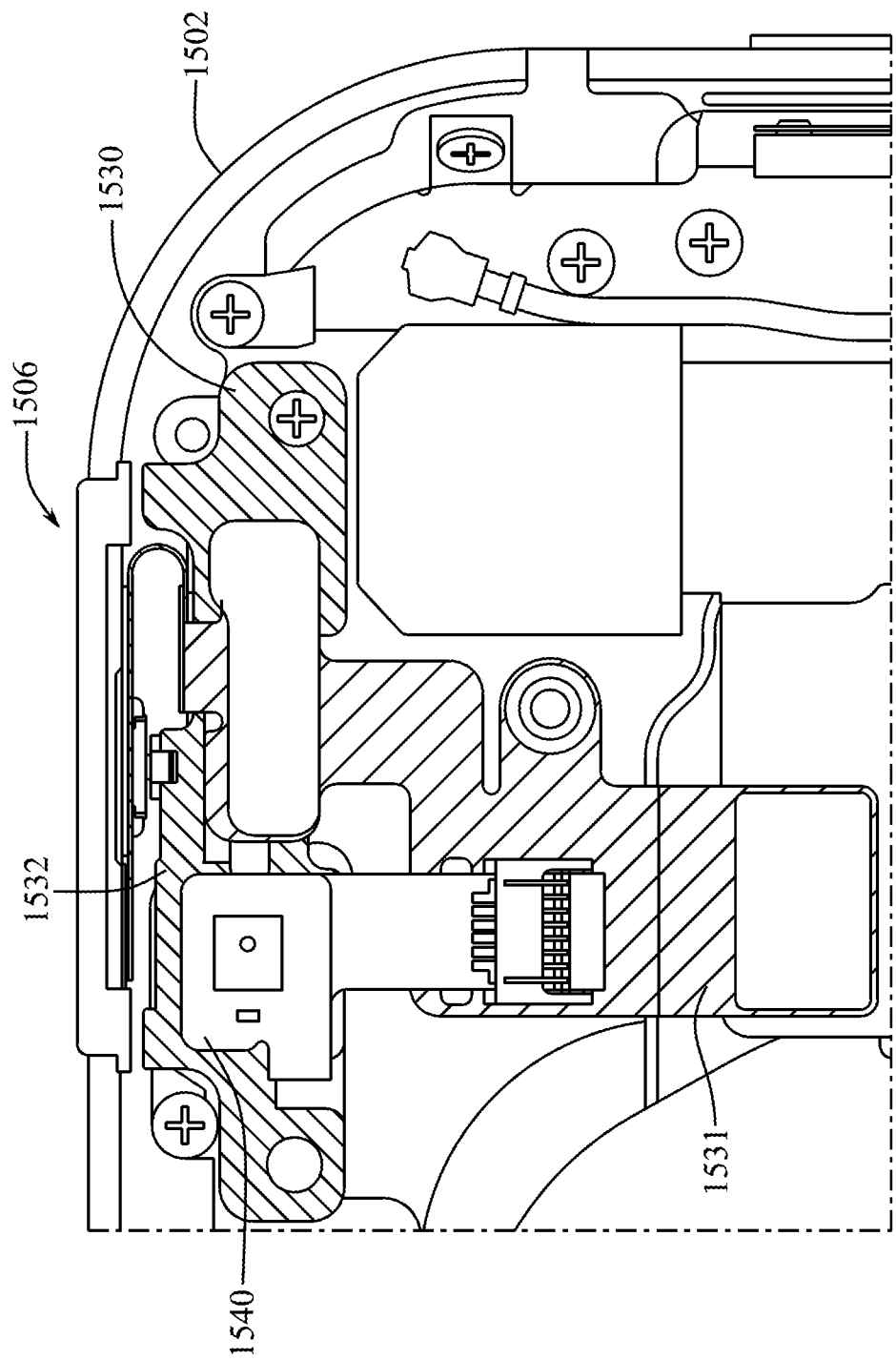
FIG. 19C shows a close-up view of a region of an electronic device.

FIG. 19C shows a front view of the biometric input component 1506, including the bracket 1530 affixed to the housing 1502 of the electronic device 1500. In some examples, the bracket 1530 can include multiple components, such as a first bracket component 1531 and a second bracket component 1532, which can be joined or fixed together in any manner. In some examples, one or more other components of the electronic device can also be supported by the bracket 1530, so that this single support component 1530 can provide mechanical support and fix the position of multiple components and/or circuits of the device, thereby reducing the amount of internal volume required for support components. This configuration can allow for a reduction in the size of the internal volume and/or for additional room for other functional components in the internal volume.

For example, one or more sensors, such as an ambient light sensor 1540 can be affixed to the bracket 1530 at a desired location. In some examples, the position of the bracket 1530 adjacent to the edge or exterior surface of the housing 1502 can allow for the support of other components that can also be positioned near the edge or exterior of the housing 1502. For example, the ambient light sensor (ALS) 1540 can be positioned adjacent or near to an edge of the display (not shown) and beneath the cover (not shown) of the device so that the ALS 1540 can receive light that passes from the ambient environment through the cover. In some examples, any other components or circuitry, such as one or more controllers or processors can also be carried or supported by the bracket 1530, and thus fixed in place relative to the housing 1502. In some examples, one or more printed circuit boards can be supported by the bracket 1530. Further, in some examples, at least a portion of the component 1506 can be disposed in an antenna volume of the device, as described herein. In those examples, a printed circuit board supported by the bracket 1530 can include one or more chokes to electrically and/or capacitively decouple the bracket 1530 and or component 1506 from the antenna.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding engagement and retention features, can apply not only to the specific examples discussed herein, but to any number of examples in any combination. Various examples of electronic devices including components, such as charging components, having various features in various arrangements are described below, with reference to FIG. 20.

Figure 20:
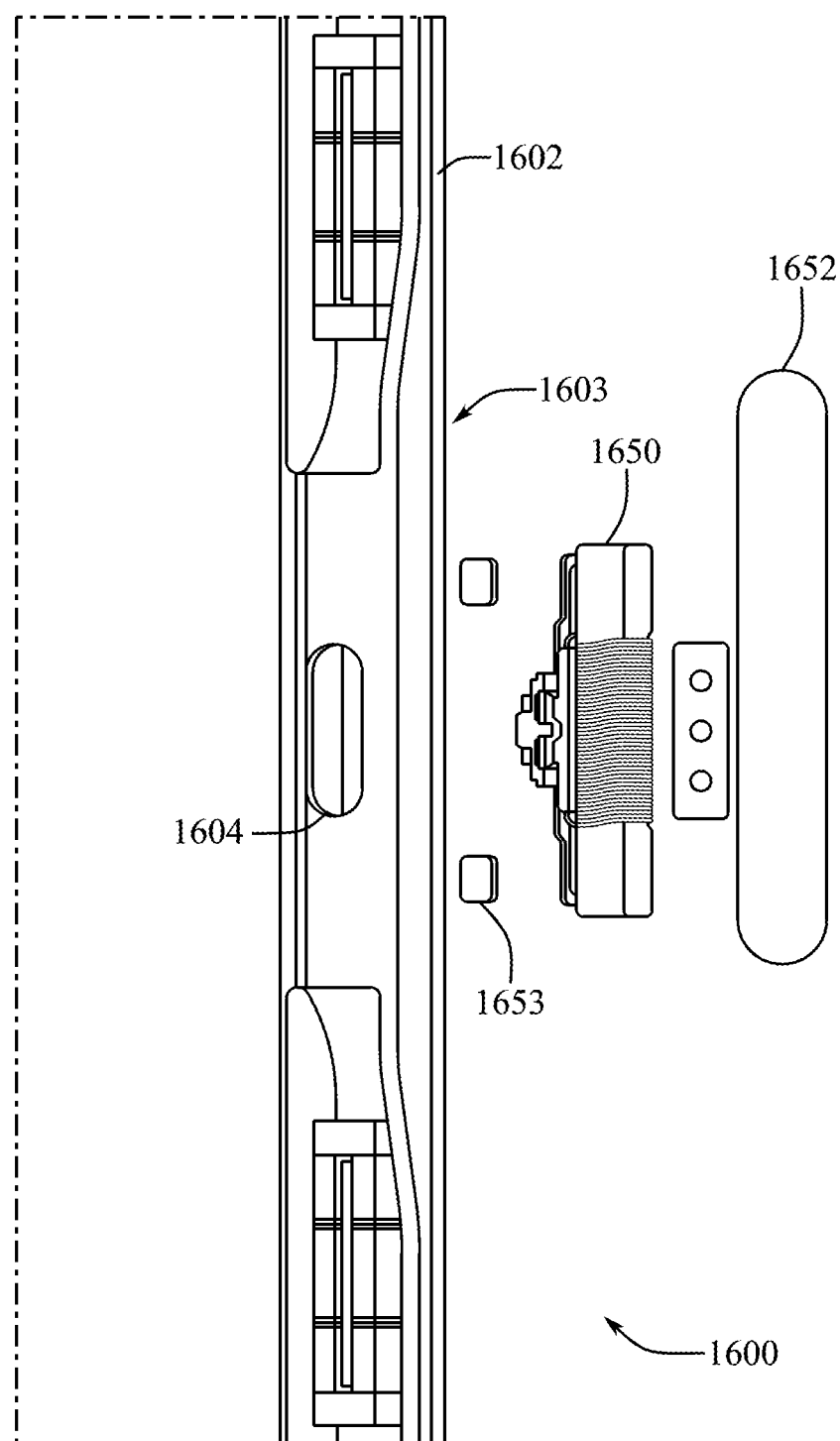
FIG. 20 shows a close-up view of a region of an electronic device.

FIG. 20 illustrates a close-up view of the region of an electronic device, such as electronic device 100 as shown in FIG. 1C. In some examples, the electronic device 1600 can include some or all of the features of any of the electronic devices as described herein, such as electronic device 100. As can be seen, in some examples, the housing 1602 can define one or more features that can allow for the positioning and retention of desired components. In some examples, the device 1600 can include an inductive charging component 1650. This inductive charging component 1650 can be any form of wireless charging component as desired, such as an inductive charging coil. In use, the inductive charging component 1650 can serve to wireless charge one or more peripheral or external components that are positioned substantially near or adjacent to the inductive charging component 1650 at the housing 1602. For example, a secondary input component, such as a stylus or digital pen or pencil, can be positioned adjacent to the inductive charging component 1650 to receive wireless power therefrom.

In some examples, the housing 1602 can define a recess or cavity 1603 in which the inductive charging component 1650 can be positioned and fixed. In some examples the recess 1603 can be machined into the material of the housing 1602. In some other examples, the recess 1603 can be molded or cast when then housing 1602 is formed. The efficiency of an inductive charging component can depend on the position of the component relative to the component to be charged, thus it can be desirable to precisely fix the position of the inductive charging component relative to the other components of the device 1600, for example the housing 1602. Further, by affixing the inductive charging component 1650 directly to the housing, for example at the recess 1603, the need for separate bracket components can be eliminated or reduced, thereby saving space and/or costs. The housing can also define an orifice or aperture 1604 that can allow for communication between the recess 1603 and the internal volume of the housing 1602. One or more electrical connectors can pass through the aperture 1604 and allow for power and/or data to be transmitted between components of the electronic device 1600 and the inductive charging component 1650.

In some examples, one or more magnets 1653 can also be positioned in or near the recess 1603, for example between the housing 1602 and the inductive charging component 1650. In use, these magnets 1653 can assist in retaining and/or positioning the peripheral component to be charged relative to the inductive charging component 1650. In some cases, a charging cover 1652 can be provided over the inductive charging component 1650 at the recess 1603 to protect the inductive charging component 1650 and provide a desired visual appearance to the housing 1602. In some examples, this window or cover 1652 can include any substantially non-conductive material or materials, such as polymers, ceramics, and/or glasses.

While the present disclosure generally describes components and features of an electronic device, the components and features described herein can be used in any combination or order and with any component or electronic device as desired. Further, the components and features can assume any geometric shape, pattern, size, or combination of shapes, patterns, and sizes. Additionally, the features described herein can be positioned on or extend from any surface or surfaces of any desired housing and/or components.

To the extent applicable to the present technology, gathering and use of data available from various sources can be used to improve the delivery to users of invitational content or any other content that can be of interest to them. The present disclosure contemplates that in some instances, this gathered data can include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data can be used to provide insights into a user's general wellness, or can be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data can be governed by federal and/or state laws, such as the Health Insurance Portability and Accountability Act (HIPAA); whereas health data in other countries can be subject to other regulations and policies and should be handled accordingly. Hence different privacy practices should be maintained for different personal data types in each country.

Despite the foregoing, the present disclosure also contemplates examples in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed examples, the present disclosure also contemplates that the various examples can also be implemented without the need for accessing such personal information data. That is, the various examples of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described examples. However, it will be apparent to one skilled in the art that the specific details are not required in order to practice the described examples. Thus, the foregoing descriptions of the specific examples described herein are presented for purposes of illustration and description. They are not target to be exhaustive or to limit the examples to the precise forms disclosed. It will be apparent to one of ordinary skill in the art that many modifications and variations are possible in view of the above teachings.

What is claimed is:

1. An electronic device, comprising:
    a housing;
    a processor positioned within the housing;
    a display positioned at least partially within the housing;
    a fingerprint sensor, comprising:
        a sensor cover defining an input surface;
        a conductive frame surrounding the sensor cover;
        a force sensor configured to output a signal in response to a detection of an amount of a force exerted on the input surface, the conductive frame configured to translate with the sensor cover in response to the force; and
        a capacitive sensor positioned below the sensor cover and configured to capture a fingerprint image in response to the force sensor outputting the signal;
    a bracket affixed to the housing and supporting the fingerprint sensor in a position relative to the housing; and
    an operational component comprising an electrical choke disposed on the bracket, the operational component in communication with the processor.

2. The electronic device of claim 1, wherein the operational component comprises an environmental sensor.

3. The electronic device of claim 2, further comprising a transparent cover overlying the display and secured to the housing.

4. The electronic device of claim 3, wherein the transparent cover overlies the environmental sensor.

5. The electronic device of claim 4, wherein the environmental sensor comprises an ambient light sensor.

6. The electronic device of claim 5, wherein a brightness of the display is at least partially determined by an amount of ambient light detected by the ambient light sensor.

7. The electronic device of claim 1, wherein the sensor cover has a length that exceeds a width of the sensor cover.

8. The electronic device of claim 1, wherein the sensor cover is substantially flush with an exterior surface defined by the housing.

9. The electronic device of claim 1, wherein the fingerprint sensor is at least partially recessed within the housing and positioned at a sidewall of the housing.

10. The electronic device of claim 1, wherein:
at least a portion of the fingerprint sensor is disposed in a resonating volume of an antenna.

11. An electronic device, comprising:
a housing comprising a sidewall, the sidewall defining an aperture;
a biometric input component aligned with the aperture, the biometric input component comprising:
a sensor cover defining an input surface, the sensor cover having a length that exceeds a width of the sensor cover;
a conductive frame surrounding the sensor cover;
a capacitive sensor positioned below the sensor cover and configured to capture a fingerprint image; and
a stiffener comprising a conductive material, the stiffener electrically coupled to the conductive frame to electrically ground the conductive frame to the housing; and
a bracket affixed to the housing to support the biometric input component,
wherein the stiffener electrically grounds the conductive frame to the housing through the bracket.

12. The electronic device of claim 11, wherein the sensor cover is sealed to the conductive frame along a periphery of the sensor cover.

13. The electronic device of claim 11, wherein the conductive frame at least partially surrounds and supports the capacitive sensor.

14. The electronic device of claim 13, wherein:
the capacitive sensor comprises a sensing pixel; and
the conductive frame comprises a sidewall positioned adjacent to the sensing pixel.

15. The electronic device of claim 14, wherein a distance between the sidewall and the sensing pixel is less than about 0.5 mm.

16. The electronic device of claim 13, further comprising a processor in communication with the capacitive sensor;
the processor configured to adjust a value of a signal transmitted from the capacitive sensor to compensate for noise in the signal caused by the conductive frame.

17. A biometric sensing component for an electronic device, comprising:
a sensor cover defining an input surface;
a force sensor configured to output a signal in response to a detection of an amount of a force exerted on the input surface;
a capacitive sensor positioned below the sensor cover and configured to capture a fingerprint image, the capacitive sensor having a length that exceeds a width of the capacitive sensor;
a conductive frame at least partially surrounding a periphery of the capacitive sensor, the conductive frame configured to translate with the sensor cover in response to the force; and
a bracket supporting the force sensor and the capacitive sensor,
wherein the conductive frame is electrically grounded to a housing of the electronic device through the bracket.

18. The biometric sensing component of claim 17, further comprising a flexible electrical connector electrically coupled to the force sensor and the capacitive sensor.

19. The biometric sensing component of claim 18, wherein:
the bracket defines a retention feature; and
the flexible electrical connector is electrically coupled to a portion of the bracket defining the retention feature.

* * * * *